(12) United States Patent
Sayama et al.

(10) Patent No.: US 6,740,939 B2
(45) Date of Patent: May 25, 2004

(54) SEMICONDUCTOR DEVICE AND MANUFACTURING METHOD THEREOF

(75) Inventors: Hirokazu Sayama, Tokyo (JP); Yukio Nishida, Tokyo (JP); Kazunobu Ohta, Tokyo (JP); Hidekazu Oda, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/100,090

(22) Filed: Mar. 19, 2002

(65) Prior Publication Data

US 2002/0164858 A1 Nov. 7, 2002

(30) Foreign Application Priority Data

May 2, 2001 (JP) .......................... 2001-135356

(51) Int. Cl.[7] .............................................. H01L 29/76
(52) U.S. Cl. ........................................ 257/371; 438/197
(58) Field of Search ................................. 257/371–372, 257/375–376, 396, 500, 550, 553; 438/199–200, 282; 326/45, 50; 327/542–543, 546, 566

(56) References Cited

U.S. PATENT DOCUMENTS

| | | | | |
|---|---|---|---|---|
| 4,628,341 A | * | 12/1986 | Thomas | 257/338 |
| 5,047,358 A | * | 9/1991 | Kosiak et al. | 438/200 |
| 5,468,666 A | * | 11/1995 | Chapman | 438/226 |
| 5,472,887 A | * | 12/1995 | Hutter et al. | 438/231 |
| 5,880,502 A | * | 3/1999 | Lee et al. | 257/372 |
| 5,953,599 A | * | 9/1999 | El-Diwany | 438/199 |
| 6,043,128 A | | 3/2000 | Kamiya | |
| 6,337,248 B1 | * | 1/2002 | Imai | 438/279 |
| 6,348,719 B1 | * | 2/2002 | Chapman | 257/412 |
| 6,448,121 B1 | * | 9/2002 | Brighton | 438/197 |

OTHER PUBLICATIONS

Y. Nishida, et al., "Highly Reliable 100nm Buried–Channel–pMOSFET for Embedded–LSIs", Proceedings of the 59th Symposium on Semiconductors and Integrated Circuits Technology, pp. 18–23, (no date).

* cited by examiner

*Primary Examiner*—David Nelms
*Assistant Examiner*—David Vu
(74) *Attorney, Agent, or Firm*—Oblon, Spivak, McClelland, Maier & Neustadt, P.C.

(57) ABSTRACT

CMOS transistors which can satisfy demand for size reduction and demand for reliability and a manufacturing method thereof are provided. A buried-channel type PMOS transistor is provided only in a CMOS transistor (100B) designed for high voltage; surface-channel type NMOS transistors are formed in a low-voltage NMOS region (LNR) and a high-voltage NMOS region (HNR), and a surface-channel type PMOS transistor is formed in a low-voltage PMOS region (LPR).

4 Claims, 51 Drawing Sheets

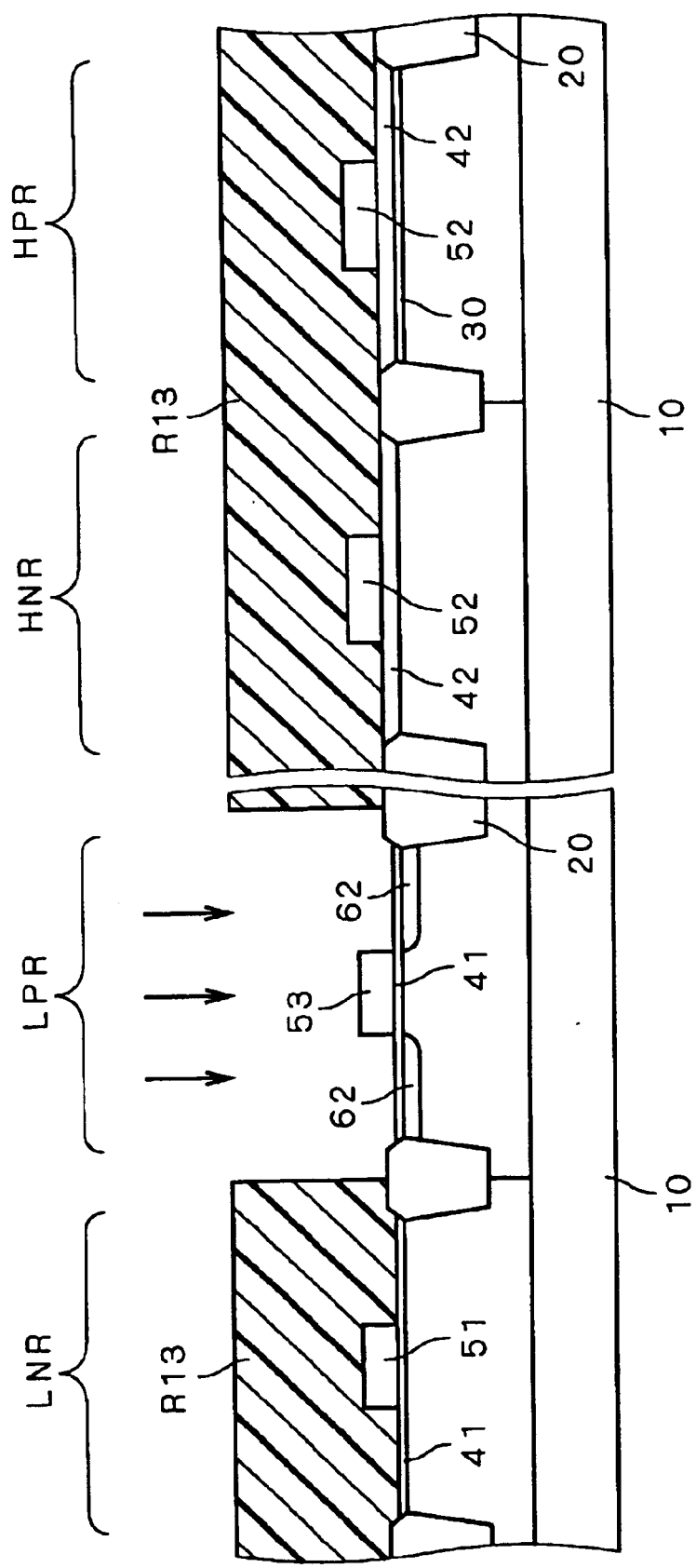
F I G. 4

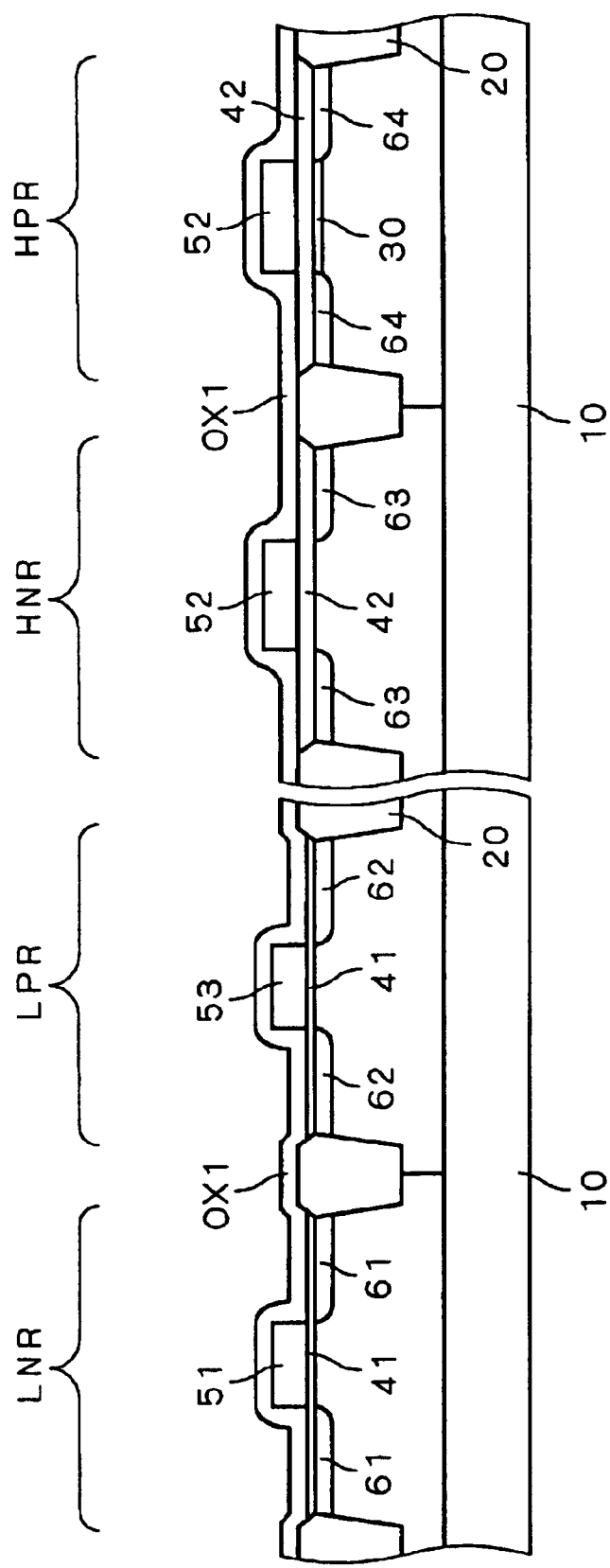
F I G. 5

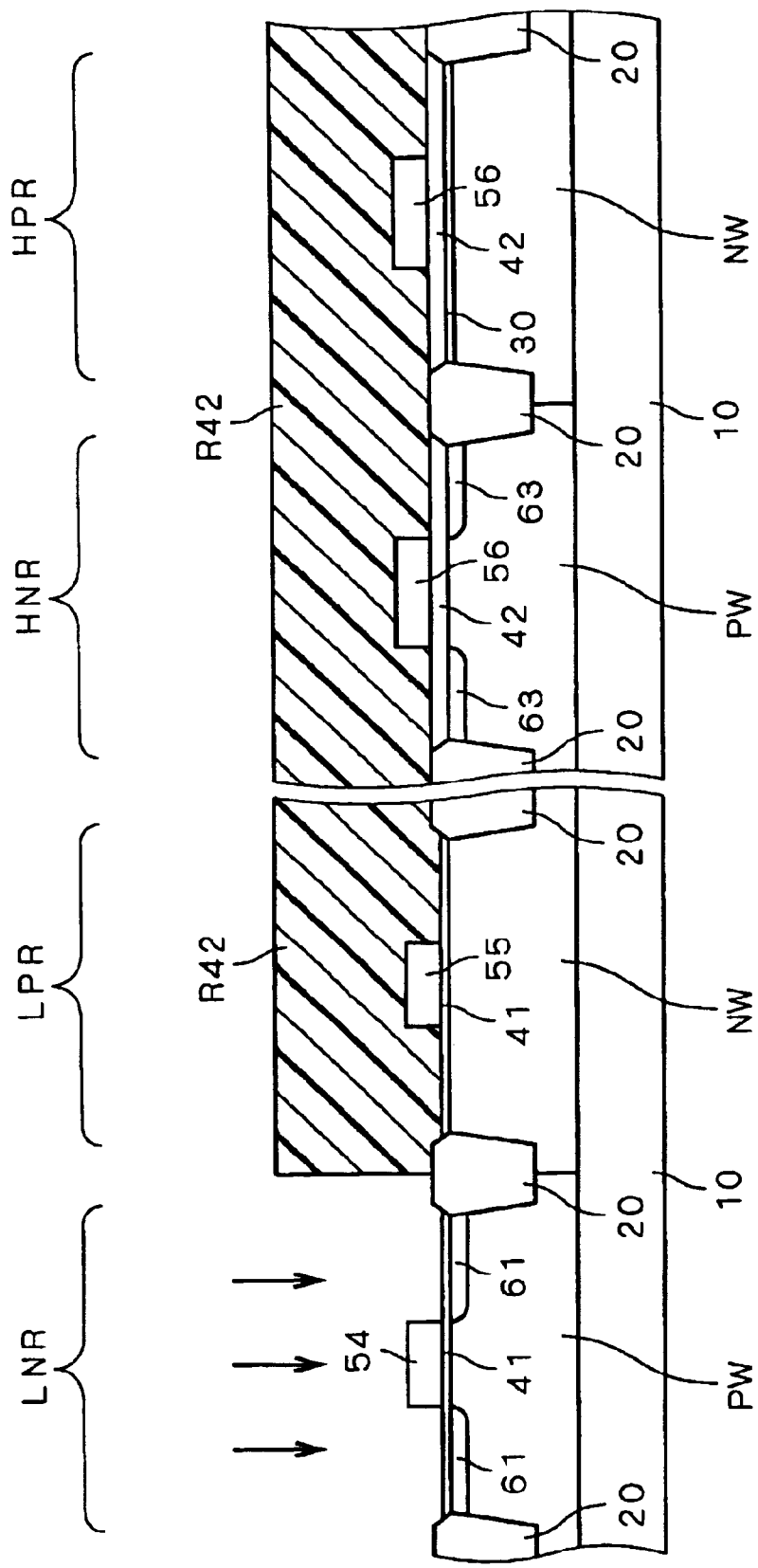
F I G . 2 5

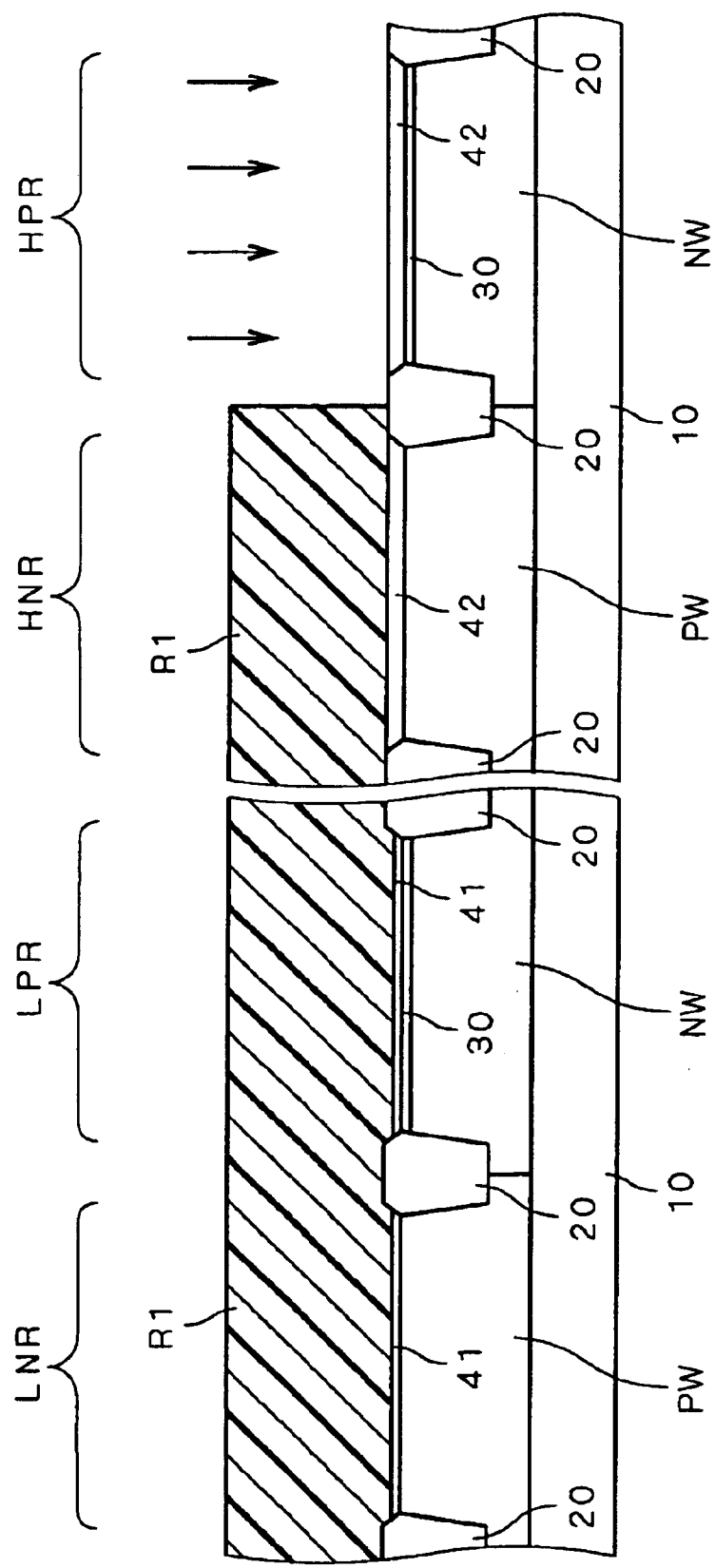
F I G . 30

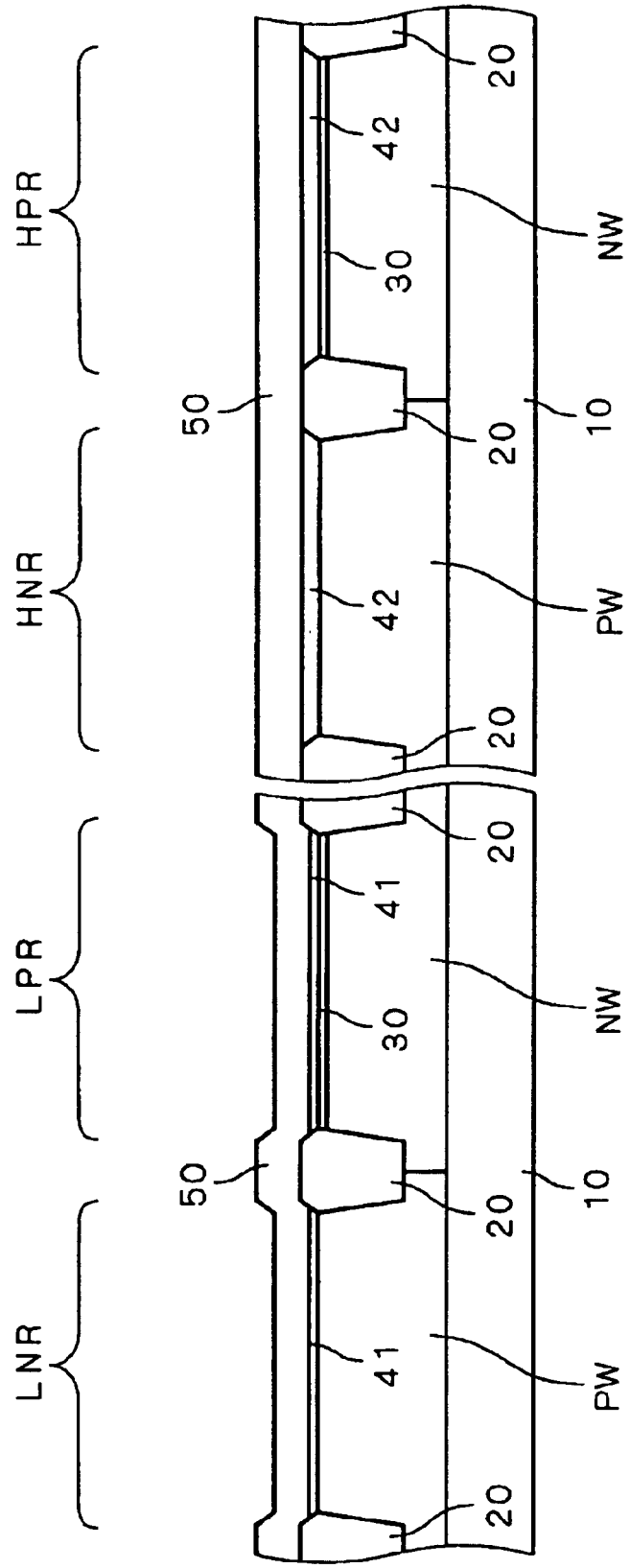
F I G . 3 1

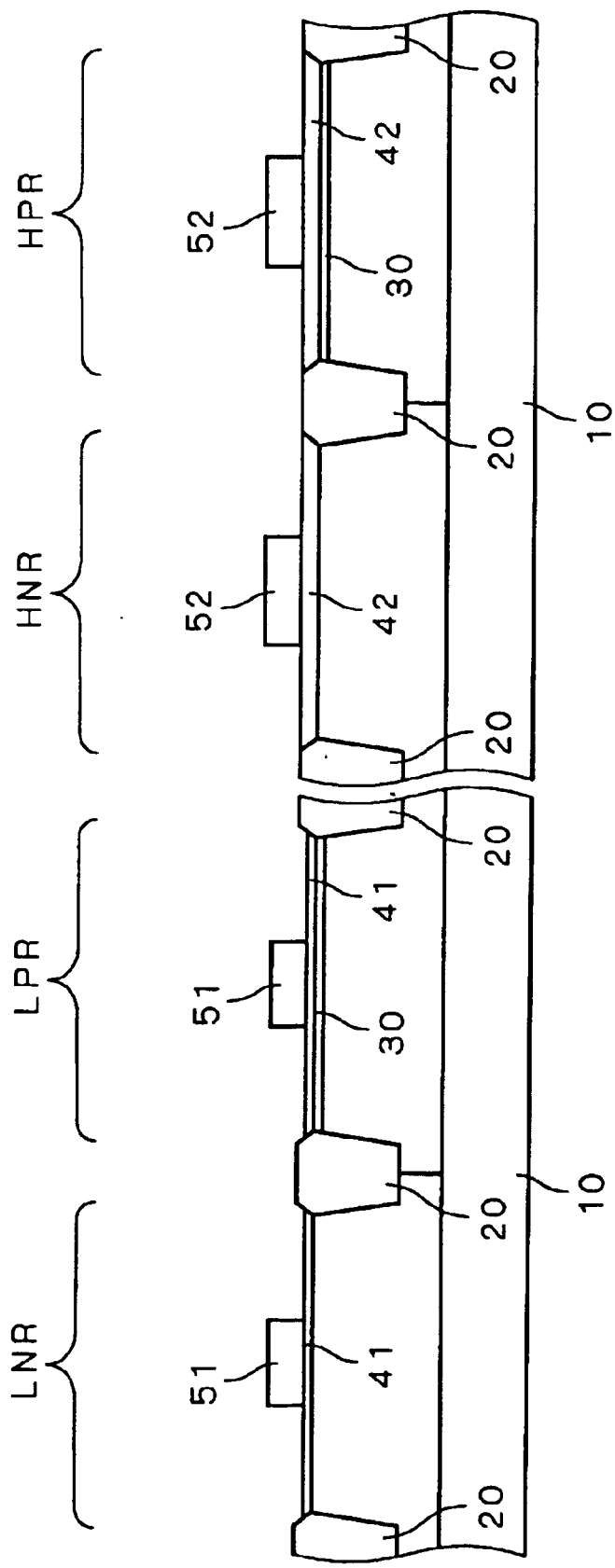
F I G . 32

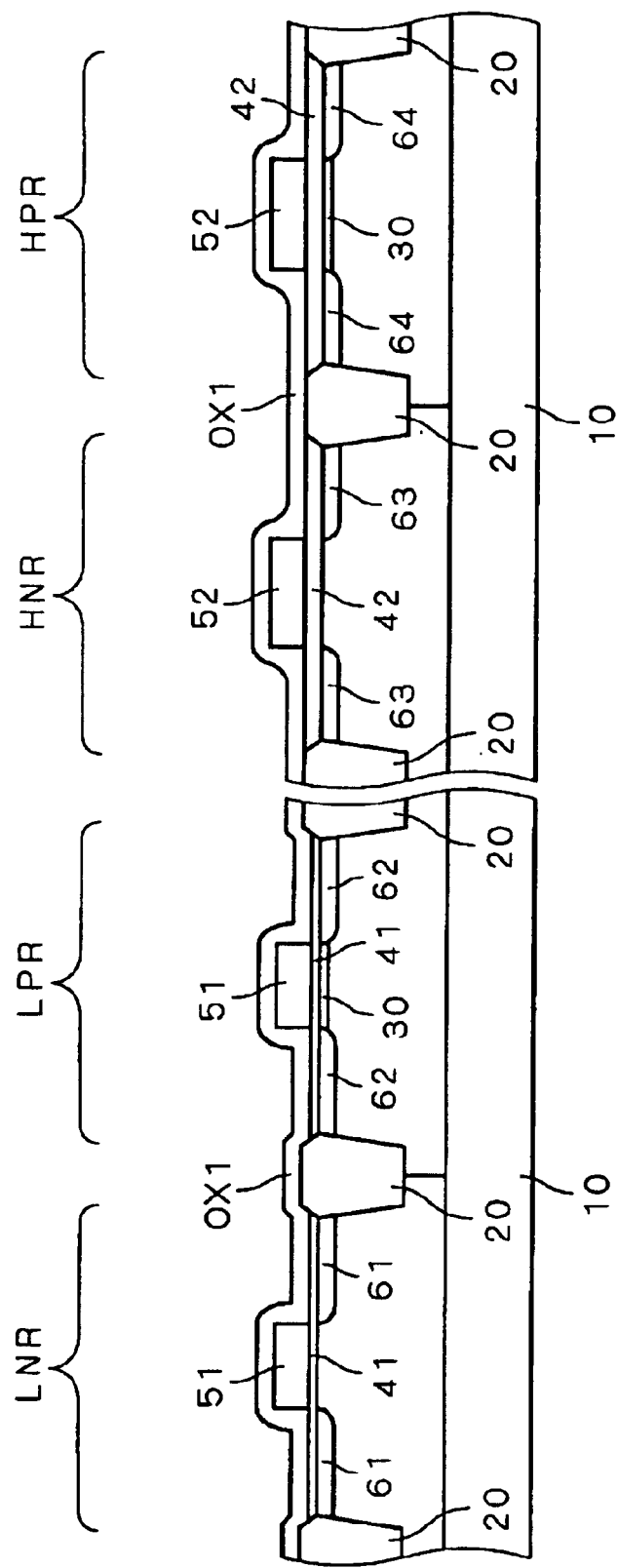
F I G . 3 4

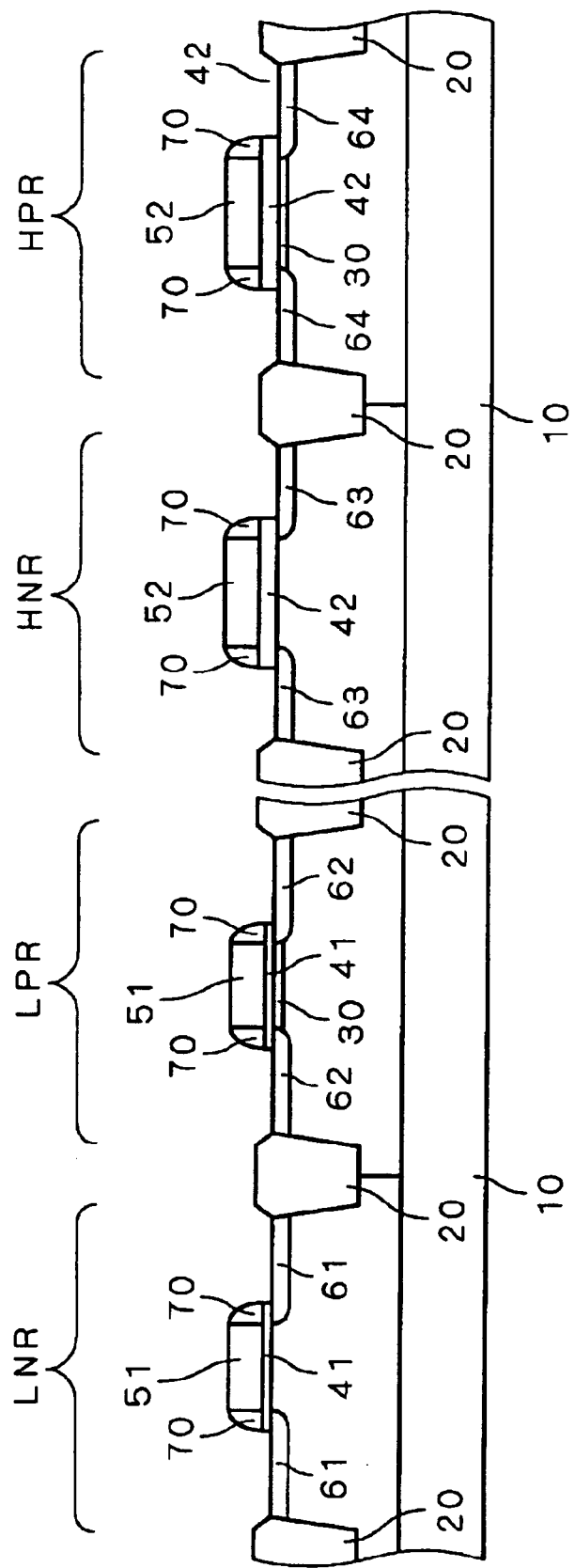
F I G . 3 5

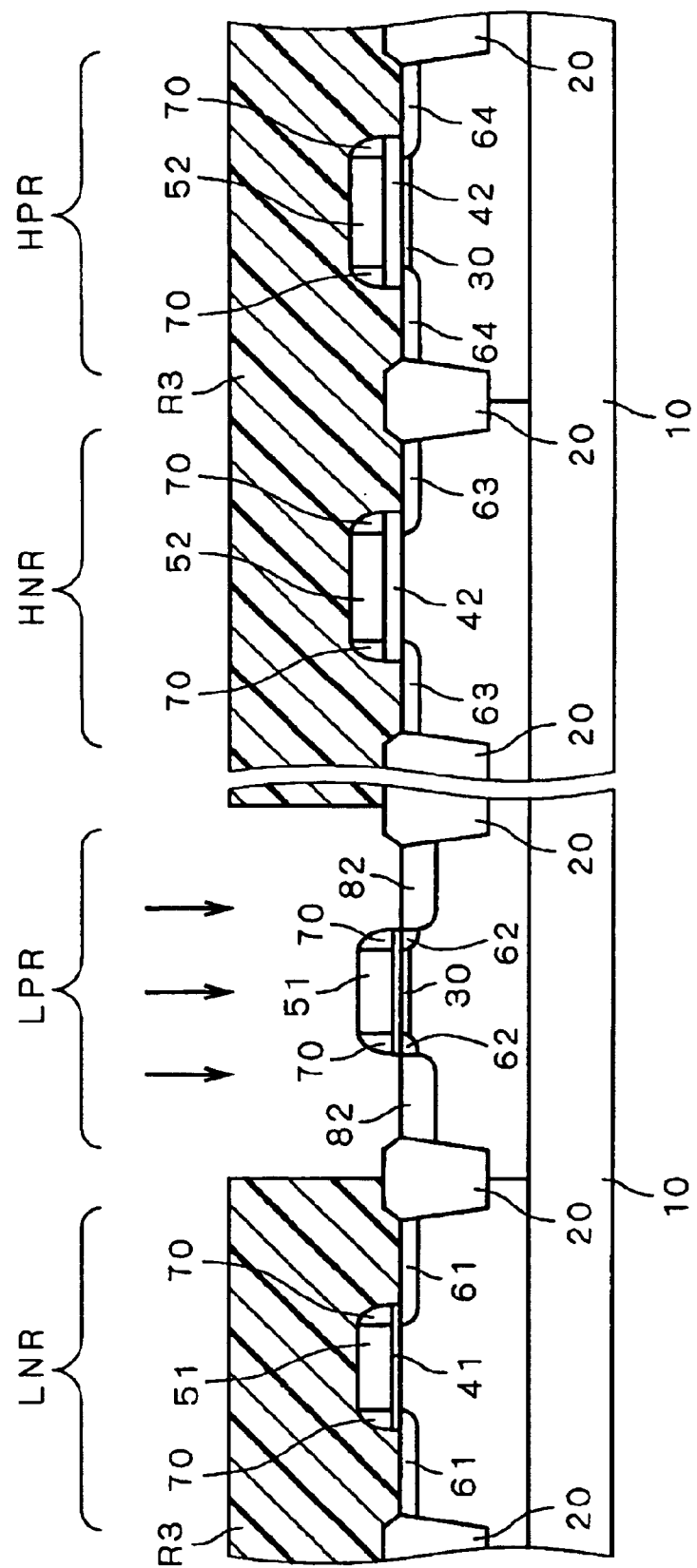
F I G . 36

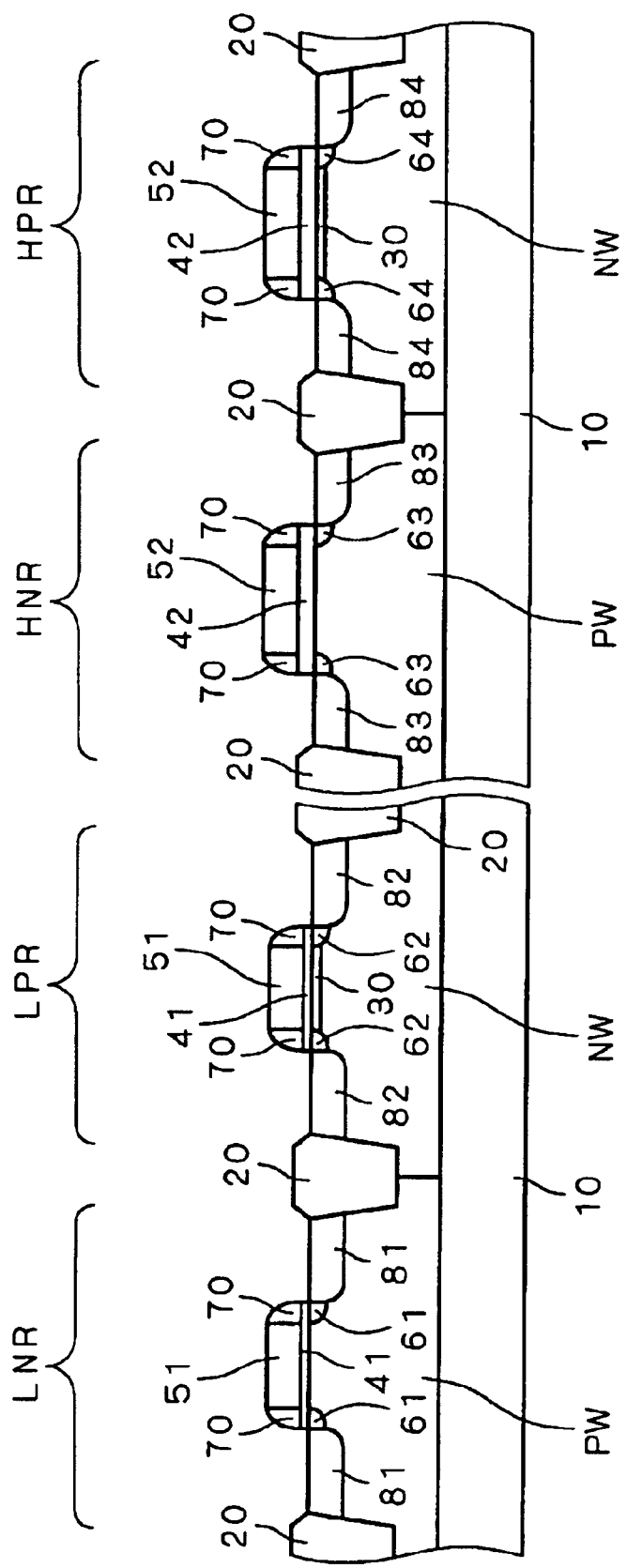
F I G . 3 7

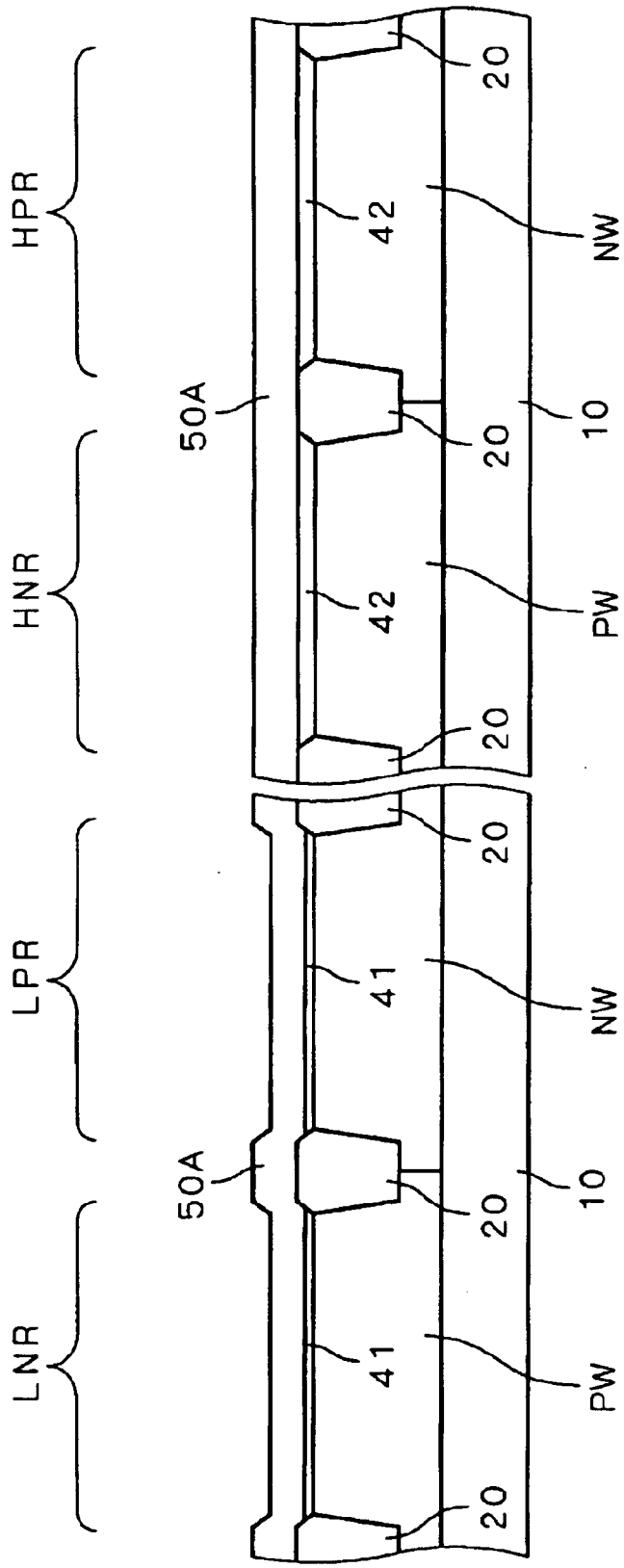
F I G . 39

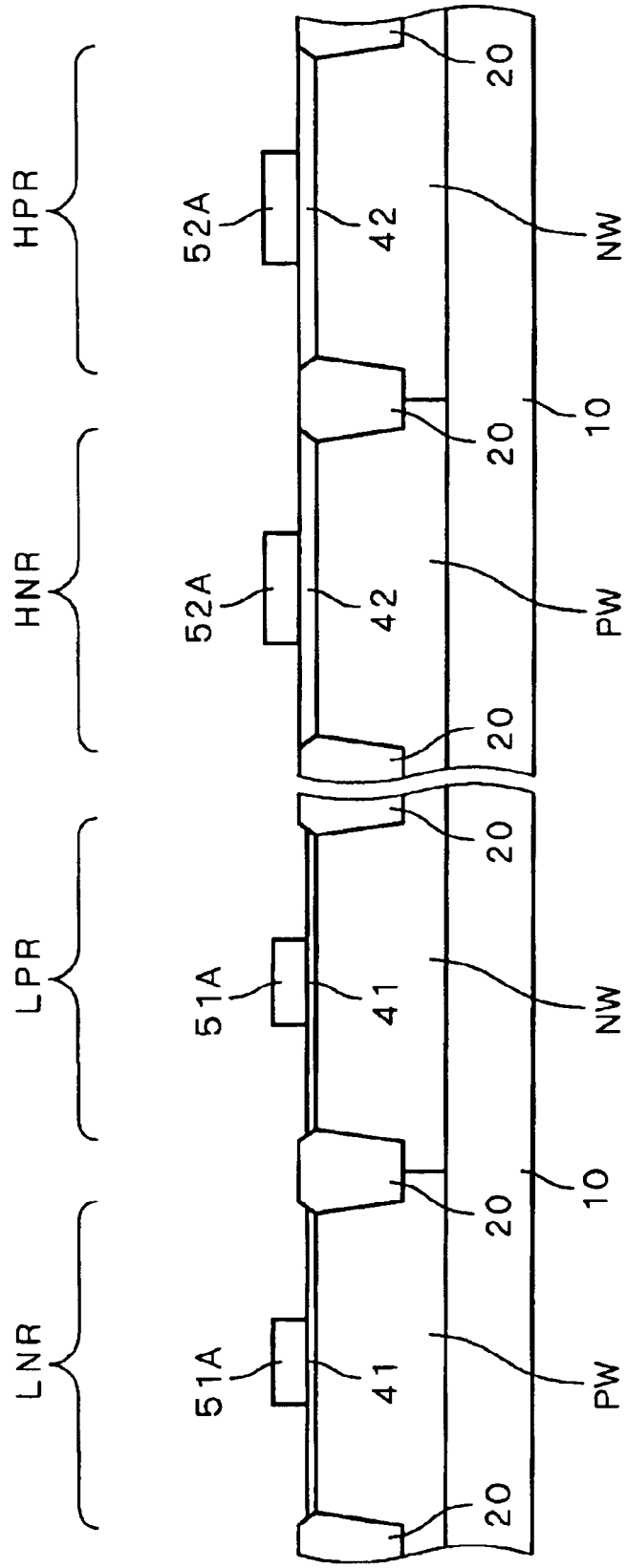
F I G . 4 0

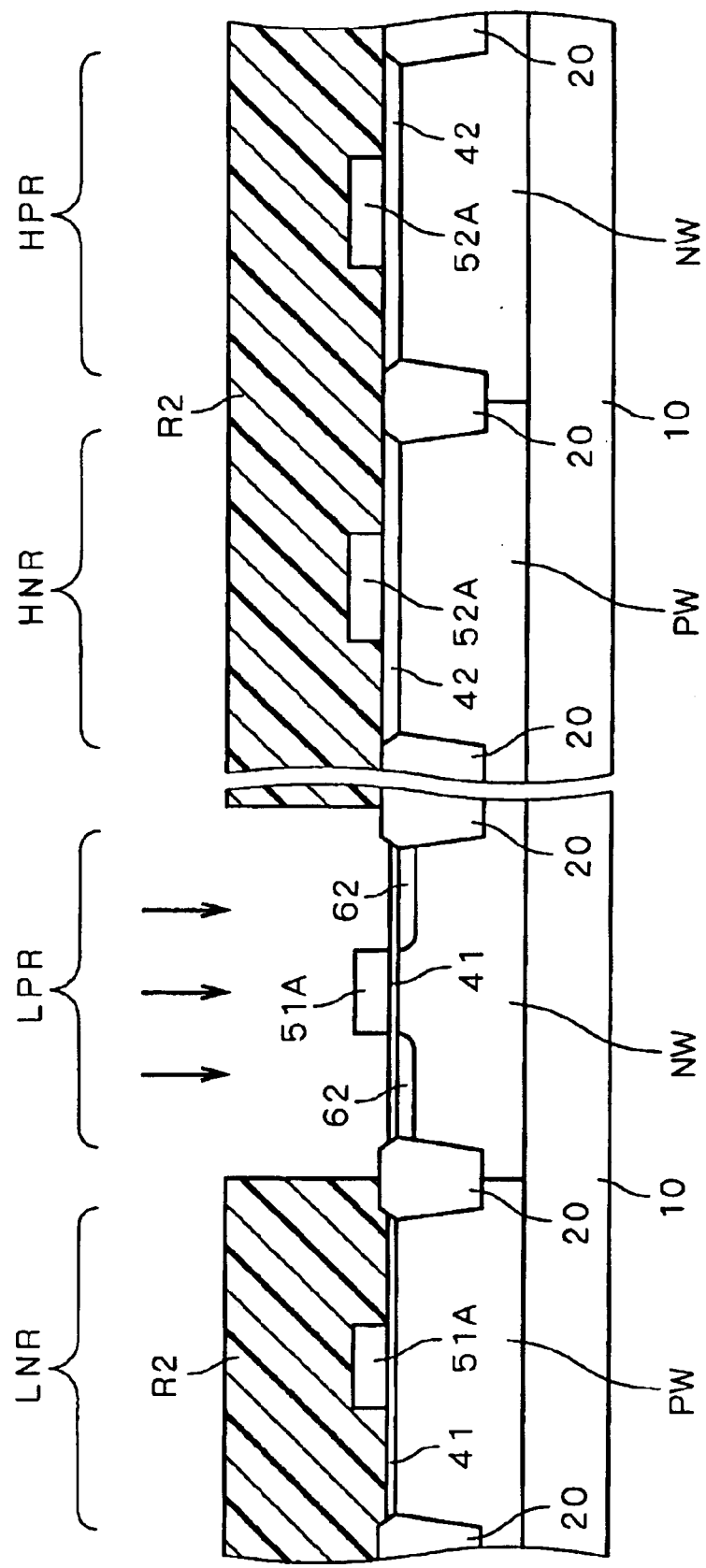
F I G . 4 1

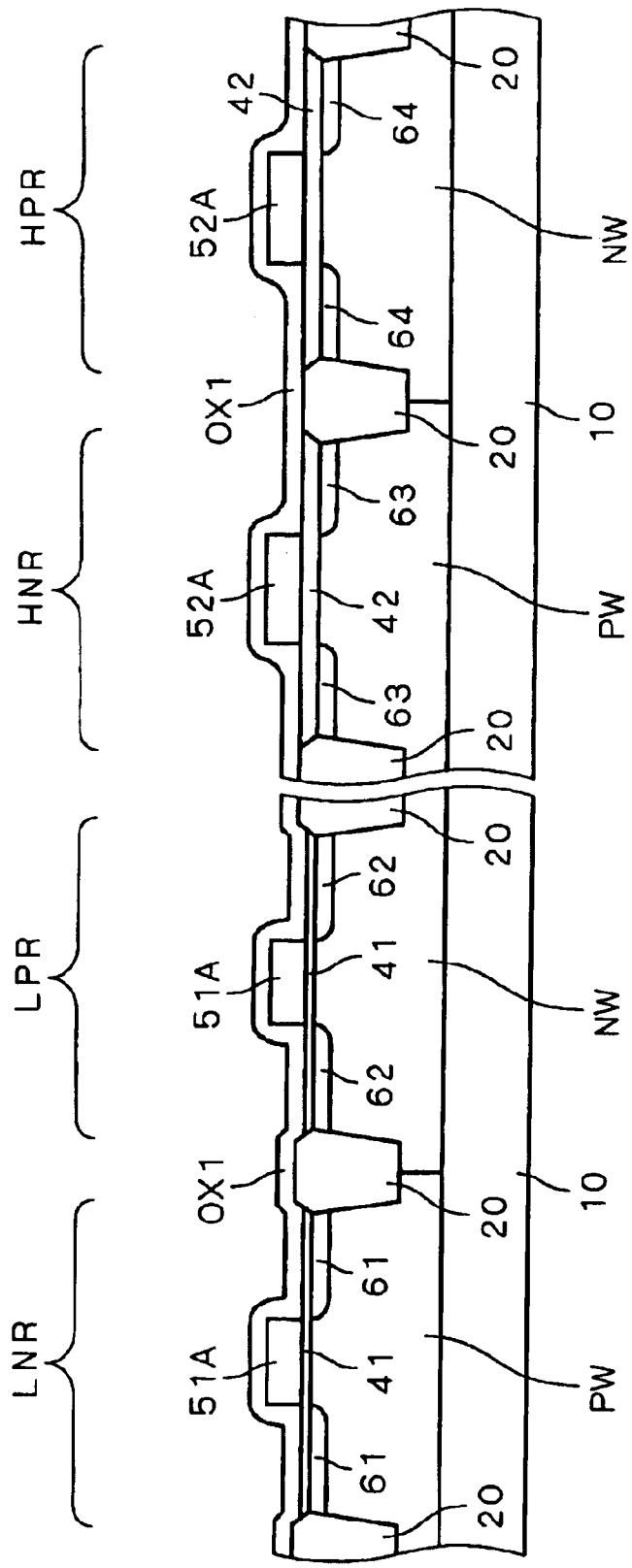
F I G . 4 2
< BACKGROUND ART >

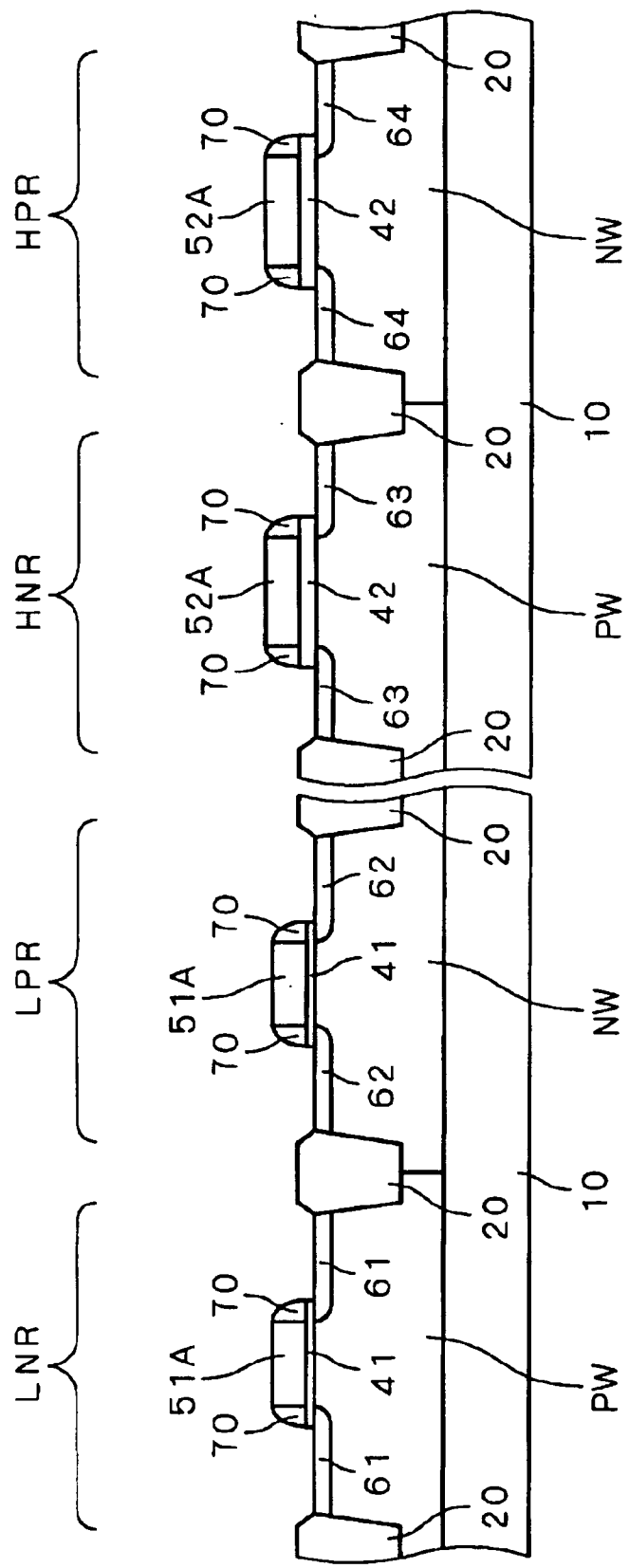
F I G . 4 3

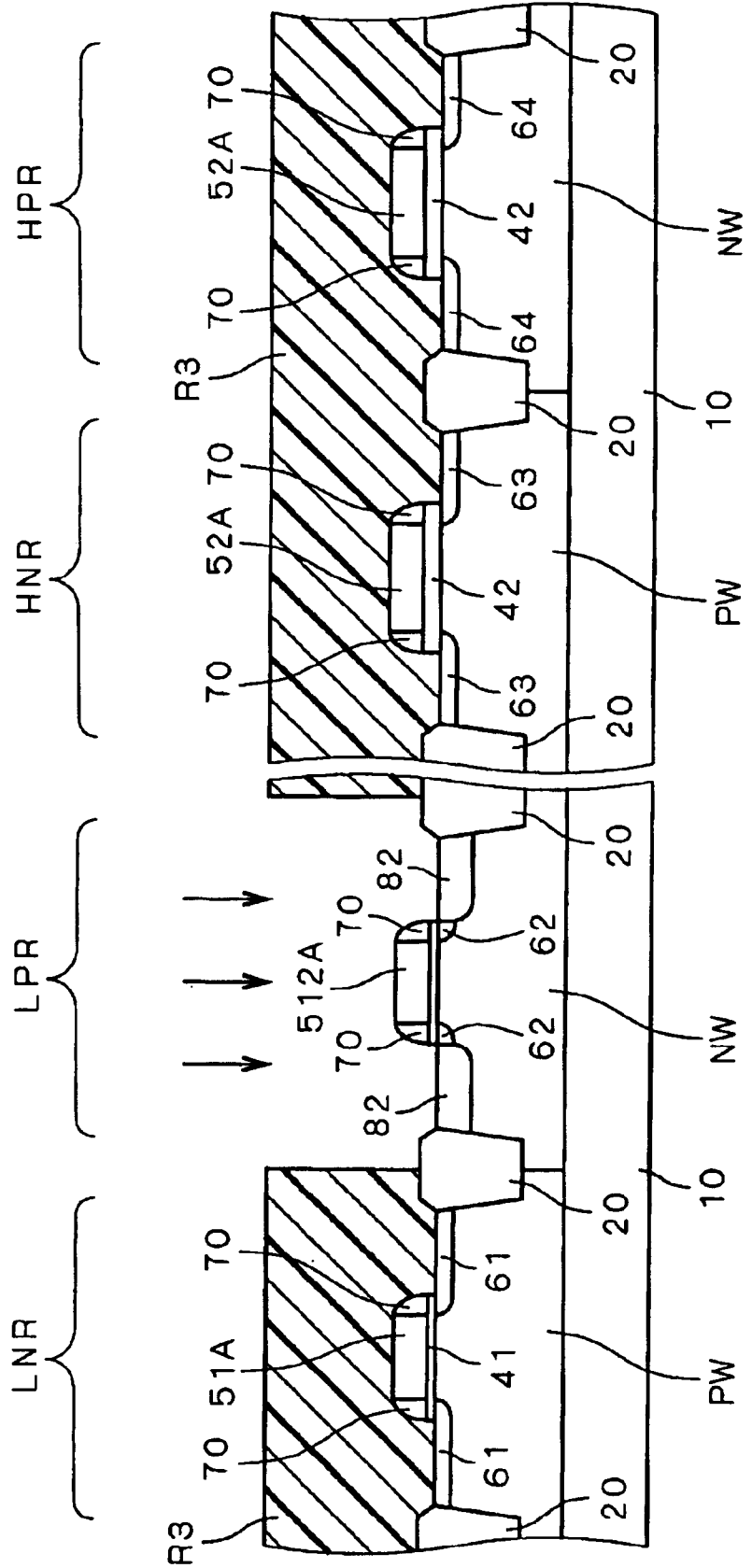
F I G . 4 4

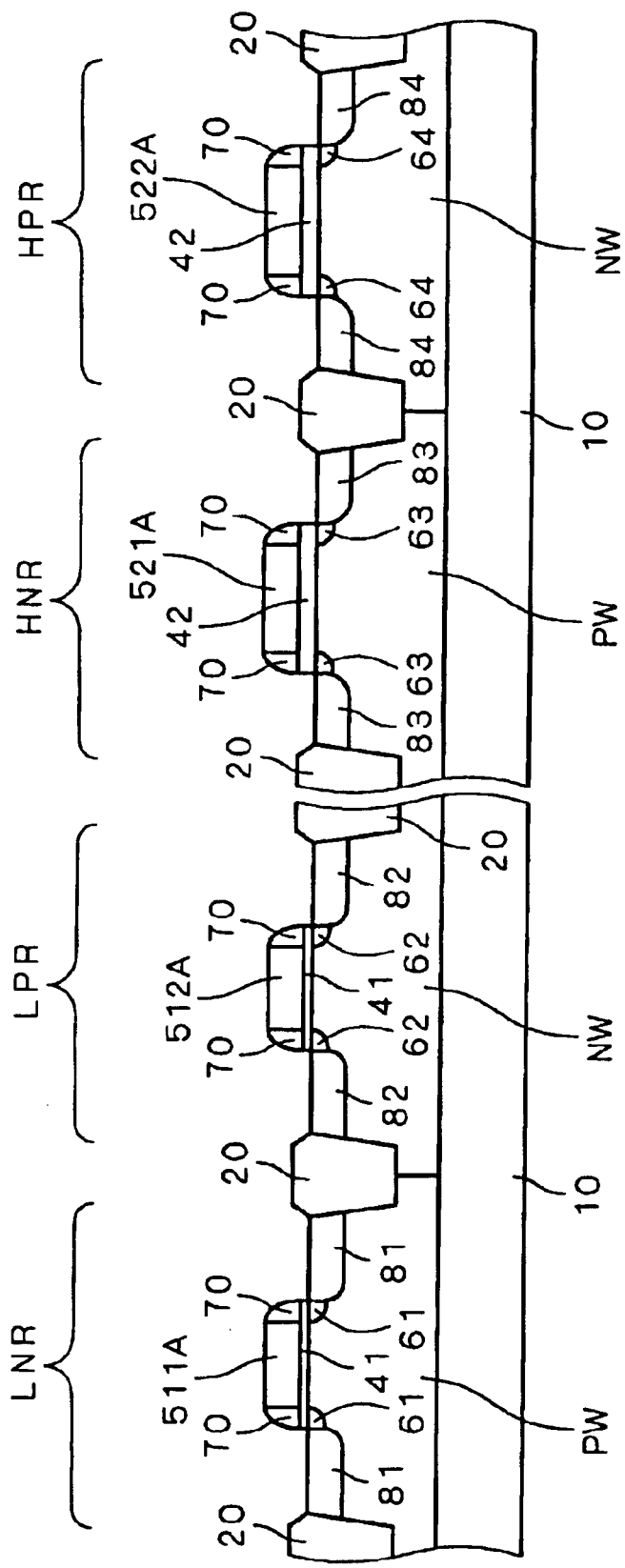
F I G. 46

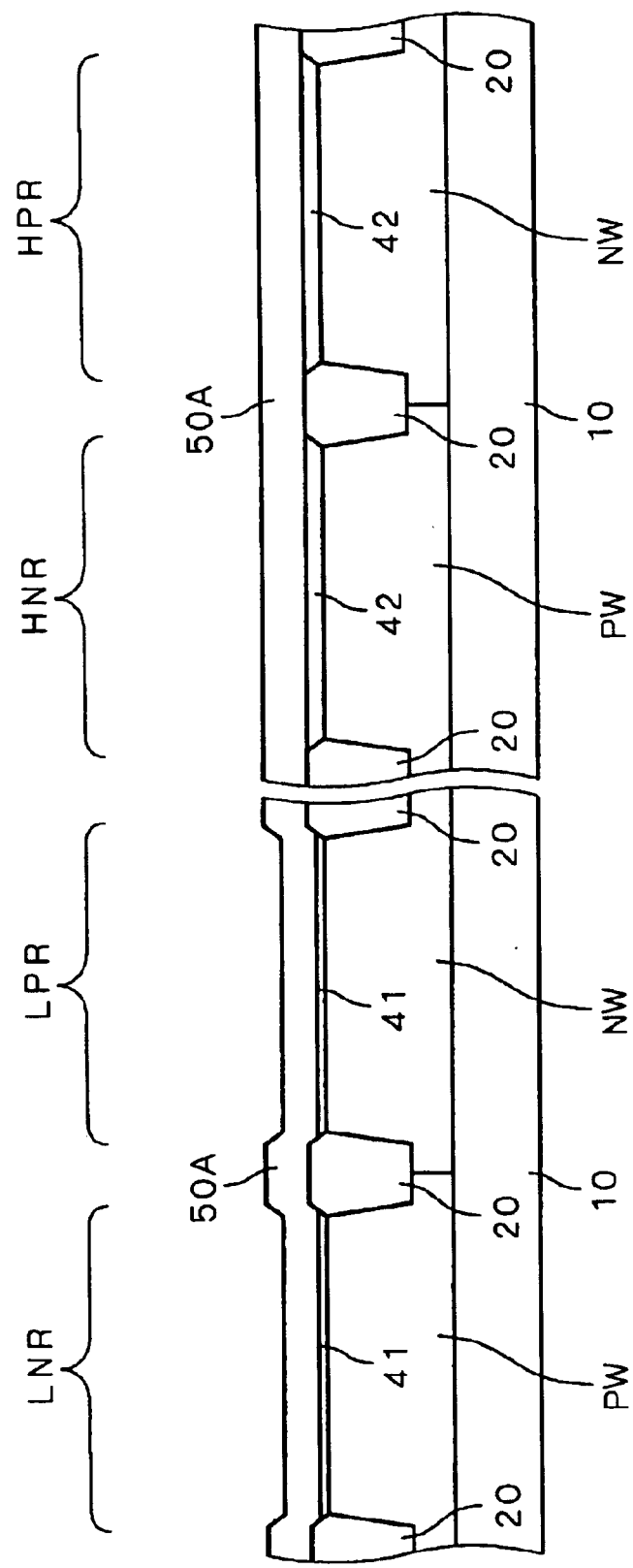
F I G . 4 8

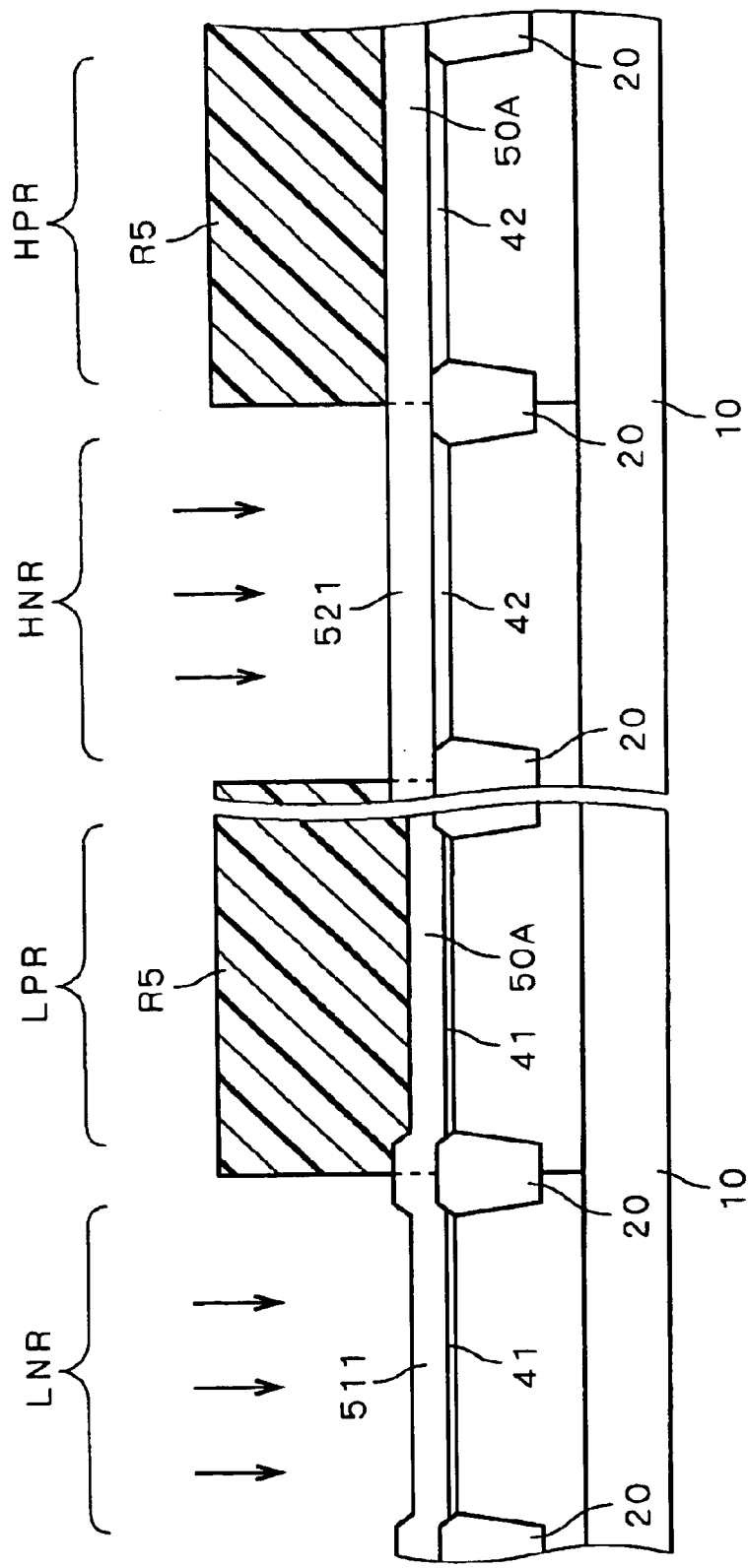
F I G . 4 9

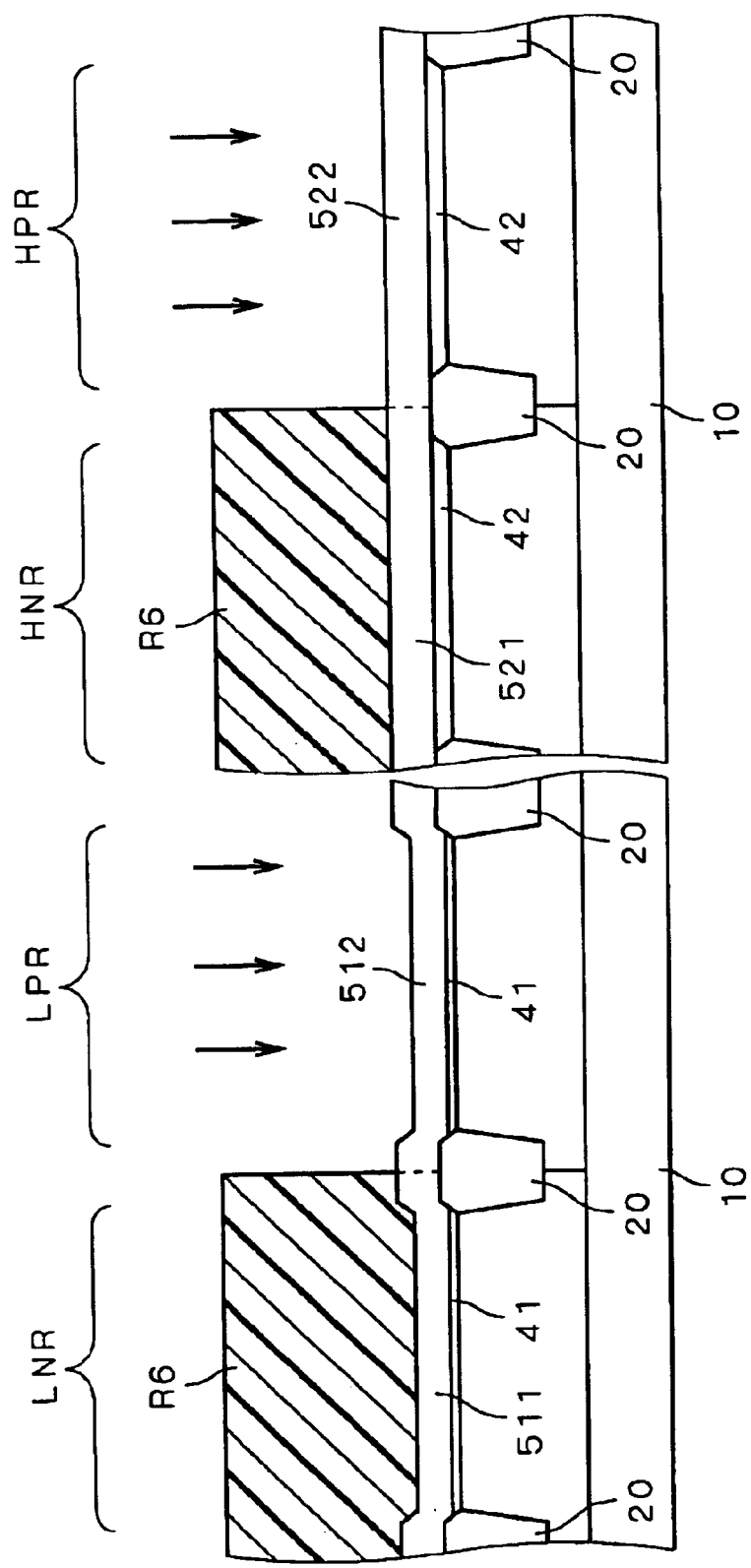
F I G . 5 0

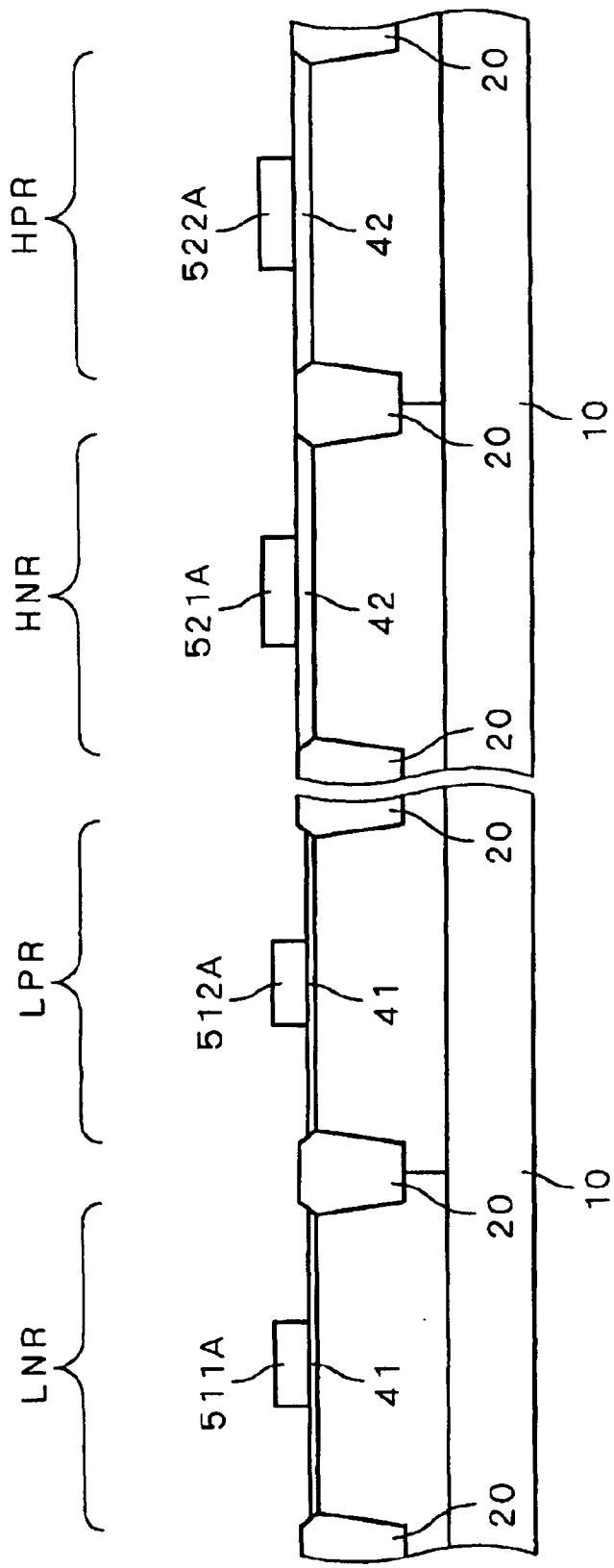
F I G . 5 1

SEMICONDUCTOR DEVICE AND MANUFACTURING METHOD THEREOF

BACKGROUND OF THE INVENTION

1. Field of the Invention

The present invention relates to a semiconductor device and a manufacturing method thereof, and particularly to CMOS transistors and a manufacturing method thereof.

2. Description of the Background Art

In formation of CMOS (Complementary MOS) transistors which use N-channel MOSFETs (referred to as NMOS transistors hereinafter) and P-channel MOSFETs (referred to as PMOS transistors hereinafter) in combination, it is required that the gate electrodes of the NMOS and PMOS transistors suit their respective characteristics.

In MOS transistors having gate lengths up to 0.25 to 0.35 μm, surface-channel type transistors are used as the NMOS transistors and buried-channel type transistors are used as the PMOS transistors, both of which use polysilicon which is doped with impurity, phosphorus (P), as the gate electrodes.

However, the PMOS transistors, adopting the buried-channel structure, are difficult to downsize, since the channel is formed inside the substrate; recent devices therefore adopt the surface-channel structure in both of the NMOS and PMOS transistors, where dual-gate process is becoming common in which N-type impurities are introduced into the gate electrodes of the NMOS transistors and P-type impurities are introduced into the gate electrodes of the PMOS transistors. In contrast to the dual-gate process, a process in which the same type of impurities are introduced into the gate electrodes of both is called a single-gate process.

In the dual-gate process, a layer of non-doped polysilicon is formed as the gate electrodes and impurities are introduced during the gate implantation process and source/drain implantation process.

However, in surface-channel type devices in which the channel is formed right under the gate insulating film, a strong vertical electric field may reduce the carrier mobility. The strong electric field also considerably reduces the reliability under hot-carrier stress and the reliability under bias-temperature stress (NBTI: Negative Bias Temperature Instability).

Accordingly, in recent semiconductor devices having plural kinds of transistors with different operating voltages, e.g. transistors in low-voltage portion which operate at relatively low voltage and transistors in high-voltage portion which operate at relatively high voltage, the performance and reliability of the high-voltage transistors are often sacrificed.

First Conventional Example

First, referring to FIGS. 30 to 38, a method for manufacturing a semiconductor device having a CMOS transistor 70A and a CMOS transistor 70B is described as an example of the single-gate process. The structure of the CMOS transistor 70A designed for low voltage and that of the CMOS transistor 70B designed for high voltage are shown in FIG. 38 which illustrates the final process step.

First, as shown in FIG. 30, element isolation insulating film 20 is selectively formed in the surface of the silicon substrate 10 to define a low-voltage NMOS region LNR and a low-voltage PMOS region LPR for formation of a low-voltage NMOS transistor and a low-voltage PMOS transistor, and a high-voltage NMOS region HNR and a high-voltage PMOS region HPR for formation of a high-voltage NMOS transistor and a high-voltage PMOS transistor.

Then P well regions PW containing a P-type impurity are formed in the surface of the silicon substrate 10 in the low-voltage NMOS region LNR and the high-voltage NMOS region HNR, and N well regions NW containing an N-type impurity are formed in the surface of the silicon substrate 10 in the low-voltage PMOS region LPR and the high-voltage PMOS region HPR. In the description below, the P well regions PW and the N well regions NW may be simply called a silicon substrate together.

A gate insulating film 41, e.g. an insulating film of silicon oxide, is then formed all over the low-voltage NMOS region LNR and the low-voltage PMOS region LPR on the silicon substrate 10. A gate insulating film 42, e.g. an insulating film of silicon oxide, is formed all over the high-voltage NMOS region HNR and the high-voltage PMOS region HPR on the silicon substrate 10.

The gate insulating film 41 is formed to a thickness of about 0.5 to 3 nm in terms of silicon oxide film thickness, and the gate insulating film 42 is formed to a thickness of about 3 to 10 nm in terms of silicon oxide film thickness.

Then low-concentration impurity layers 30 are formed by introducing a P-type impurity by ion implantation to a relatively low concentration (P−) into the surface of the silicon substrate 10 in the low-voltage PMOS region LPR and the high-voltage PMOS region HPR. FIG. 30 shows the process in which a P-type impurity is ion-implanted into the high-voltage PMOS region HPR, with the part except the high-voltage PMOS region HPR covered by a resist mask R1 patterned by photolithography. P-type impurity is similarly introduced into the surface of the silicon substrate 10 in the low-voltage PMOS region LPR to form the low-concentration impurity layer 30.

Next, in the process shown in FIG. 31, a non-single-crystal silicon film 50 is applied all over the surface of the silicon substrate 10. This non-single-crystal silicon film 50 is formed of polysilicon or amorphous silicon and contains an N-type impurity, e.g. P (phosphorus).

Next, in the process shown in FIG. 32, the non-single-crystal silicon film 50 is patterned by photolithography to form gate electrodes 51 in the low-voltage NMOS region LNR and the low-voltage PMOS region LPR, and gate electrodes 52 in the high-voltage NMOS region HNR and the high-voltage PMOS region HPR.

Next, in the process shown in FIG. 33, a P-type impurity is introduced by ion implantation to a relatively low concentration (P−) into the surface of the silicon substrate 10 in the low-voltage PMOS region LPR, so as to form a pair of extension layers 62. FIG. 33 shows the process in which a P-type impurity is ion-implanted into the low-voltage PMOS region LPR by using the gate electrode 51 as an implant mask, with the part other than the low-voltage PMOS region LPR covered by a resist mask R2 patterned by photolithography.

The pair of extension layers 62 are provided in such a manner that they face each other through the low-concentration impurity layer 30 underneath the gate electrode 51. In this case, the region of the silicon substrate 10 located underneath the low-concentration impurity layer 30 serves as the channel region.

The extension layers are impurity layers which form a shallower junction than main source/drain layers formed later; while they should be called source/drain extension layers since they have the same conductivity type as the main source/drain layers and function as source/drain layers, they are called extension layers for convenience. Extension layers are formed also in other regions by similar process.

FIG. 34 shows the structure obtained after the formation of extension layers in the individual regions, where pairs of extension layers 61 and 63 are formed in the surface of the silicon substrate 10 respectively in the low-voltage NMOS region LNR and the high-voltage NMOS region HNR by introducing an N-type impurity to a relatively low concentration (N$^-$), and pairs of extension layers 62 and 64 are formed in the surface of the silicon substrate 10 respectively in the low-voltage PMOS region LPR and the high-voltage PMOS region HPR by introducing a P-type impurity to a relatively low concentration (P$^-$).

The pair of extension layers 64 are formed in such a manner that the low-concentration impurity layer 30 is interposed between them.

FIG. 34 shows a process for forming side wall protection film (side wall insulating film) to protect the side walls of the gate electrodes 51 and 52, where an insulating film OX1, e.g. a silicon oxide film, is formed all over the silicon substrate 10.

Subsequently, in the process shown in FIG. 35, the parts of the insulating film OX1 located on top of the gate electrodes 51 and 52 and on the silicon substrate 1 are removed by anisotropic etching, leaving the insulating film OX1 only on the side walls of the gate electrodes 51 and 52, so as to form side wall protecting films 70. In this process, the gate insulating film 41 is also removed in the parts where it is not covered by the gate electrodes 51 and the side wall protecting films 70, and the gate insulating film 42 is also removed in the parts where it is not covered by the gate electrodes 52 and the side wall protecting films 70.

Next, in the process shown in FIG. 36, a resist mask R3 is patterned by photolithography to cover the part except the low-voltage PMOS region LPR, and a P-type impurity is ion-implanted to a relatively high concentration (P$^+$) in the low-voltage PMOS region LPR by using the gate electrode 51 and the side wall protecting films 70 as an implant mask, so as to form a pair of source/drain layers 82 in the surface of the silicon substrate 10. Source/drain layers are similarly formed also in other regions. After the formation of the source/drain layers, damages caused by the ion implantation can be repaired by applying a thermal process.

FIG. 37 shows the structure in which source/drain layers are formed in the individual regions, where pairs of source/drain layers 81 and 83 are formed in the surface of the silicon substrate 10 respectively in the low-voltage NMOS region LNR and the high-voltage NMOS region HNR by introducing an N-type impurity to a relatively high concentration (N$^+$), and pairs of source/drain layers 82 and 84 are formed in the surface of the silicon substrate 10 respectively in the low-voltage PMOS region LPR and the high-voltage PMOS region HPR by introducing a P-type impurity to a relatively high concentration (P$^+$).

Next, in the process shown in FIG. 38, a film of refractory metal, e.g. cobalt (Co), is formed by sputtering to cover the entire surface of the silicon substrate 10 and a high-temperature treatment at 350 to 600° C. is applied to form a silicide film in the parts where the refractory metal film is in contact with the exposed surface of the silicon substrate 10 and the exposed surfaces of the gate electrodes 51 and 52. The refractory metal film remaining unsilicidized is removed and a further thermal treatment is applied to form cobalt silicide films (CoSi$_2$) 90; the CMOS transistor 70A designed for low voltage and the CMOS transistor 70B designed for high voltage are thus obtained as shown in FIG. 38.

In FIG. 38, buried-channel type PMOS transistors are formed in the low-voltage PMOS region LPR and the high-voltage PMOS region HPR, and surface-channel type NMOS transistors are formed in the low-voltage NMOS region LNR and the high-voltage NMOS region HNR. Where N-type impurity is introduced in the gate electrodes of the buried-channel type PMOS transistors and it is therefore a single-gate process.

Second Conventional Example

Next, referring to FIGS. 39 to 47, a method for manufacturing a semiconductor device having a CMOS transistor 80A and a CMOS transistor 80B is described as an example of the dual-gate process. The structure of the CMOS transistor 80A designed for low voltage and that of the CMOS transistor 80B designed for high voltage are shown in FIG. 47 which illustrates the final process step. The same components as those shown in the method for manufacturing the low-voltage CMOS transistor 70A and the high-voltage CMOS transistor 70B described referring to FIGS. 30 to 38 are shown at the same reference characters and not described here again.

First, as shown in FIG. 39, a gate insulating film 41, e.g. an insulating film of silicon oxide, is formed all over the low-voltage NMOS region LNR and the low-voltage PMOS region LPR on the silicon substrate 10. A gate insulating film 42, e.g. an insulating film of silicon oxide, is formed all over the high-voltage NMOS region HNR and the high-voltage PMOS region HPR on the silicon substrate 10.

Next, a non-single-crystal silicon film 50A is applied all over the silicon substrate 10. This non-single-crystal silicon film 50A does not contain impurity.

Next, in the process shown in FIG. 40, the non-single-crystal silicon film 50A is patterned by photolithography to form gate electrodes 51A in the low-voltage NMOS region LNR and the low-voltage PMOS region LPR, and gate electrodes 52A in the high-voltage NMOS region HNR and the high-voltage PMOS region HPR.

Next, in the process shown in FIG. 41, a resist mask R2 is patterned by photolithography to cover the part other than the low-voltage PMOS region LPR, and a P-type impurity is introduced by ion implantation to a relatively low concentration (P$^-$) into the surface of the silicon substrate 10 in the low-voltage PMOS region LPR by using the gate electrode 51A as an implant mask, so as to form a pair of extension layers 62.

FIG. 42 shows a process for, after formation of extension layers in the individual regions, forming side wall protection film (side wall insulating film) to protect the side walls of the gate electrodes 51A and 52A, where an insulating film OX1 of, e.g. silicon oxide, is formed all over the surface of the silicon substrate 10.

Subsequently, in the process shown in FIG. 43, the parts of the insulating film OXI located on top of the gate electrodes 51A and 52A and on the silicon substrate 1 are removed by anisotropic etching, leaving the insulating film OX1 only on the side walls of the gate electrodes 51A and 52A, so as to form side wall protecting films 70. In this process, the gate insulating film 41 is also removed in the parts where it is not covered by the gate electrodes 51A and the side wall protecting films 70, and the gate insulating film 42 is also removed in the parts where it is not covered by the gate electrodes 52A and the side wall protecting films 70.

Next, in the process shown in FIG. 44, a resist mask R3 is patterned by photolithography to cover the part other than the low-voltage PMOS region LPR, and a P-type impurity is ion-implanted to a relatively high concentration (P⁺) in the low-voltage PMOS region LPR by using the gate electrode 51A and the side wall protecting films 70 as an implant mask, so as to form a pair of source/drain layers 82 in the surface of the silicon substrate 10. In this process step, the P-type impurity is also introduced into the gate electrode 51A, which, with the impurity introduced during formation of the extension layers 62, forms the gate electrode 51A as a gate electrode 512A which contains P-type impurity to the same extent as, or more heavily than, the source/drain layers 82.

Next, in the process shown in FIG. 45, a resist mask R4 is formed to cover the part except the high-voltage PMOS region HPR, and a P-type impurity is ion-implanted to a relatively high concentration (P⁺) in the high-voltage PMOS region HPR by using the gate electrode 52A and the side wall protecting films 70 as an implant mask, so as to form a pair of source/drain layers 84 in the surface of the silicon substrate 10. In this process step, the P-type impurity is also introduced into the gate electrode 52A, which, with the impurity introduced during formation of the extension layers 64, forms the gate electrode 52A as a gate electrode 522A which contains P-type impurity to the same extent as, or more heavily than, the source/drain layers 84.

Similarly, during formation of source/drain layers 81 and 83 in the low-voltage NMOS region LNR and the high-voltage NMOS region HNR, an N-type impurity is introduced into the gate electrodes 51A and 52A, which, with the impurity introduced during formation of the extension layers 61 and 63, forms gate electrodes 511A and 521A which contain N-type impurity to the same extent as, or more heavily than, the source/drain layers 84.

FIG. 46 shows the structure in which the source/drain layers are formed in the individual regions, where pairs of source/drain layers 81 and 83 are formed in the surface of the silicon substrate 10 respectively in the low-voltage NMOS region LNR and the high-voltage NMOS region HNR by introducing an N-type impurity to a relatively high concentration (N+), and pairs of source/drain regions 82 and 84 are formed in the surface of the silicon substrate 10 respectively in the low-voltage PMOS region LPR and the high-voltage PMOS region HPR by introducing a P-type impurity to a relatively high concentration (P⁺).

Next, in the process shown in FIG. 47, a film of a refractory metal, e.g. cobalt (Co), is formed by sputtering to cover the entire surface of the silicon substrate 10 and a high-temperature treatment at 350 to 600° C. is applied to form silicide film in the parts where the refractory metal film is in contact with the exposed surface of the silicon substrate 10 and the exposed surfaces of the gate electrodes 511A, 512A, 521A and 522A. The refractory metal film remaining unsilicidized is removed and a further thermal treatment is applied to form cobalt silicide films (CoSi₂) 90; the low-voltage CMOS transistor 80A and the high-voltage CMOS transistor 80B are thus obtained.

Third Conventional Example

Next, referring to FIGS. 48 to 51, another method for manufacturing the semiconductor device having the CMOS transistor 80A and the CMOS transistor 80B is described. The structure of the CMOS transistor 80A designed for low voltage and that of the CMOS transistor 80B designed for high voltage are the same as those shown in FIG. 47 and therefore not shown in the drawing. The same components as those shown in the method for manufacturing the low-voltage CMOS transistor 70A and the high-voltage CMOS transistor 70B described referring to FIGS. 30 to 38 are shown at the same reference characters and not described here again.

First, as shown in FIG. 48, a non-single-crystal silicon film 50A is applied all over the surface of the gate insulating films 41 and 42. This non-single-crystal silicon film 50A does not contain impurity.

Next, in the process shown in FIG. 49, a resist mask R5 is patterned by photolithography to cover the part except the low-voltage NMOS region LNR and the high-voltage NMOS region HNR, and an N-type impurity is introduced by ion implantation to a relatively high concentration (N⁺) into the non-single-crystal silicon film 50A, so as to form N-type non-single-crystal silicon films 511 and 521.

Next, in the process shown in FIG. 50, a resist mask R6 is patterned by photolithography to cover the part except the low-voltage PMOS region LPR and the high-voltage PMOS region HPR and a P-type impurity is introduced by ion implantation to a relatively high concentration (P⁺) into the non-single-crystal silicon film 50A, so as to form P-type non-single-crystal silicon films 512 and 522.

Next, in the process shown in FIG. 51, the non-single-crystal silicon films 511, 512, 521 and 522 are patterned by photolithography to form gate electrodes 511A and 512A in the low-voltage NMOS region LNR and the low-voltage PMOS region LPR, and gate electrodes 521A and 522A in the high-voltage NMOS region HNR and the high-voltage PMOS region HPR. Subsequently, the CMOS transistor 80A for low voltage and the CMOS transistor 80B for high voltage are obtained as shown in FIG. 47 through the process steps described referring to FIGS. 41 to 47.

The manufacturing method described referring to FIGS. 48 to 51 is effective because impurities can be introduced into the gate electrodes independently of the introduction of impurities for formation of the source/drain layers. Besides, when the gate electrodes are formed of a multi-layered film of non-single-crystal silicon and a metal film or a silicide film, the introduction of impurities into the gate electrodes cannot be performed at the same time as the introduction of impurities for formation of the source/drain layers, so the manufacturing method shown in FIGS. 48 and 51 is effective.

As described above, the CMOS transistor 70A and the CMOS transistor 70B have buried-channel type PMOS transistors in the low-voltage PMOS region LPR and the high-voltage PMOS region HPR and surface-channel type NMOS transistors in the low-voltage NMOS region LNR and the high-voltage NMOS region HNR, where it is difficult to achieve size reduction of the buried-channel type MOS transistors.

While the CMOS transistor 80A and the CMOS transistor 80B have no problem with size reduction since the NMOS and PMOS transistors are both surface-channel type, they encounter such problems as the reduction of carrier mobility due to the electric field, reduction of reliability under hot-carrier stress, and reduction of NBTI.

SUMMARY OF THE INVENTION

According to a first aspect of the present invention, a semiconductor device comprises: a first NMOS transistor and a first PMOS transistor provided respectively in a first NMOS region and a first PMOS region defined in a surface of a semiconductor substrate; and a second NMOS transistor and a second PMOS transistor provided respectively in a second NMOS region and a second PMOS region defined in the surface of the semiconductor substrate; wherein the second NMOS transistor and the second PMOS transistor have higher operating voltages respectively than the first NMOS transistor and the first PMOS transistor, the second PMOS transistor is a buried-channel type MOS transistor in which a channel is formed in the inside of the semiconductor substrate, and the first NMOS transistor, the first PMOS transistor, and the second NMOS transistor are surface-channel type MOS transistors in which a channel is formed in the surface of the semiconductor substrate.

Preferably, according to a second aspect, in the semiconductor device, the second PMOS transistor comprises a gate insulating film selectively provided on the surface of the semiconductor substrate in the second PMOS region, a gate electrode provided on the gate insulating film, a P-type impurity layer of a relatively low concentration provided in the surface of the semiconductor substrate right under the gate insulating film, and a pair of P-type source/drain layers provided in the surface of the semiconductor substrate outside of sides of the gate electrode and in contact with the impurity layer.

Preferably, according to a third aspect, in the semiconductor device, the pair of P-type source/drain layers comprise a pair of P-type extension layers extending from opposing ends and facing each other.

Preferably, according to a fourth aspect, in the semiconductor device, the gate electrode comprises an N-type impurity at a relatively high concentration.

According to a fifth aspect of the present invention, a semiconductor device manufacturing method comprises the steps of: (a) defining a first NMOS region and a first PMOS region in a surface of a semiconductor substrate respectively for formation of a first NMOS transistor and a first PMOS transistor, and defining a second NMOS region for formation of a second NMOS transistor having a higher operating voltage than the first NMOS transistor and a second PMOS region for formation of a second PMOS transistor having a higher operating voltage than the first PMOS transistor; (b) forming a first gate insulating film in the first NMOS region and the first PMOS region, and forming a second gate insulating film thicker than the first gate insulating film in the second NMOS region and the second PMOS region; (c) forming a P-type impurity layer of a relatively low concentration in the surface of the semiconductor substrate in the second PMOS region; (d) forming a non-single-crystal silicon film containing an N-type impurity at a relatively high concentration on the first and second gate insulating films; (e) introducing a P-type impurity at a relatively high concentration only into the non-single-crystal silicon film in the first PMOS region; and (d) patterning the non-single-crystal silicon film to form gate electrodes respectively in the first NMOS region, the first PMOS region, the second NMOS region, and the second PMOS region.

According to a sixth aspect of the present invention, a semiconductor device manufacturing method comprises the steps of: (a) defining a first NMOS region and a first PMOS region in a surface of a semiconductor substrate respectively for formation of a first NMOS transistor and a first PMOS transistor, and defining a second NMOS region for formation of a second NMOS transistor having a higher operating voltage than the first NMOS transistor and a second PMOS region for formation of a second PMOS transistor having a higher operating voltage than the first PMOS transistor; (b) forming a first gate insulating film in the first NMOS region and the first PMOS region, and forming a second gate insulating film thicker than the first gate insulating film in the second NMOS region and the second PMOS region; (c) forming a P-type impurity layer of a relatively low concentration in the surface of the semiconductor substrate in the second PMOS region; (d) forming a non-single-crystal silicon film containing no impurity on the first and second gate insulating films; (e) introducing an N-type impurity at a relatively high first concentration only into the non-single-crystal silicon film in the first NMOS region, the second NMOS region, and the second PMOS region; and (f) forming gate electrodes by using the non-single-crystal silicon film respectively in the first NMOS region, the first PMOS region, the second NMOS region, and the second PMOS region, and introducing a P-type impurity at a relatively high second concentration into the gate electrode formed in the first PMOS region.

Preferably, according to a seventh aspect, in the semiconductor device manufacturing method, the step (f) comprises a step of, after patterning the non-single-crystal silicon film, and during formation of source/drain layers of the first PMOS transistor, introducing the P-type impurity at the second concentration into the gate electrode formed in the first PMOS region.

Preferably, according to an eighth aspect, in the semiconductor device manufacturing method, the step (f) comprises a step of patterning the non-single-crystal silicon film after introducing the P-type impurity at the second concentration into the non-single-crystal silicon film in the first PMOS region.

Preferably, according to a ninth aspect, in the semiconductor device manufacturing method, the first concentration is equal to or higher than the second concentration.

Preferably, according to a tenth aspect, in the semiconductor device manufacturing method, the step (e) comprises a step of introducing nitrogen into the non-single-crystal silicon film in the first NMOS region, the second NMOS region, and the second PMOS region.

Preferably, according to an eleventh aspect, the semiconductor device manufacturing method further comprises a step (g) of, after patterning the non-single-crystal silicon film, forming by impurity ion implantation pairs of extension layers outside of sides of the gate electrodes, in the surface of the semiconductor substrate, wherein the step (g) comprises a step of simultaneously ion-implanting a P-type impurity by using, as implant masks, the gate electrodes respectively formed in the first and second PMOS regions, so as to form a pair of P-type extension layers in each of the first and second PMOS regions.

Preferably, according to a twelfth aspect, the semiconductor device manufacturing method further comprises a step (g) of, after patterning the non-single-crystal silicon film, forming by impurity ion implantation pairs of extension layers outside of sides of the gate electrodes, in the surface of the semiconductor substrate, wherein the step (g) comprises a step of forming a pair of P-type extension layers only in the surface of the semiconductor substrate in the first PMOS region by using the gate electrode formed in the first PMOS region as an implant mask.

According to the semiconductor device of the first aspect of the present invention, only the second PMOS transistor is a buried-channel type MOS transistor. Electric field applied to the channel is thus reduced and the carrier mobility is enhanced to improve the drain current. Also, while the first NMOS transistor and the first PMOS transistor, which operate at low operating voltage and subjected to low electric field around the channel, are surface-channel type MOS transistors, they are less susceptible to reduction of reliability under hot-carrier stress and reduction of reliability under bias-temperature stress. Furthermore, the buried-channel structure, which is difficult to downsize, is applied only to the second PMOS transistor, which fact facilitates reduction of dimensions of the semiconductor device.

According to the semiconductor device of the second aspect, the presence of the P-type impurity layer provided right under the gate insulating film in the second PMOS transistor causes the channel to form in the inside of the semiconductor substrate, so that the second PMOS transistor can certainly be the buried-channel type.

According to the semiconductor device of the third aspect, the pair of P-type source/drain layers include a pair of P-type extension layers. This suppresses short-channel effect.

According to the semiconductor device of the fourth aspect, the gate electrode of the second PMOS transistor relatively heavily contains N-type impurity. This reduces the electric resistance of the gate electrode.

According to the semiconductor device manufacturing method of the fifth aspect of the present invention, the introduction of impurities for the gate electrodes is performed in the steps (d) and (e) prior to the formation of the gate electrodes; it can thus be performed independently of the introduction of impurities for formation of the source/drain layers, making it easier to control the doses of the impurities introduced. This method is effective when the gate electrodes are composed of a multi-layered film of, e.g. non-single-crystal silicon and a metal film or silicide film, since in this case the introduction of impurities for the gate electrodes cannot be performed at the same time as the introduction of impurities for formation of the source/drain layers.

According to the semiconductor device manufacturing method of the sixth aspect, the introduction of impurities for gate electrodes at least in the first NMOS transistor, the second NMOS transistor and the second PMOS transistor is performed in the step (e) prior to the formation of gate electrodes; it can thus be performed independently of the introduction of impurities for formation of the source/drain layers, making it easier to control the doses of the impurities introduced.

According to the semiconductor device manufacturing method of the seventh aspect, the introduction of impurity into the gate electrode of the first PMOS transistor is performed during formation of the source/drain layers. This simplifies the manufacturing process.

According to the semiconductor device manufacturing method of the eighth aspect, the introduction of impurity for the gate electrode of the first PMOS transistor, too, is performed before formation of the gate electrodes; it can thus be done independently of the introduction of impurities for formation of the source/drain layers so that the doses of the impurities introduced can be controlled easily.

According to the semiconductor device manufacturing method of the ninth aspect, the first concentration, or the concentration of impurity contained in the gates, is equal to or higher than the second concentration, namely the concentration of impurity contained in the source/drain layers. The threshold voltage can thus be controlled.

According to the semiconductor device manufacturing method of the tenth aspect, nitrogen, as well as N-type impurity, is introduced into the non-single-crystal silicon film in the first NMOS region, second NMOS region, and second PMOS region. This prevents diffusion of P-type impurity introduced during formation of the source/drain layers so that the gate electrode can remain N type.

According to the semiconductor device manufacturing method of the eleventh aspect, P-type impurity is ion-implanted simultaneously by using the gate electrodes formed in the first and second PMOS regions as implant masks, so as to form respective pairs of P-type extension layers. This reduces the process for formation of the extension layers.

According to the semiconductor device manufacturing method of the twelfth aspect, a pair of P-type extension layers are formed only in the surface of the semiconductor substrate in the first PMOS region by using the gate electrode formed in the first PMOS region as an implant mask. This reduces the process for formation of the extension layers.

The present invention has been made to solve the problems described earlier, and an object of the present invention is to provide CMOS transistors and a manufacturing method thereof which can satisfy demands for size reduction and demands for reliability.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 1 to 9 are sectional views showing a semiconductor device manufacturing method according to a first preferred embodiment of the present invention;

FIGS. 22 to 26 are sectional views showing a semiconductor device manufacturing method according to a fourth preferred embodiment of the present invention;

FIGS. 30 to 51 are sectional views showing conventional semiconductor device manufacturing methods.

DESCRIPTION OF THE PREFERRED EMBODIMENTS

A. First Preferred Embodiment

A-1. Manufacturing Method

Figure 7:
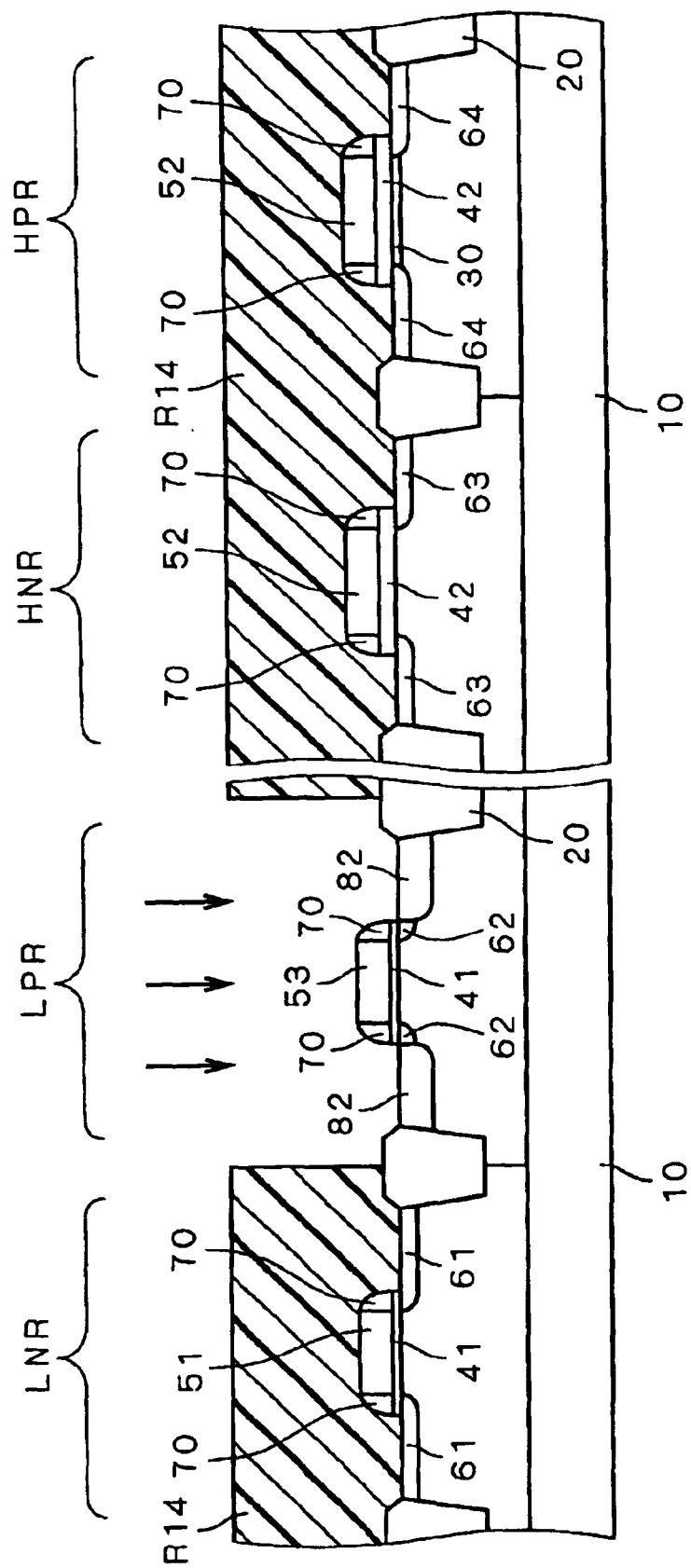
Figure 8:
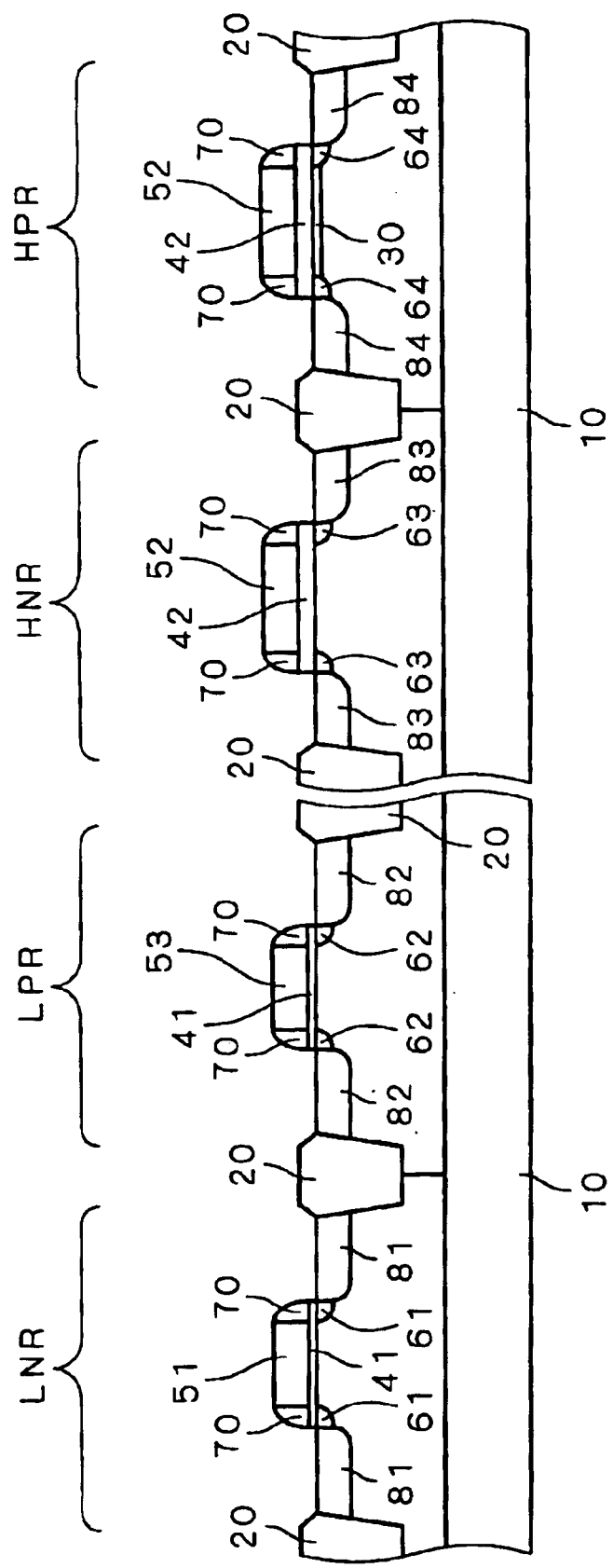
Figure 9:
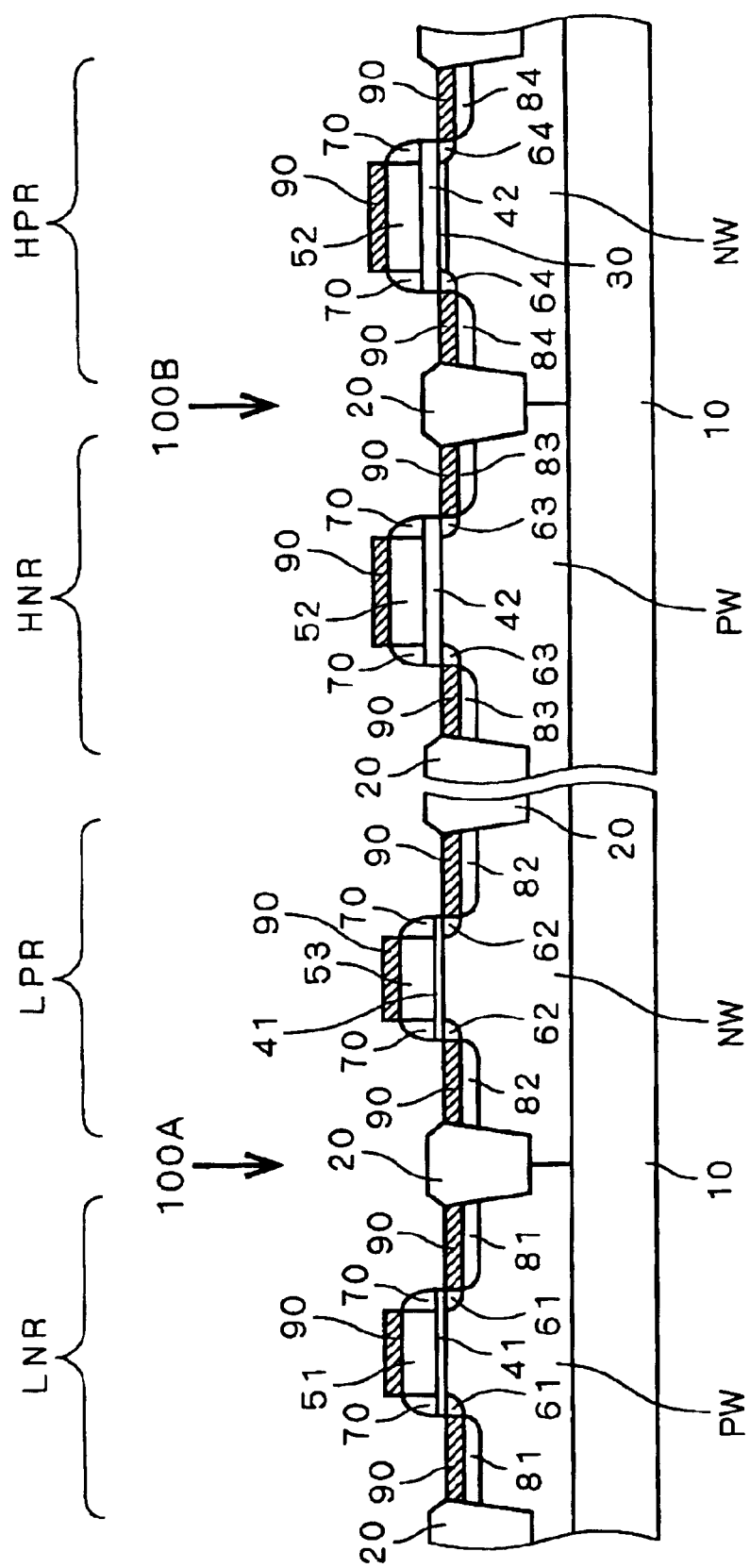

Referring to FIGS. 1 to 9, a method for manufacturing a semiconductor device having a CMOS transistor 100A and a CMOS transistor 100B is described as a semiconductor device manufacturing method according to a first preferred embodiment of the present invention. The structure of the CMOS transistor 100A designed for low voltage and that of the CMOS transistor 100B designed for high voltage are shown in FIG. 9 which illustrates the final process step.

Figure 1:
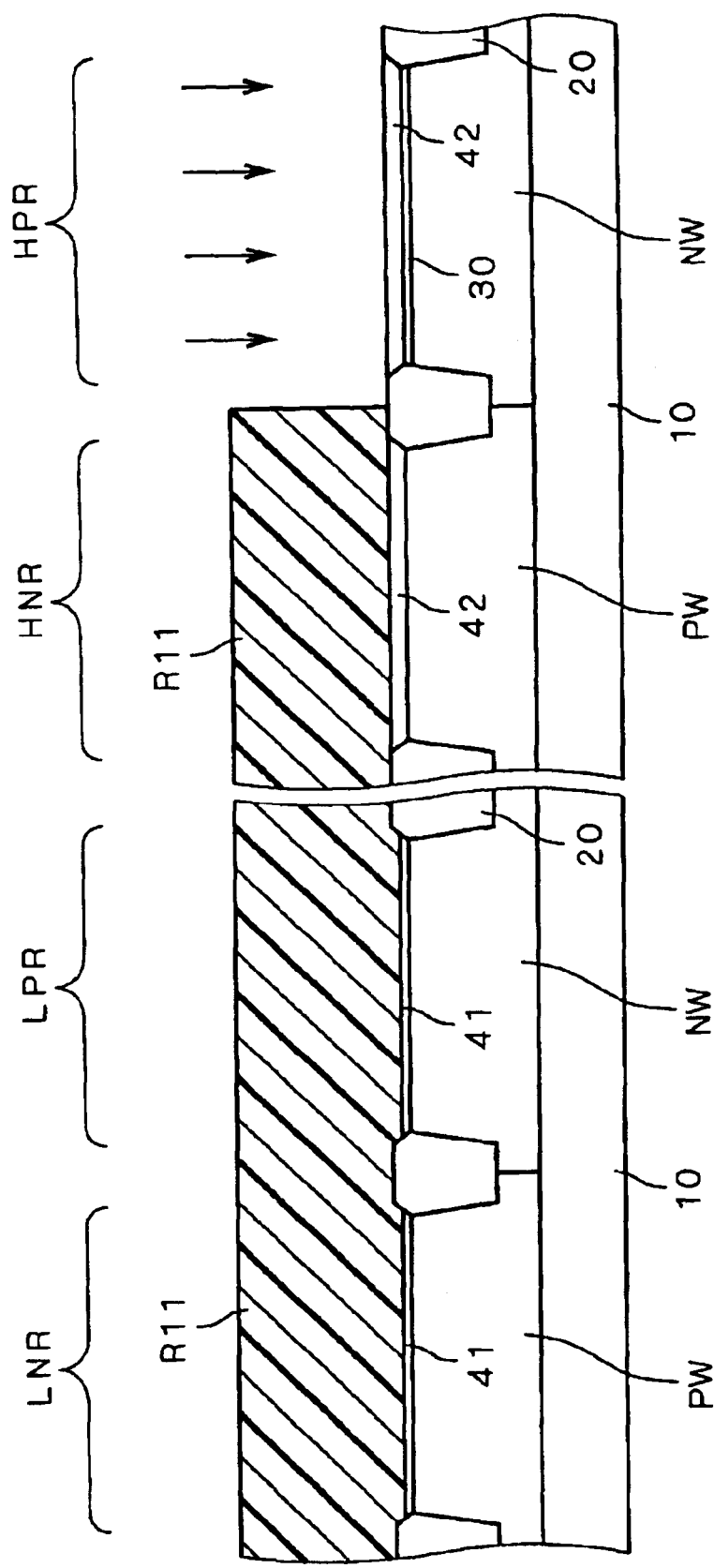

First, as shown in FIG. 1, element isolation insulating film 20 is selectively formed in the surface of the silicon substrate 10 to define a low-voltage NMOS region LNR and a low-voltage PMOS region LPR for formation of a low-voltage NMOS transistor and a low-voltage PMOS transistor, and a high-voltage NMOS region HNR and a high-voltage PMOS region HPR for formation of a high-voltage NMOS transistor and a high-voltage PMOS transistor.

Then P well regions PW containing a P-type impurity are formed in the surface of the silicon substrate 10 in the low-voltage NMOS region LNR and the high-voltage NMOS region HNR, and N well regions NW containing an N-type impurity are formed in the surface of the silicon substrate 10 in the low-voltage PMOS region LPR and the high-voltage PMOS region HPR. In the description below, the P well regions PW and the N well regions NW may be simply called a silicon substrate together.

A gate insulating film 41, e.g. an insulating film of silicon oxide, is then formed all over the low-voltage NMOS region LNR and the low-voltage PMOS region LPR on the silicon substrate 10. A gate insulating film 42, e.g. an insulating film of silicon oxide, is formed all over the high-voltage NMOS region HNR and the high-voltage PMOS region HPR on the silicon substrate 10.

The gate insulating film 41 is formed to a thickness of about 0.5 to 3 nm in terms of silicon oxide film thickness, and the gate insulating film 42 is formed to a thickness of about 3 to 10 nm in terms of silicon oxide film thickness.

A P-type impurity is then introduced by ion implantation to a relatively low concentration (P−) into the surface of the silicon substrate 10 in the high-voltage PMOS region HPR where a buried-channel type MOS transistor is formed later, thus forming a low-concentration impurity layer 30. FIG. 1 shows the process step in which the P-type impurity is ion-implanted into the high-voltage PMOS region HPR, with the part except the high-voltage PMOS region HPR covered by a resist mask R11 patterned by photolithography. The low-concentration impurity layer 30 is formed by ion-implanting boron (B) or boron difluoride ($BF_2$).

Figure 2:
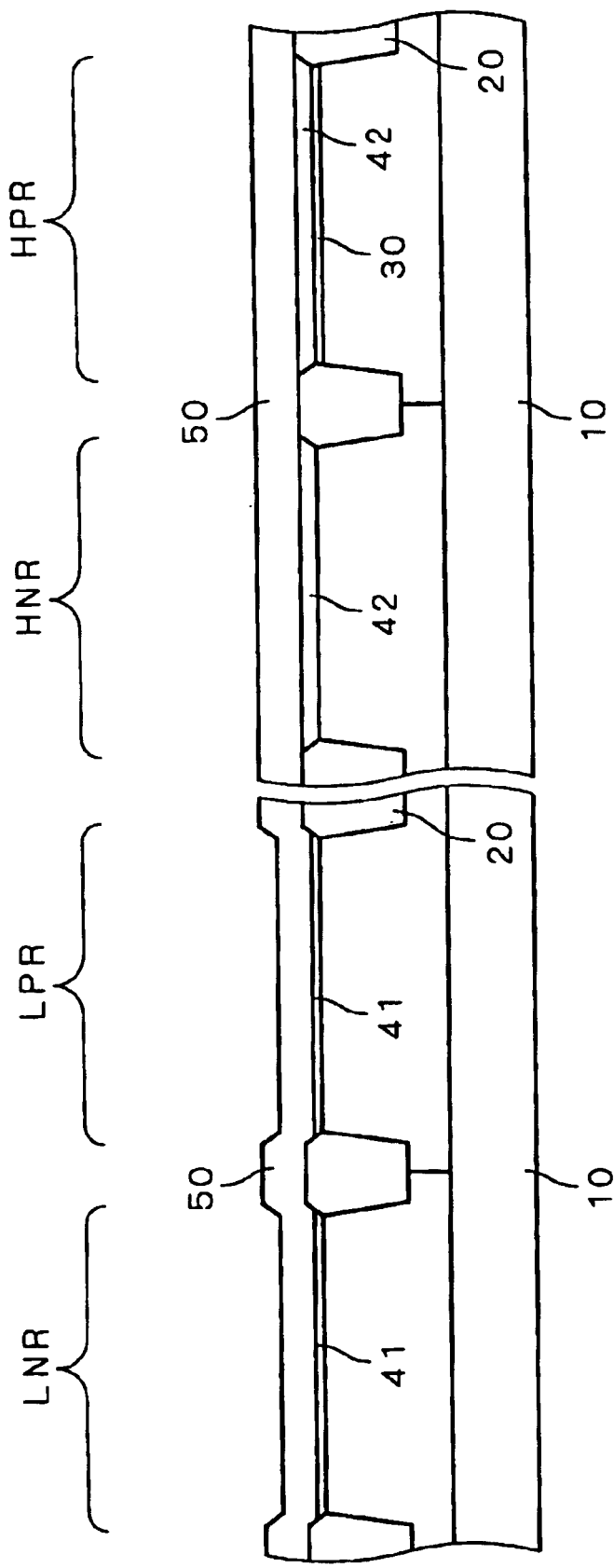

Next, in the process shown in FIG. 2, a non-single-crystal silicon film 50 having a thickness of 50 to 300 nm is formed by CVD all over the surface of the silicon substrate 10. This non-single-crystal silicon film 50 is formed of polysilicon or amorphous silicon and contains an N-type impurity, e.g. P (phosphorus), at a concentration of $5 \times 10^{20}$ to $1 \times 10^{22}/cm^3$.

Figure 3:
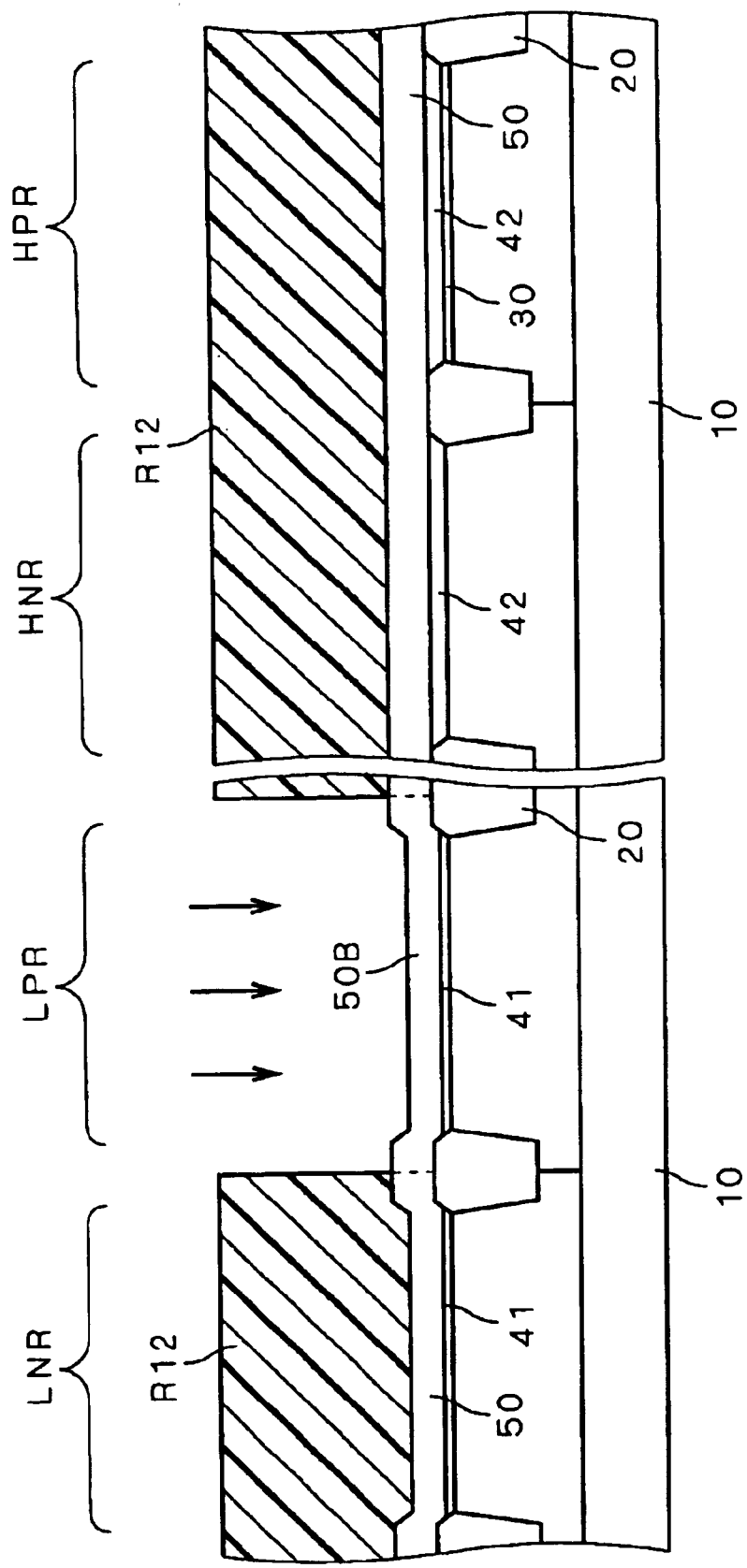

Next, in the process shown in FIG. 3, a resist mask R12 is patterned by photolithography to cover the part except the low-voltage PMOS region LPR, and a P-type impurity, e.g. B or $BF_2$, is ion-implanted into the non-single-crystal silicon film 50 on the low-voltage PMOS region LPR, so as to form a P-type non-single-crystal silicon film 50B. As for conditions of this ion implantation, when B is used, it is performed with an implant energy of 1 keV to 10 keV and a dose of $1 \times 10^{15}$ to $1 \times 10^6/cm^2$, or when $BF_2$ is used, it is performed with an implant energy of 5 keV to 50 keV and a dose of $1 \times 10^{15}$ to $1 \times 10^{16}/cm^2$; the concentration is set so that the effect of the N-type impurity contained in the non-single-crystal silicon film 50 can be cancelled.

After removal of the resist mask R12, as shown in FIG. 4, the non-single-crystal silicon film 50 and the non-single-crystal silicon film 50B are patterned by photolithography to form a gate electrode 51 in the low-voltage NMOS region LNR, a gate electrode 53 in the low-voltage PMOS region LPR, and gate electrodes 52 in the high-voltage NMOS region HNR and the high-voltage PMOS region HPR.

Next, as shown in FIG. 4, a resist mask R13 is patterned by photolithography to cover the part except the low-voltage PMOS region LPR, and a P-type impurity, e.g. B or $BF_2$, is introduced by ion implantation to a relatively low concentration (P−) into the surface of the silicon substrate 10 in the low-voltage PMOS region LPR by using the gate electrode 53 as an implant mask, so as to form a pair of extension layers 62. In this ion implantation, B is implanted with an implant energy of 0.1 keV to 3 keV and a dose of $5 \times 10^{13}$ to $1 \times 10^{15}/cm^2$, or $BF_2$ is implanted with an implant energy of 1 keV to 10 keV and a dose of $5 \times 10^{13}$ to $1 \times 10^{15}/cm^2$.

The pair of extension layers 62 are provided in such a manner that they face each other through the region of the silicon substrate 10 located underneath the gate electrode 53. The region of the silicon substrate 10 located underneath the gate electrode 53 serves as the channel region.

The extension layers are components which are effective to suppress short-channel effect, which are impurity layers formed with a shallower junction than main source/drain layers formed later; while they should be called source/drain extension layers since they have the same conductivity type as the main source/drain layers and function as source/drain layers, they are called extension layers for convenience. Extension layers are formed also in other regions by similar process.

FIG. 5 shows the structure obtained after the formation of extension layers in the individual regions, where pairs of extension layers 61 and 63 are formed in the surface of the silicon substrate 10 respectively in the low-voltage NMOS region LNR and the high-voltage NMOS region HNR, by introducing an N-type impurity, e.g. arsenic (As), to a relatively low concentration (with an implant energy of 0.2 keV to 10 keV and a dose of $1 \times 10^{14}$ to $2 \times 10^{15}/cm^2$), and a pair of extension layers 64 are formed in the surface of the silicon substrate 10 in the high-voltage PMOS region HPR, by introducing a P-type impurity, e.g. B or $BF_2$, to a relatively low concentration (P−) by ion implantation. In this ion implantation, B is implanted with an implant energy of 0.1 keV to 3 keV and a dose of $5 \times 10^{13}$ to $1 \times 10^{15}/cm^2$, or $BF_2$ is implanted with an implant energy of 1 keV to 10 keV and a dose of $5 \times 10^{13}$ to $1 \times 10^{15}/cm^2$.

The pair of extension layers 64 are formed in such a manner that the low-concentration impurity layer 30 is interposed between them.

FIG. 5 shows a process for forming side wall protection film (side wall insulating film) to protect the side walls of the gate electrodes 51, 52 and 53, where an insulating film OX1, such as a silicon oxide film, is formed all over the surface of the silicon substrate 10.

Figure 6:
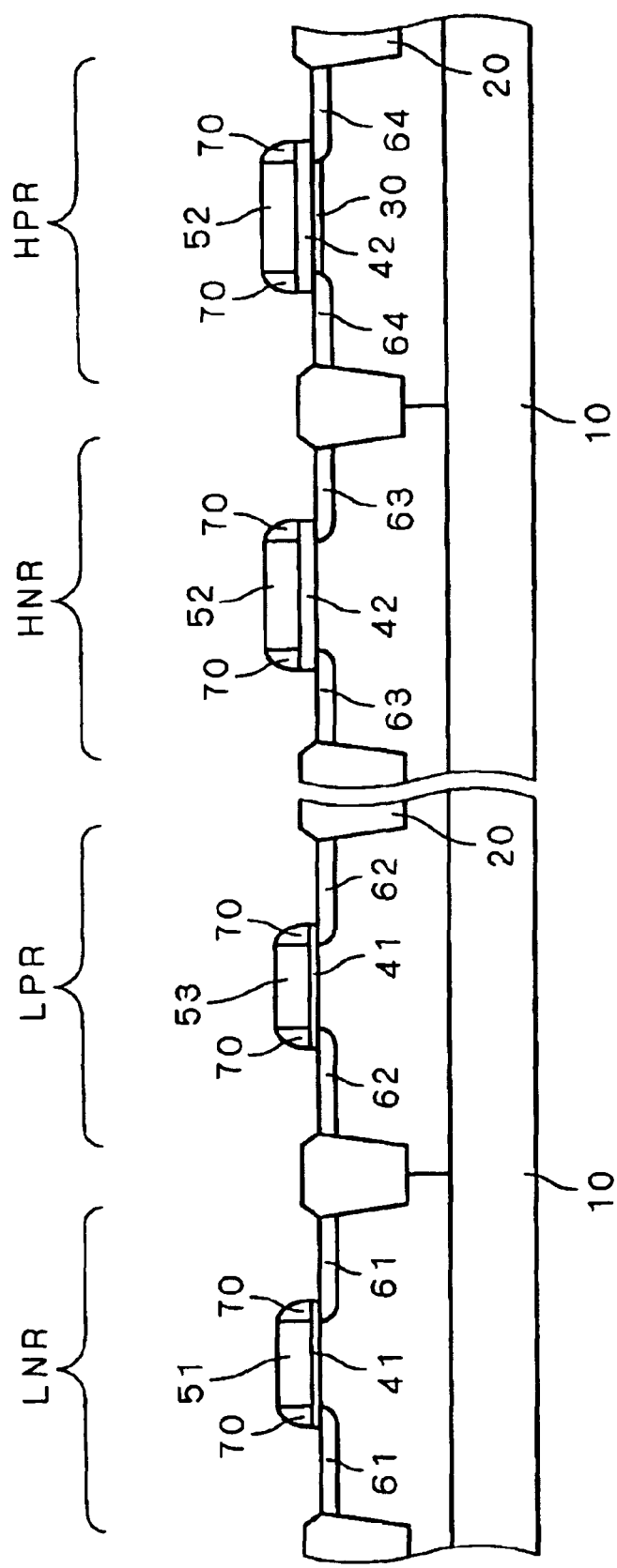

Subsequently, in the process shown in FIG. 6, the parts of the insulating film OX1 located on top of the gate electrodes 51, 52 and 53 and on the silicon substrate 10 are removed by anisotropic etching, leaving the insulating film OX1 only on the side walls of the gate electrodes 51, 52 and 53, so as to form side wall protecting films 70. In this process, the gate insulating film 41 is also removed in the parts where it is not covered by the gate electrodes 51 and 53 and the side wall protecting films 70, and the gate insulating film 42 is also removed in the parts where it is not covered by the gate electrodes 52 and the side wall protecting films 70.

Next, in the process shown in FIG. 7, a resist mask R14 is patterned by photolithography to cover the part except the low-voltage PMOS region LPR, and a P-type impurity, e.g. B or $BF_2$, is ion-implanted in the low-voltage PMOS region LPR by using the gate electrode 53 and the side wall protecting films 70 as an implant mask, so as to form a pair of source/drain layers 82 in the surface of the silicon substrate 10.

In this ion implantation, B is implanted with an implant energy of 1 keV to 10 keV and a dose of $1 \times 10^{15}$ to $1 \times 10^{16}/cm^2$, or $BF_2$ is implanted with an implant energy of 5 keV to 50 keV and a dose of $1 \times 10^{15}$ to $1 \times 10^{16}/cm^2$.

Source/drain layers are similarly formed also in other regions. After the formation of source/drain layers, damages caused by the ion implantation can be repaired by applying a thermal process.

FIG. 8 shows the structure in which source/drain layers are formed in the individual regions, where pairs of source/ drain layers 81 and 83 are formed in the surface of the silicon substrate 10 respectively in the low-voltage NMOS region LNR and the high-voltage NMOS region HNR, by introducing an N-type impurity, e.g. As, to a relatively high concentration (with an implant energy of 10 keV to 80 keV and a dose of $1\times10^{15}$ to $6\times10^{15}/cm^2$), and a pair of source/drain layers 84 are formed in the surface of the silicon substrate 10 in the high-voltage PMOS region HPR by introducing a P-type impurity, e.g. B or $BF_2$, to a relatively low concentration.

In this ion implantation, B is implanted with an implant energy of 1 keV to 10 keV and a dose of $1\times10^{15}$ to $1\times10^{16}/cm^2$, or $BF_2$ is implanted with an implant energy of 5 keV to 50 keV and a dose of $1\times10^{15}$ to $1\times10^{16}/cm^2$.

Next, in the process shown in FIG. 9, a film of refractory metal, e.g. cobalt (Co), is formed by sputtering to cover the entire surface of the silicon substrate 10 and a high-temperature treatment at 350 to 600° C. is applied to form silicide film in the parts where the refractory metal film is in contact with the exposed surface of the silicon substrate 10 and the exposed surfaces of the gate electrodes 51, 52 and 53. The refractory metal film remaining unsilicidized is then removed and a further thermal treatment is applied to form cobalt silicide films ($CoSi_2$) 90; the low-voltage CMOS transistor 100A and the high-voltage CMOS transistor 100B are thus obtained.

A-2. Device Structure

In FIG. 9, a buried-channel type PMOS transistor is provided only in the CMOS transistor 100B designed for high voltage; surface-channel type NMOS transistors are formed in the low-voltage NMOS region LNR and the high-voltage NMOS region HNR and a surface-channel type PMOS transistor is formed in the low-voltage PMOS region LPR.

A-3. Functions and Effects

The buried-channel type structure alleviates electric field applied to the channel and enhances the carrier mobility. Accordingly, since the PMOS transistor in the high-voltage CMOS transistor 100B is the buried-channel type, it provides improved drain current as compared with the surface-channel type.

The transistors other than the high-voltage PMOS transistor are surface-channel type, so that they may suffer reduction of reliability under hot-carrier stress or reduction of reliability under bias-temperature stress (NBTI); however, the reliability reduction is not very likely to occur since the electric field is weak in the low-voltage CMOS transistors.

Furthermore, the fact that only the high-voltage PMOS transistor is the buried-channel type facilitates size reduction of the semiconductor device.

Moreover, the gate electrode of the high-voltage PMOS transistor contains N-type impurity at high concentration, which reduces the electric resistance of the gate electrode.

Furthermore, as described referring to FIGS. 2 and 3, impurities are introduced into the gate electrodes of all MOS transistors before formation of the gate electrodes. The impurities can thus be introduced into the gate electrodes separately from the introduction of impurities for formation of the source/drain layers, so that the doses of impurities can be controlled easily. When the gate electrodes are formed of a multi-layered film of non-single-crystal silicon and a metal film or a silicide film, the impurities cannot be introduced at the same time as the introduction of impurities for formation of the source/drain layers, so the manufacturing method of this preferred embodiment is effective.

B. Second Preferred Embodiment

B-1. Manufacturing Method

Figure 11:
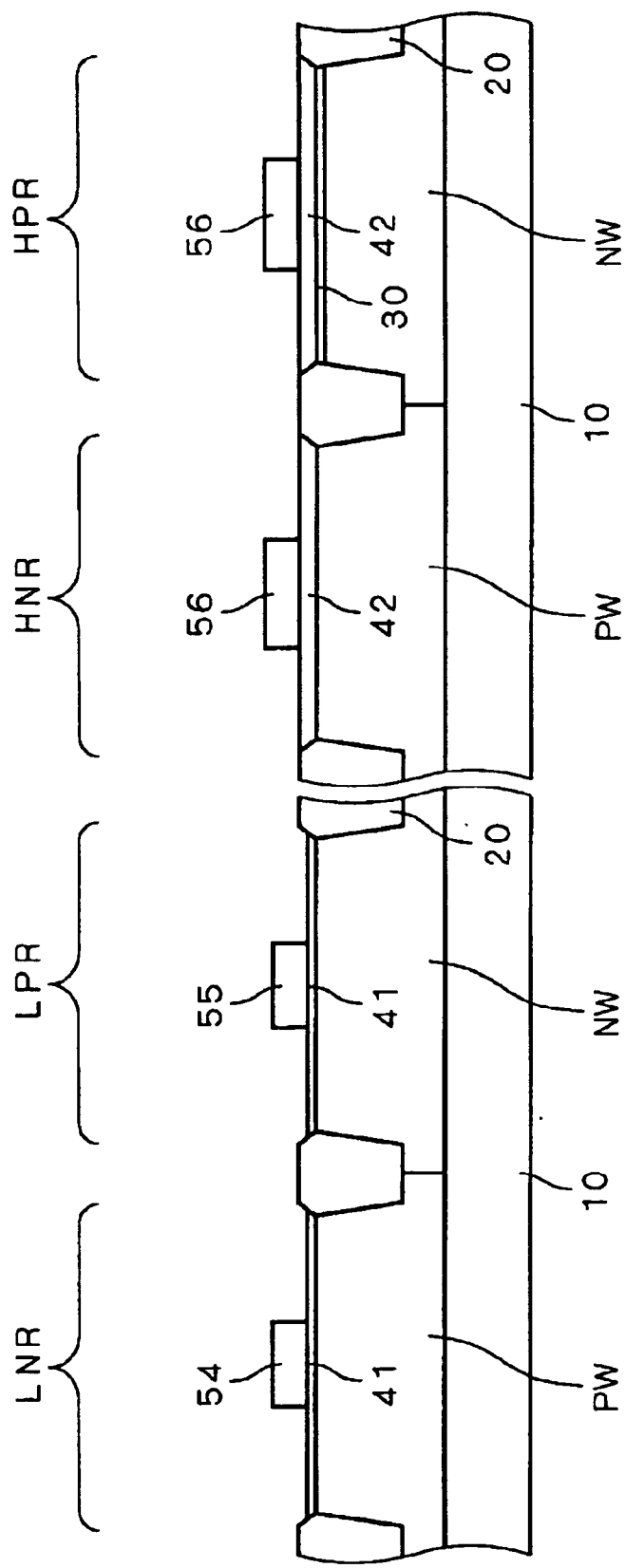
Figure 12:
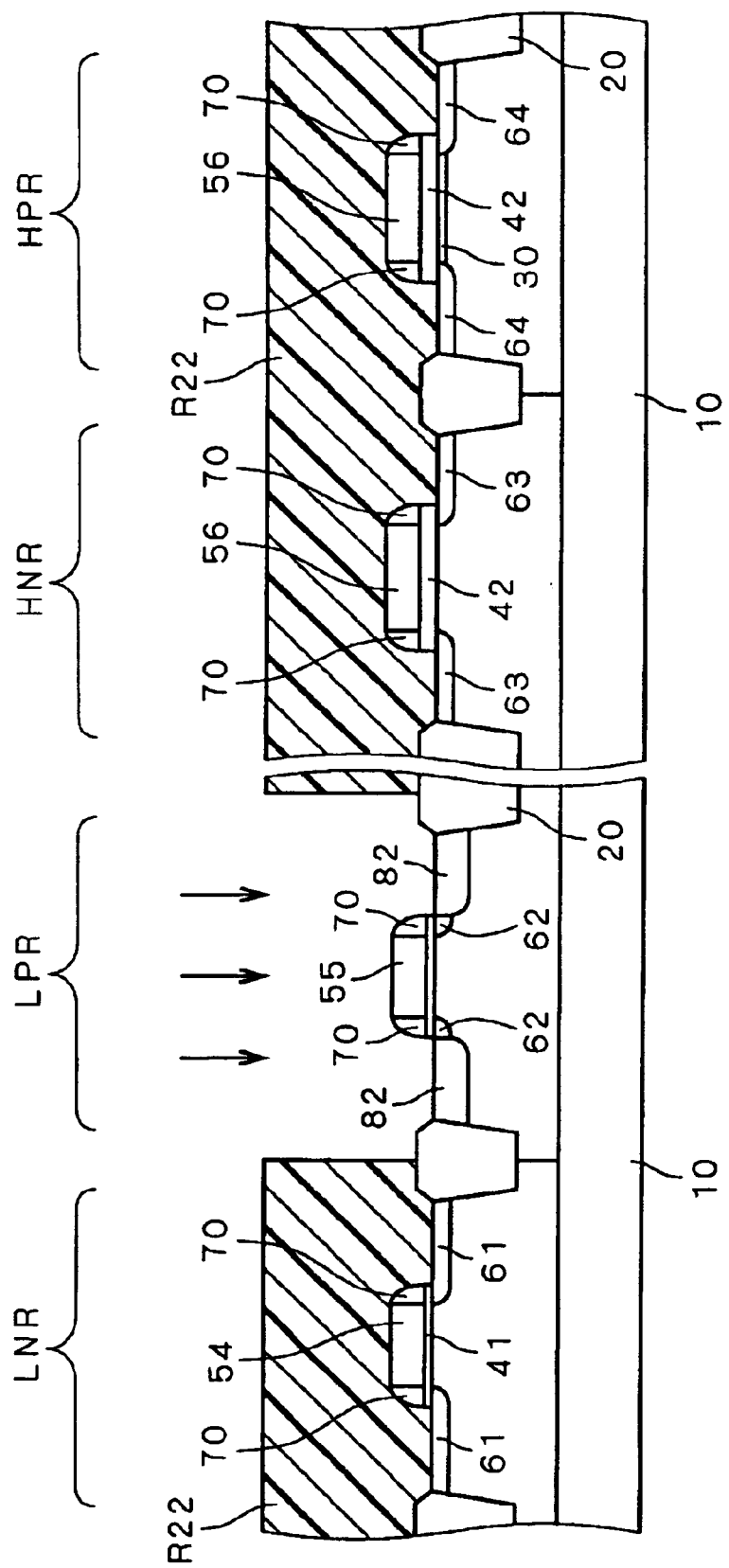
Figure 13:
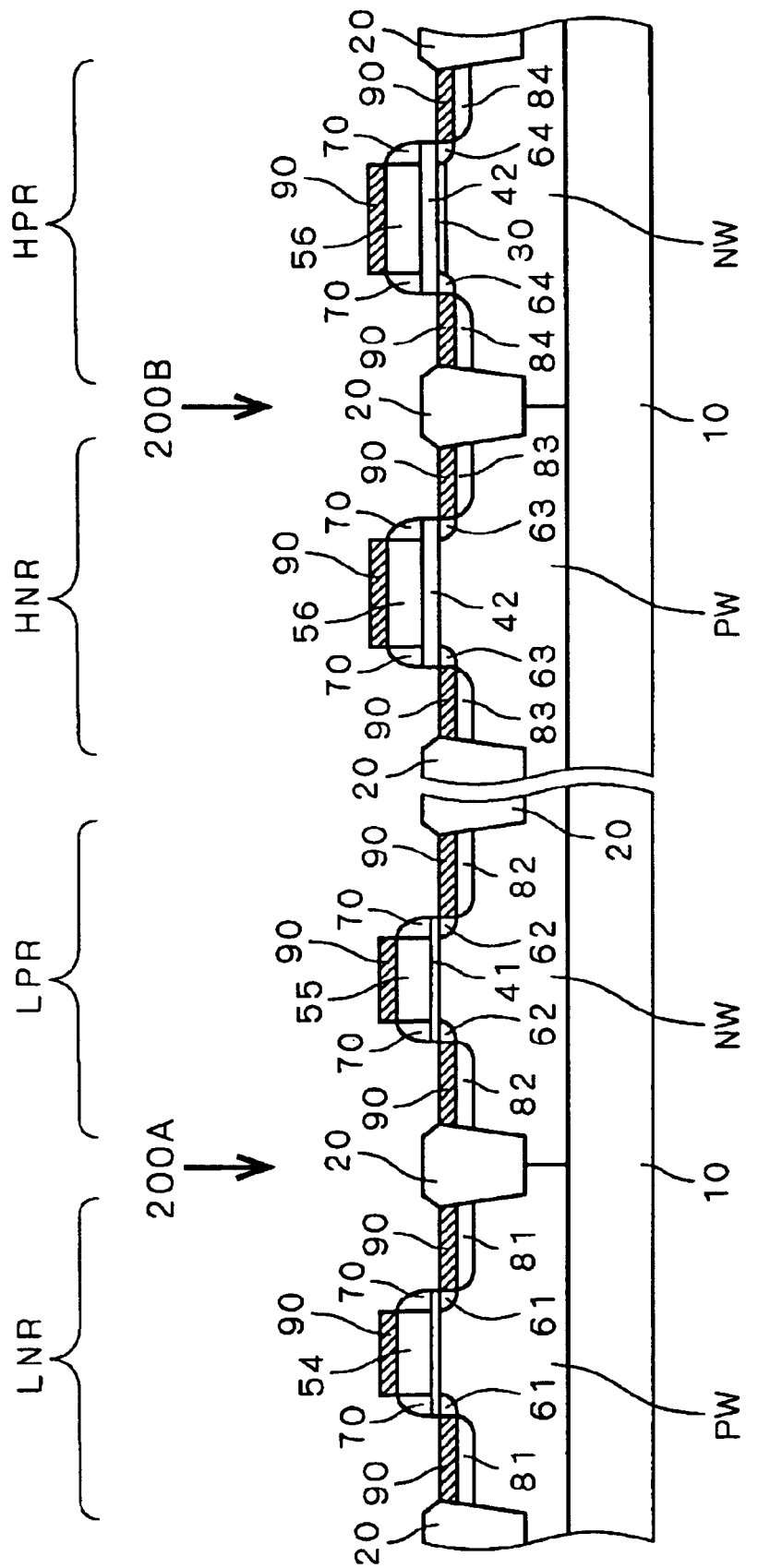

Referring to FIGS. 10 to 13, a method for manufacturing a semiconductor device having a CMOS transistor 200A and a CMOS transistor 200B is described as a semiconductor device manufacturing method according to a second preferred embodiment of the present invention. The structure of the CMOS transistor 200A designed for low voltage and that of the CMOS transistor 200B designed for high voltage are shown in FIG. 13 which illustrates the final process step. The same components as those shown in the method for manufacturing the CMOS transistor 100A for low voltage and the CMOS transistor 100B for high voltage described referring to FIGS. 1 to 9 are shown at the same reference characters and not described here again.

Figure 10:
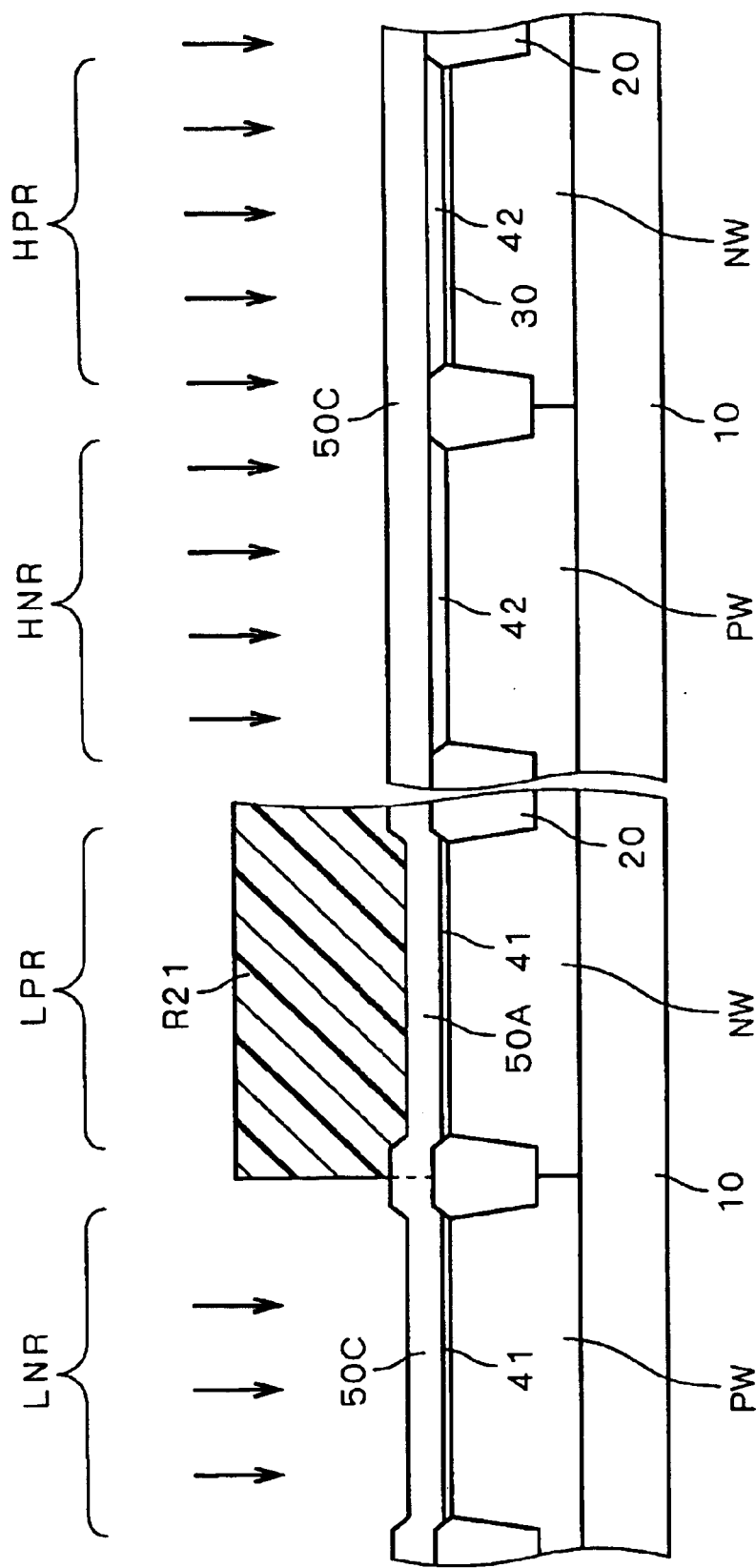
FIGS. 10 to 13 are sectional views showing a semiconductor device manufacturing method according to a second preferred embodiment of the present invention.

First, as shown in FIG. 10, through the process steps described referring to FIGS. 1 and 2, a gate insulating film 41 is formed all over the low-voltage NMOS region LNR and the low-voltage PMOS region LPR on the silicon substrate 10 and a gate insulating film 42 is formed all over the high-voltage NMOS region HNR and the high-voltage PMOS region HPR, and a low-concentration impurity layer 30 is formed in the surface of the silicon substrate 10 in the high-voltage PMOS region HPR.

Then a non-single-crystal silicon film 50A is formed by CVD on the gate insulating films 41 and 42. This non-single-crystal silicon film 50A does not contain impurity.

Next, in the process shown in FIG. 10, a resist mask R21 is patterned by photolithography to cover only the low-voltage PMOS region LPR, and an N-type impurity, e.g. phosphorus (P), is ion-implanted into the low-voltage NMOS region LNR, the high-voltage NMOS region HNR, and the high-voltage PMOS region HPR, so as to form an N-type non-single-crystal silicon film 50C. This ion implantation is performed with an implant energy of 5 keV to 30 keV and a dose of $4\times10^{15}$ to $1\times10^{16}/cm^2$.

After removal of the resist mask R21, as shown in FIG. 11, the non-single-crystal silicon film 50A and the non-single-crystal silicon film 50C are patterned by photolithography to form a gate electrode 54 in the low-voltage NMOS region LNR, a gate electrode 55 in the low-voltage PMOS region LPR, and gate electrodes 56 in the high-voltage NMOS region HNR and the high-voltage PMOS region HPR.

Subsequently, through the process steps described referring to FIGS. 4 to 6, extension layers 61 to 64 are formed and side wall protection film (side wall insulating film) 70 is formed to protect the side walls of the gate electrodes 54, 55 and 56.

Next, in the process shown in FIG. 12, a resist mask R22 is patterned by photolithography to cover the part except the low-voltage PMOS region LPR, and a P-type impurity, e.g. B or $BF_2$, is ion-implanted to a relatively high concentration in the low-voltage PMOS region LPR by using the gate electrode 55 and the side wall protecting films 70 as an implant mask, so as to form a pair of source/drain layers 82 in the surface of the silicon substrate 10.

In this ion implantation, B is implanted with an implant energy of 1 keV to 10 keV and a dose of $1\times10^{15}$ to $1\times10^{16}/cm^2$, or $BF_2$ is implanted with an implant energy of 5 keV to 50 keV and a dose of $1\times10^{15}$ to $1\times10^{16}/cm^2$.

In this process, the same P-type impurity as that introduced into the source/drain layers 82 is introduced into the non-doped gate electrode 55, which reduces the difference in work function between the gate electrode 55 and the silicon substrate 10 and lowers the threshold voltage.

Subsequently, source/drain layers 81, 83 and 84 are formed through the process described referring to FIG. 8.

During formation of the source/drain layers 84, P-type impurity is introduced into the gate electrode 56 in the high-voltage PMOS region HPR. However, it is desirable to keep the gate electrode 56 N type in the high-voltage PMOS region HPR. Accordingly, when the dose of the N-type impurity is $4 \times 10^{15}/cm^2$ or more in the step shown in FIG. 10, then the dose of the P-type impurity is set to $4 \times 10^{15}/cm^2$ or less in the formation of the source/drain layers 84. Since P (phosphorus) is easier to activate than B (boron), the type becomes N when the same doses are used.

After the formation of source/drain layers, damages caused by the ion implantation can be repaired by applying a thermal process.

Next, in the process shown in FIG. 13, a film of refractory metal, e.g. cobalt (Co), is formed by sputtering to cover the entire surface of the silicon substrate 10 and a high-temperature treatment at 350 to 600° C. is applied to form silicide film in the parts where the refractory metal film is in contact with the exposed surface of the silicon substrate 10 and the exposed surfaces of the gate electrodes 54, 55 and 56. The refractory metal film remaining unsilicidized is then removed and a further thermal treatment is applied to form cobalt silicide films ($CoSi_2$) 90; the low-voltage CMOS transistor 200A and the high-voltage CMOS transistor 200B are thus obtained.

B-2. Device Structure

In FIG. 13, a buried-channel type PMOS transistor is provided only in the CMOS transistor 200B designed for high voltage; surface-channel type NMOS transistors are formed in the low-voltage NMOS region LNR and the high-voltage NMOS region HNR and a surface-channel type PMOS transistor is formed in the low-voltage PMOS region LPR.

B-3. Functions and Effects

The buried-channel type structure alleviates electric field applied to the channel and enhances the carrier mobility. Accordingly, the PMOS transistor in the high-voltage CMOS transistor 200B, which is the buried-channel type, provides improved drain current as compared with the surface-channel type.

The transistors other than the high-voltage PMOS transistor are surface-channel type, so that they may suffer reduction of reliability under hot-carrier stress or reduction of reliability under bias-temperature stress (NBTI); however, the reliability reduction is not very likely to occur since the electric field is weak in the low-voltage CMOS transistors.

Furthermore, the fact that only the high-voltage PMOS transistor is the buried-channel type facilitates size reduction of the semiconductor device.

Moreover, as described referring to FIG. 10, the introduction of impurities into the gate electrodes of transistors other than the low-voltage PMOS transistor is performed before formation of the gate electrodes; it can thus be performed independently of the introduction of impurities for formation of the source/drain layers, making it easier to control the doses of the impurities introduced.

B-4. Variation

During formation of the N-type non-single-crystal silicon film 50C by impurity implantation as described referring to FIG. 10, nitrogen (N) can be implanted with an implant energy of 3 to 20 keV and a dose of $1 \times 10^{15}$ to $4 \times 10^{15}/cm^2$ for example. This prevents diffusion of the P-type impurity (boron herein) introduced during formation of the source/drain layers 84 so that the gate electrode 56 can remain N type.

Conditions for the nitrogen implantation are set so that the nitrogen layer is formed deeper than the P-type impurity introduced during formation of the source/drain layers 84 and so that it does not reach the gate insulating film; preferably, the nitrogen layer is formed under such conditions that the P-type impurity layers are present near it.

Introduction of nitrogen also improves the reliability and driving capability of the NMOS transistors.

C. Third Preferred Embodiment

C-1. Manufacturing Method

Figure 19:
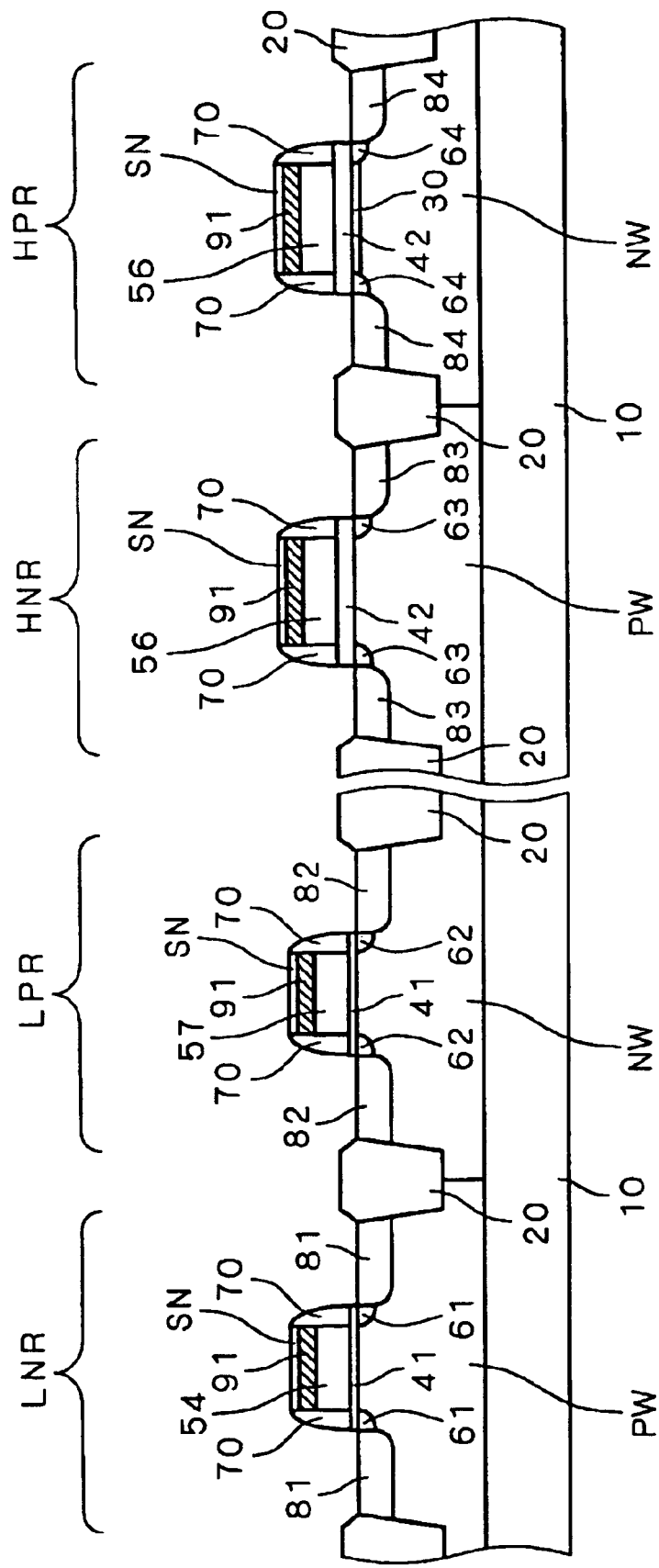
Figure 20:
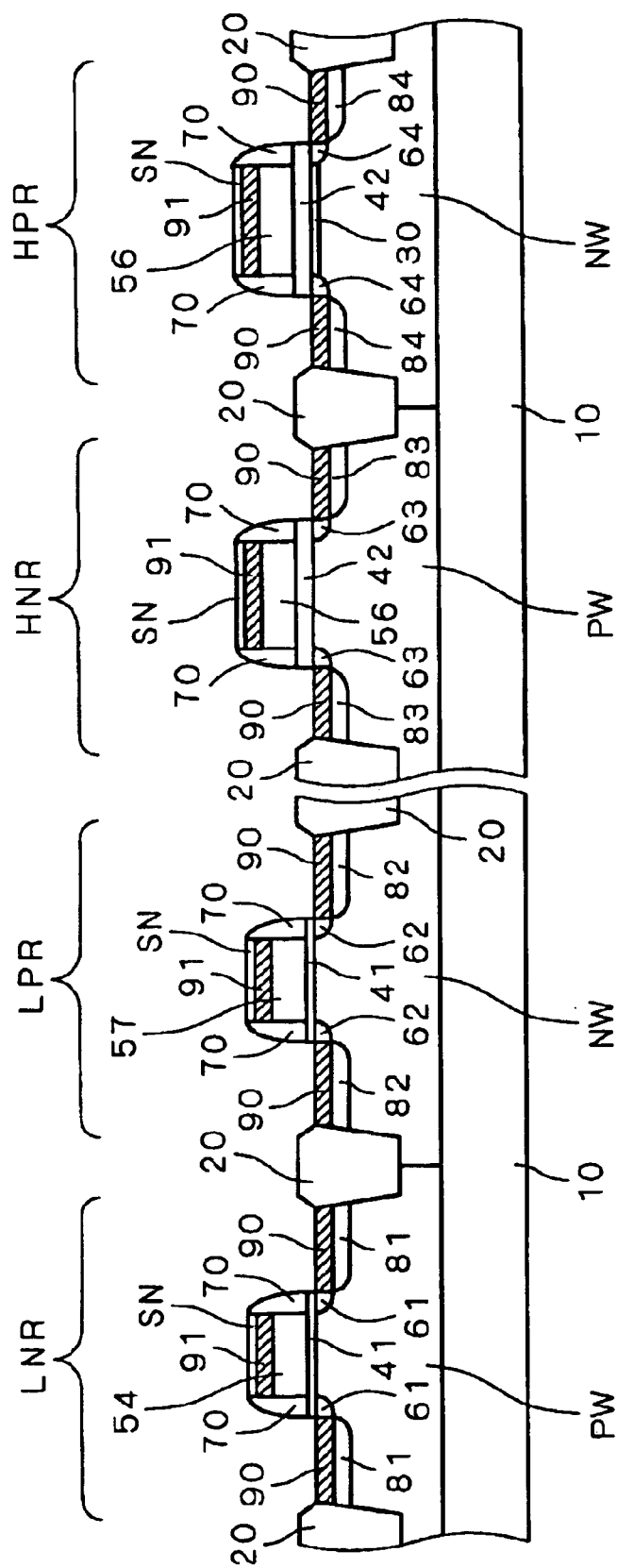
Figure 21:
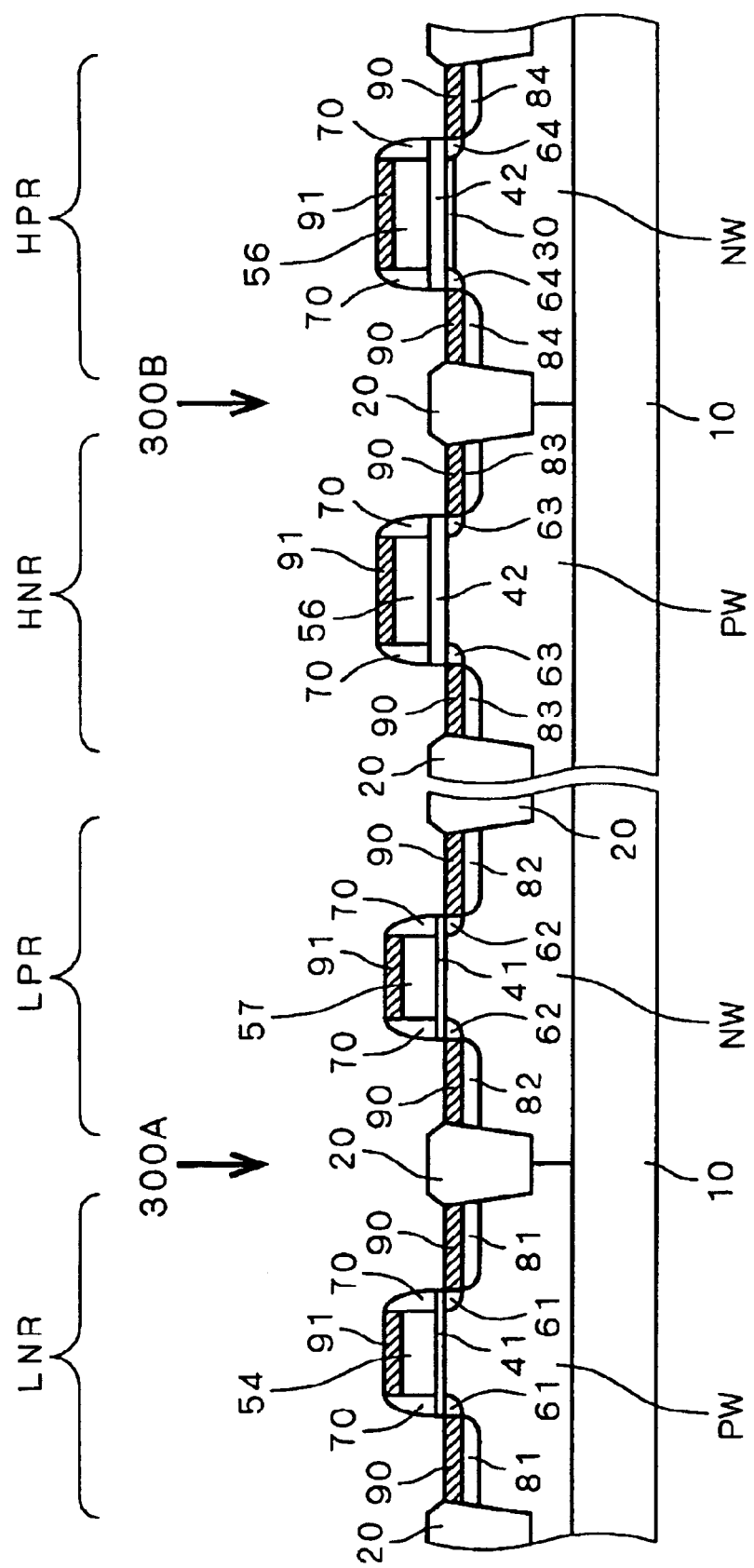

Referring to FIGS. 14 to 21, a method for manufacturing a semiconductor device having a CMOS transistor 300A and a CMOS transistor 300B is described as a semiconductor device manufacturing method according to a third preferred embodiment of the present invention. The structure of the CMOS transistor 300A designed for low voltage and that of the CMOS transistor 300B designed for high voltage are shown in FIG. 21 which illustrates the final process step. The same components as those shown in the method for manufacturing the CMOS transistor 100A for low voltage and the CMOS transistor 100B for high voltage described referring to FIGS. 1 to 9 are shown at the same reference characters and not described here again.

Figure 14:
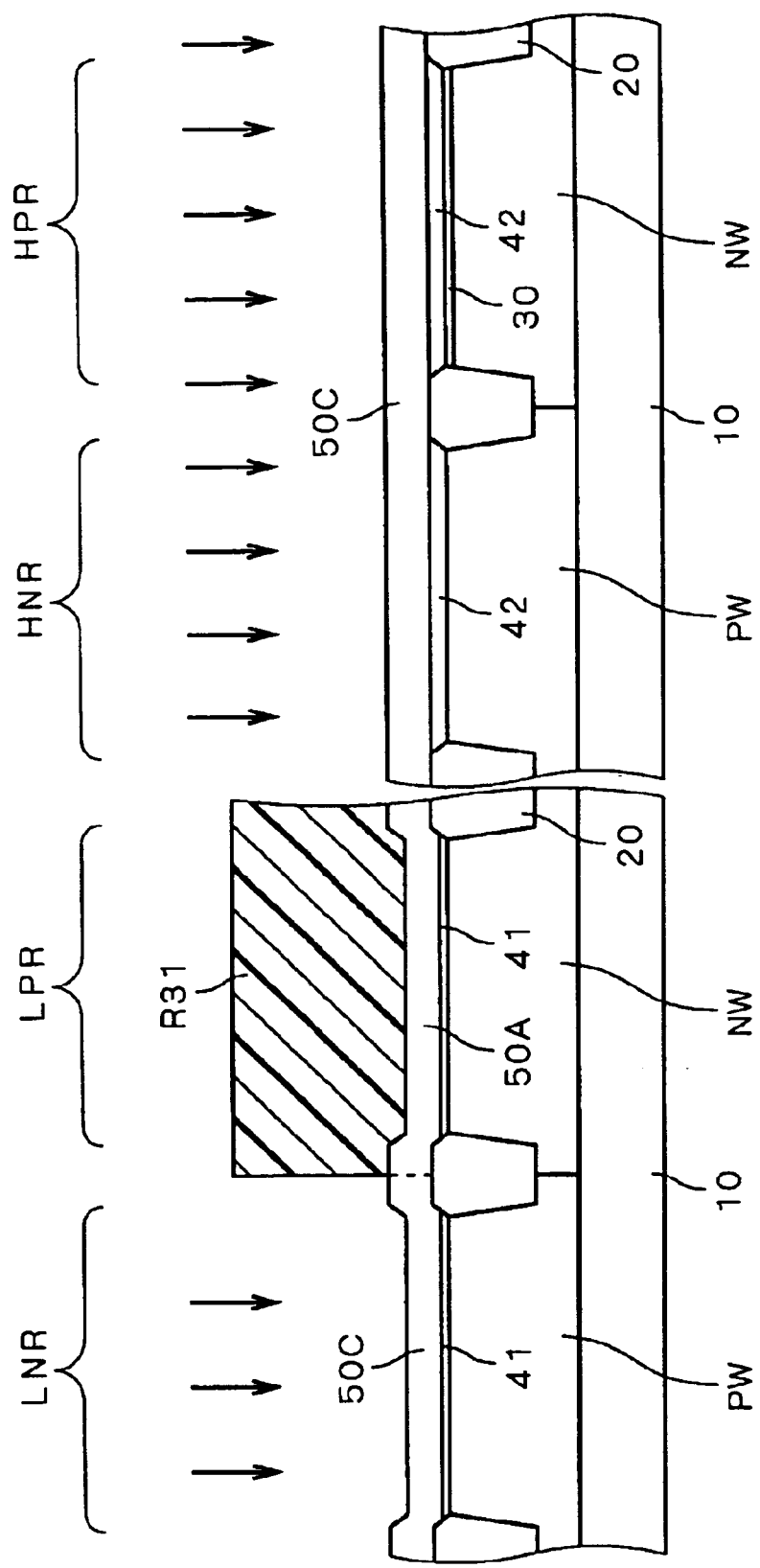
FIGS. 14 to 21 are sectional views showing a semiconductor device manufacturing method according to a third preferred embodiment of the present invention.

First, as shown in FIG. 14, through the process steps described referring to FIGS. 1 and 2, a gate insulating film 41 is formed all over the low-voltage NMOS region LNR and the low-voltage PMOS region LPR on the silicon substrate 10 and a gate insulating film 42 is formed all over the high-voltage NMOS region HNR and the high-voltage PMOS region HPR, and a low-concentration impurity layer 30 is formed in the surface of the silicon substrate 10 in the high-voltage PMOS region HPR.

Then a non-single-crystal silicon film 50A is formed by CVD on the gate insulating films 41 and 42. This non-single-crystal silicon film 50A does not contain impurity.

Next, in the process shown in FIG. 14, a resist mask R31 is patterned by photolithography to cover only the low-voltage PMOS region LPR, and an N-type impurity, e.g. P, is ion-implanted into the low-voltage NMOS region LNR, the high-voltage NMOS region HNR, and the high-voltage PMOS region HPR, so as to form an N-type non-single-crystal silicon film 50C. This ion implantation is performed with an implant energy of 5 keV to 30 keV and a dose of $4 \times 10^{15}$ to $1 \times 10^{16}/cm^2$.

Figure 15:
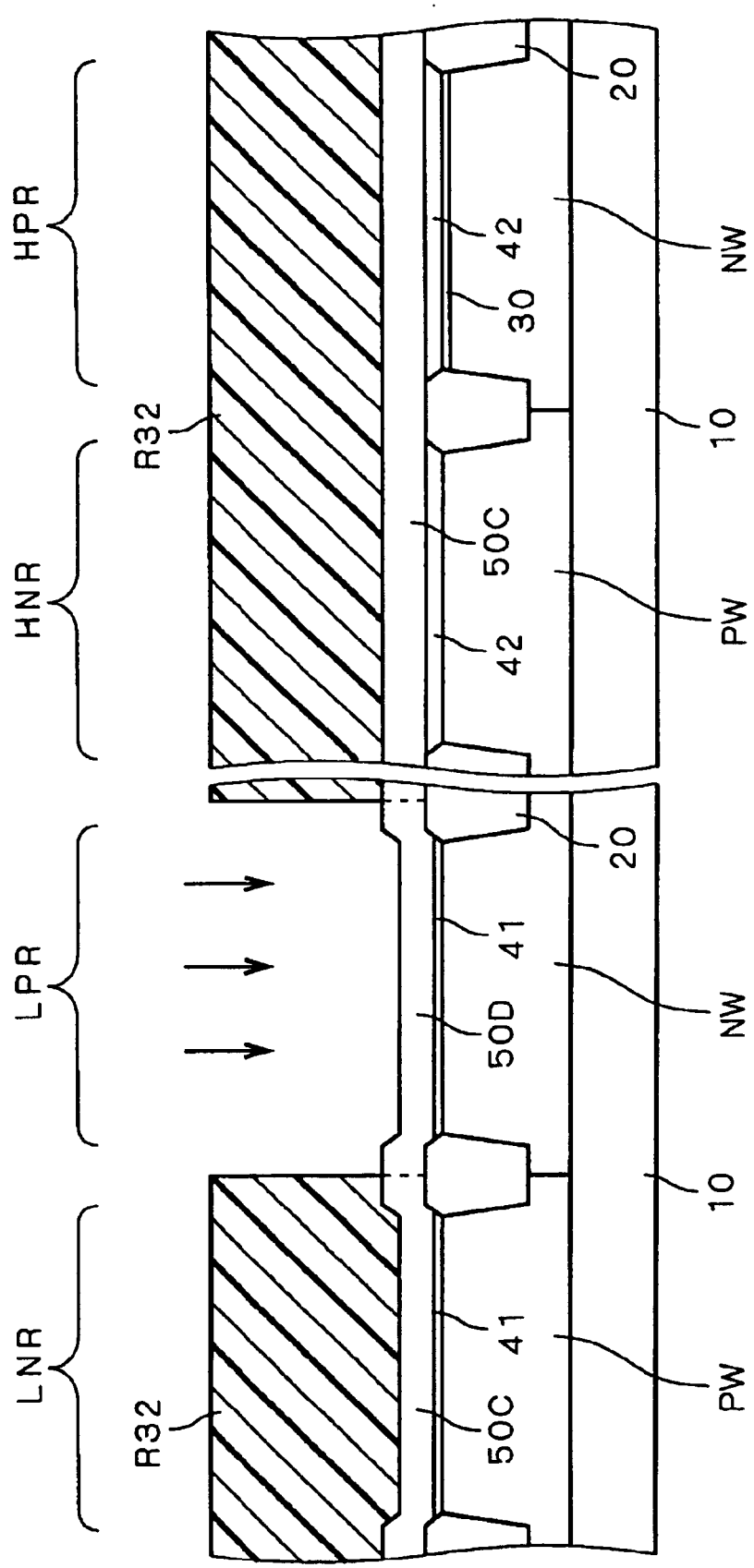

After removal of the resist mask R31, in the process shown in FIG. 15, a resist mask R32 is patterned by photolithography to cover the part except the low-voltage PMOS region LPR, and a P-type impurity, e.g. B or $BF_2$, is ion-implanted into the non-single-crystal silicon film 50A on the low-voltage PMOS region LPR to form a P-type non-single-crystal silicon film 50D.

In this ion implantation, B is implanted with an implant energy of 1 keV to 10 keV and a dose of $1 \times 10^{15}$ to $1 \times 10^{16}/cm^2$, or $BF_2$ is implanted with an implant energy of 5 keV to 50 keV and a dose of $1 \times 10^{15}$ to $1 \times 10^{16}/cm^2$.

Figure 16:
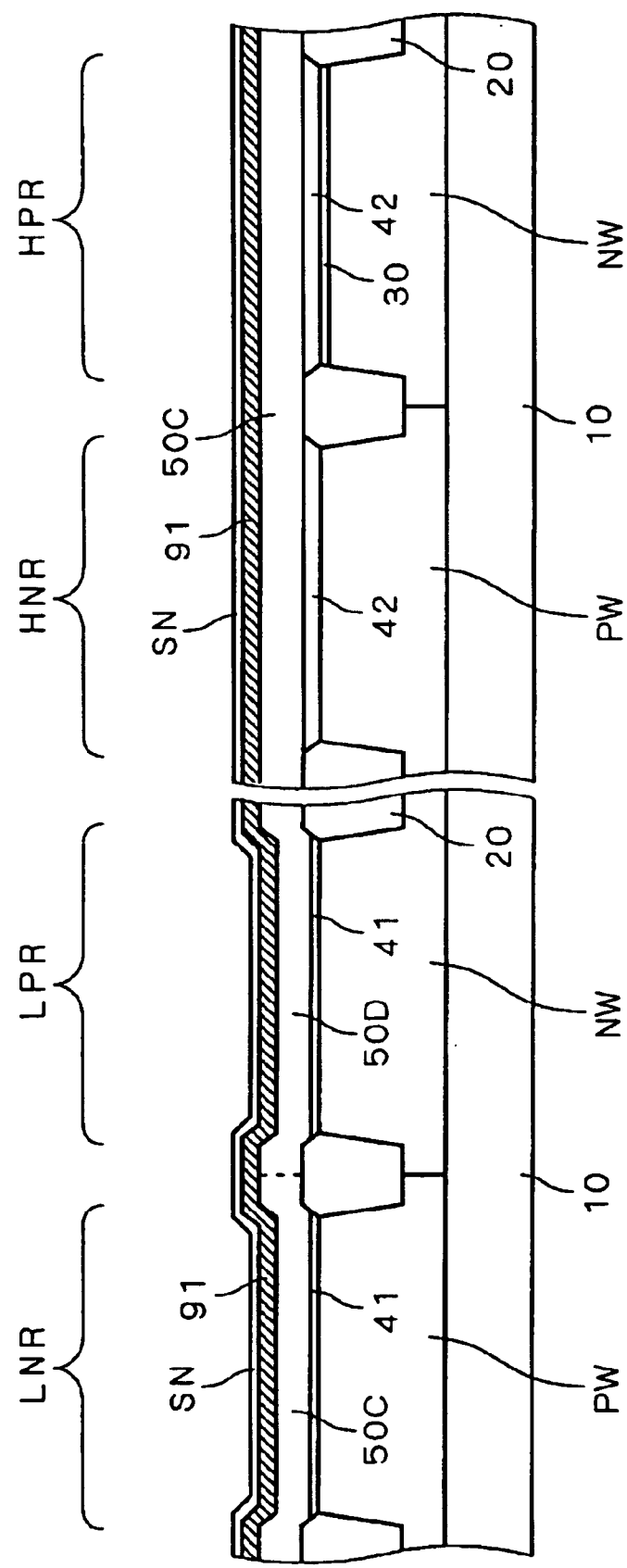

After removal of the resist mask R32, in the process shown in FIG. 16, a film of refractory metal, e.g. cobalt (Co), is formed by sputtering to cover the entire surface of the non-single-crystal silicon film 50C and the non-single-crystal silicon film 50D and a high-temperature treatment at 350 to 600° C. is applied to form a silicide film. The refractory metal film remaining unsilicidized is then removed and a further thermal treatment is applied to form a cobalt silicide film ($CoSi_2$) 91.

Then a silicon nitride film SN is formed on the entire surface of the cobalt silicide film 91. The silicon nitride film SN functions as a film protecting the cobalt silicide film 91.

Figure 17:
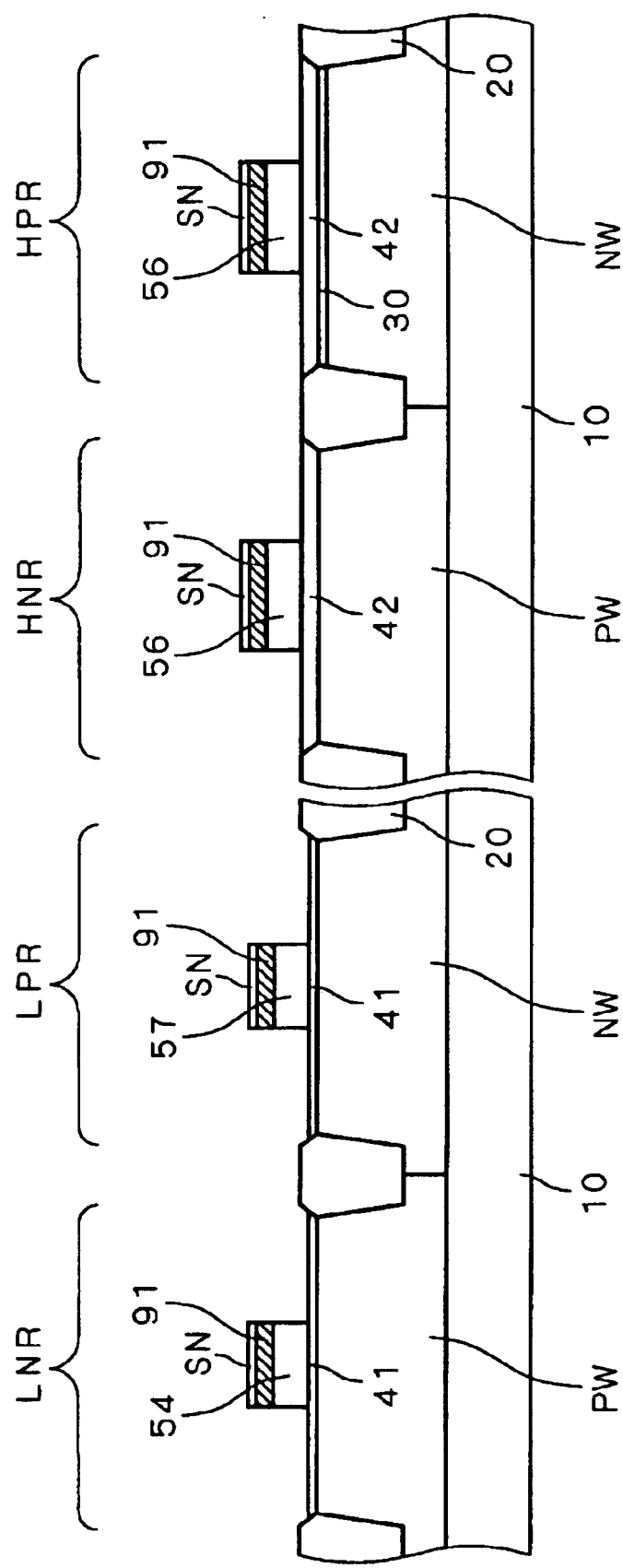

Next, in the process shown in FIG. 17, the cobalt silicide film 91 and the silicon nitride film SN are patterned by photolithography together with the non-single-crystal silicon film 50C and the non-single-crystal silicon film 50D, thus forming a gate electrode 54 in the low-voltage NMOS region LNR, a gate electrode 57 in the low-voltage PMOS region LPR, and gate electrodes 56 in the high-voltage NMOS region HNR and the high-voltage PMOS region HPR. The cobalt silicide film 91 and the silicon nitride film SN are left on top of all gate electrodes.

Subsequently, through the process steps described referring to FIGS. 4 to 6, extension layers 61 to 64 are formed and side wall protecting films (side wall insulating films) 70 are formed to protect the side walls of the gate electrodes 54, 57 and 56. The side wall protecting films 70 are formed also on the sides of the cobalt silicide film 91 and the silicon nitride film SN.

Figure 18:
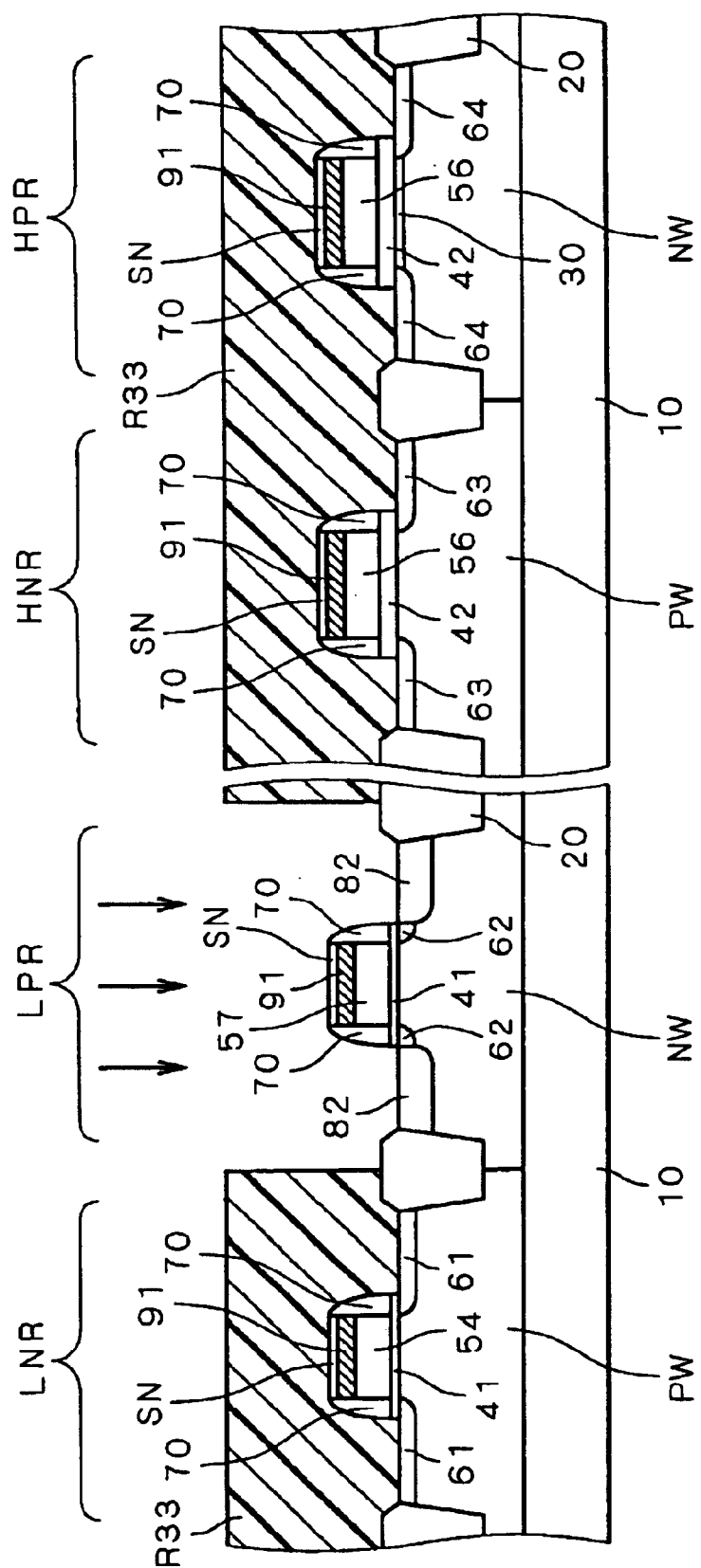

Next, in the process shown in FIG. 18, a resist mask R33 is patterned by photolithography to cover the part except the low-voltage PMOS region LPR, and a P-type impurity, e.g. B or $BF_2$, is ion-implanted to a relatively high concentration in the low-voltage PMOS region LPR by using the gate electrode 57, the stacked layers of the cobalt silicide film 91 and the silicon nitride film SN, and the side wall protecting films 70 as an implant mask, so as to form a pair of source/drain layers 82 in the surface of the silicon substrate 10.

In this ion implantation, B is implanted with an implant energy of 1 keV to 10 keV and a dose of $1 \times 10^{15}$ to $1 \times 10^{16}/cm^2$, or $BF_2$ is implanted with an implant energy of 5 keV to 50 keV and a dose of $1 \times 10^{15}$ to $1 \times 10^{16}/cm^2$.

Source/drain layers are similarly formed also in other regions. After the formation of source/drain layers, damages caused by the ion implantation can be repaired by applying a thermal process.

FIG. 19 shows the structure in which source/drain layers are formed in the individual regions, where pairs of source/drain layers 81 and 83 are formed in the surface of the silicon substrate 10 respectively in the low-voltage NMOS region LNR and the high-voltage NMOS region HNR, by introducing an N-type impurity, e.g. As, to a relatively high concentration (with an implant energy of 10 keV to 80 keV and a dose of $1 \times 10^{15}$ to $6 \times 10^{15}/cm^2$), and a pair of source/drain layers 84 are formed in the surface of the silicon substrate 10 in the high-voltage PMOS region HPR by introducing a P-type impurity, e.g. B or $BF_2$, to a relatively low concentration.

In this ion implantation, B is implanted with an implant energy of 1 keV to 10 keV and a dose of $1 \times 10^{15}$ to $1 \times 10^{16}/cm^2$, or $BF_2$ is implanted with an implant energy of 5 keV to 50 keV and a dose of $1 \times 10^{15}$ to $1 \times 10^{16}/cm^2$.

Next, in the process shown in FIG. 20, a film of refractory metal, e.g. cobalt (Co), is formed by sputtering to cover the entire surface of the silicon substrate 10 and a high-temperature treatment at 350 to 600° C. is then applied to form silicide film in the parts where the refractory metal film is in contact with the exposed surface of the silicon substrate 10. The silicon nitride films SN formed on top of the cobalt silicide films 91 prevent further formation of silicide film.

Next, the refractory metal film remaining unsilicidized is removed and a further thermal process is performed to form cobalt silicide films ($CoSi_2$) 90.

Finally, the silicon nitride films SN located on top of the individual gates are removed by etching, thus obtaining the CMOS transistor 300A for low voltage and the CMOS transistor 300B for high voltage as shown in FIG. 21. The silicon nitride films SN on the individual gate electrodes may be left unremoved, in which case the structure shown in FIG. 20 is obtained as the CMOS transistors 300A and 300B.

C-2. Device Structure

In FIG. 21, a buried-channel type PMOS transistor is provided only in the CMOS transistor 300B designed for high voltage; surface-channel type NMOS transistors are formed in the low-voltage NMOS region LNR and the high-voltage NMOS region HNR and a surface-channel type PMOS transistor is formed in the low-voltage PMOS region LPR.

C-3. Functions and Effects

The buried-channel type structure alleviates electric field applied to the channel and enhances the carrier mobility. Hence, the PMOS transistor in the high-voltage CMOS transistor 300B, which is the buried-channel type, provides improved drain current as compared with the surface-channel type.

The transistors other than the high-voltage PMOS transistor are surface-channel type, so that they may suffer reduction of reliability under hot-carrier stress or reduction of reliability under bias-temperature stress (NBTI); however, the reliability reduction is not very likely to occur since the electric field is weak in the low-voltage CMOS transistors.

Furthermore, the fact that only the high-voltage PMOS transistor is the buried-channel type facilitates size reduction of the semiconductor device.

Moreover, as described referring to FIGS. 14 and 15, the introduction of impurities into the gate electrodes of transistors other than the low-voltage PMOS transistor is performed before formation of the gate electrodes; it can thus be performed separately from the introduction of impurities for formation of the source/drain layers, making it easier to control the doses of the impurities introduced.

D. Fourth Preferred Embodiment

D-1. Manufacturing Method

Referring to FIGS. 22 to 26, a method for manufacturing a semiconductor device having a CMOS transistor 200A and a CMOS transistor 200B is described as a semiconductor device manufacturing method according to a fourth preferred embodiment of the present invention. The structure of the CMOS transistor 200A designed for low voltage and that of the CMOS transistor 200B designed for high voltage are the same as those shown in FIG. 13. The same components as those shown in the method for manufacturing the CMOS transistor 100A for low voltage and the CMOS transistor 100B for high voltage described referring to FIGS. 1 to 9 are shown at the same reference characters and are not described here again.

Figure 22:
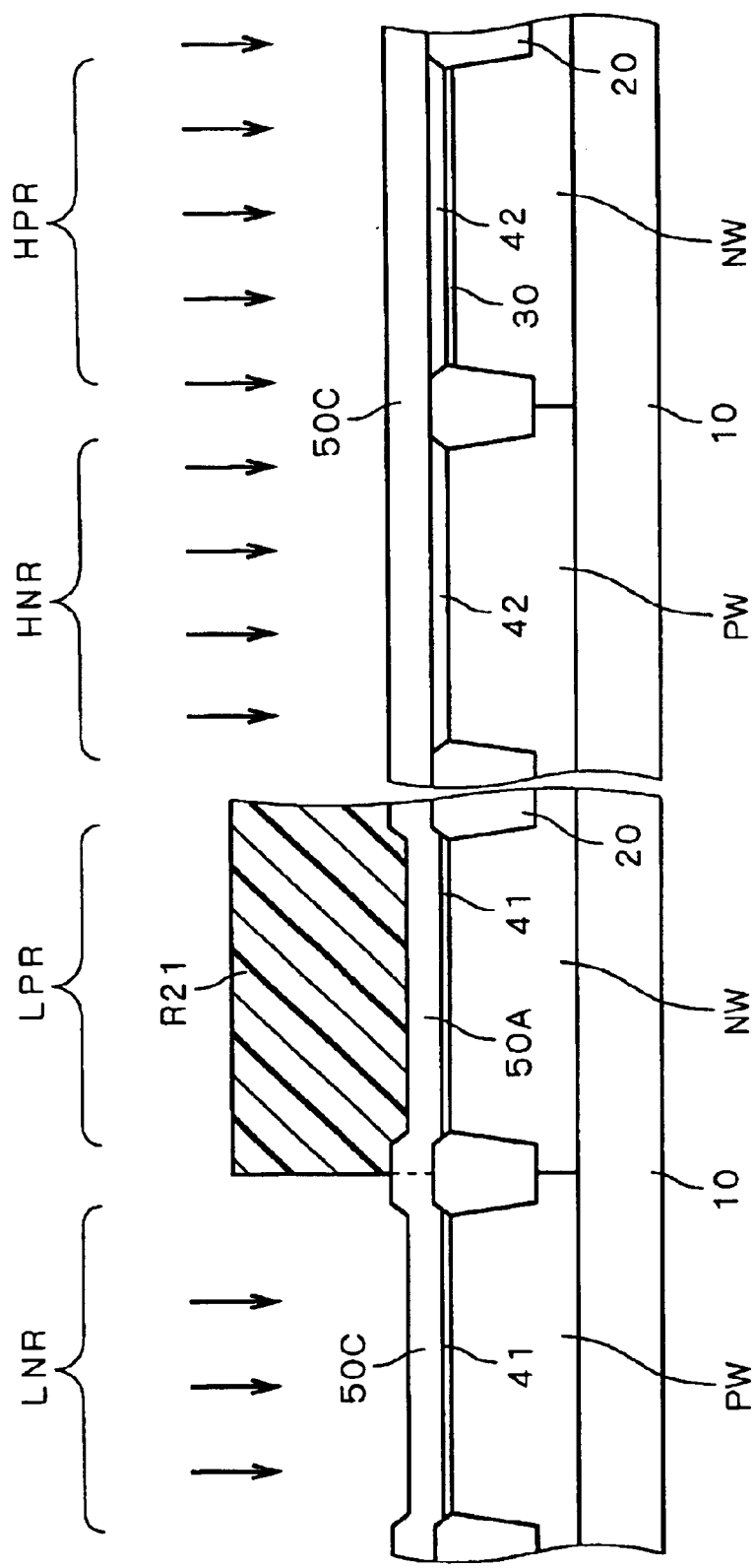

First, as shown in FIG. 22, through the process steps described referring to FIGS. 1 and 2, a gate insulating film 41 is formed all over the low-voltage NMOS region LNR and the low-voltage PMOS region LPR on the silicon substrate 10 and a gate insulating film 42 is formed all over the high-voltage NMOS region HNR and the high-voltage PMOS region HPR, and a low-concentration impurity layer 30 is formed in the surface of the silicon substrate 10 in the high-voltage PMOS region HPR.

Then a non-single-crystal silicon film 50A is formed by CVD on the gate insulating films 41 and 42. This non-single-crystal silicon film 50A does not contain impurity.

Next, in the process shown in FIG. 22, a resist mask R21 is patterned by photolithography to cover only the low-voltage PMOS region LPR, and an N-type impurity, e.g. P, is ion-implanted into the low-voltage NMOS region LNR, the high-voltage NMOS region HNR, and the high-voltage PMOS region HPR, so as to form an N-type non-single-crystal silicon film 50C. This ion implantation is performed with an implant energy of 5 keV to 30 keV and a dose of $4 \times 10^{15}$ to $1 \times 10^{16}/cm^2$.

Figure 23:
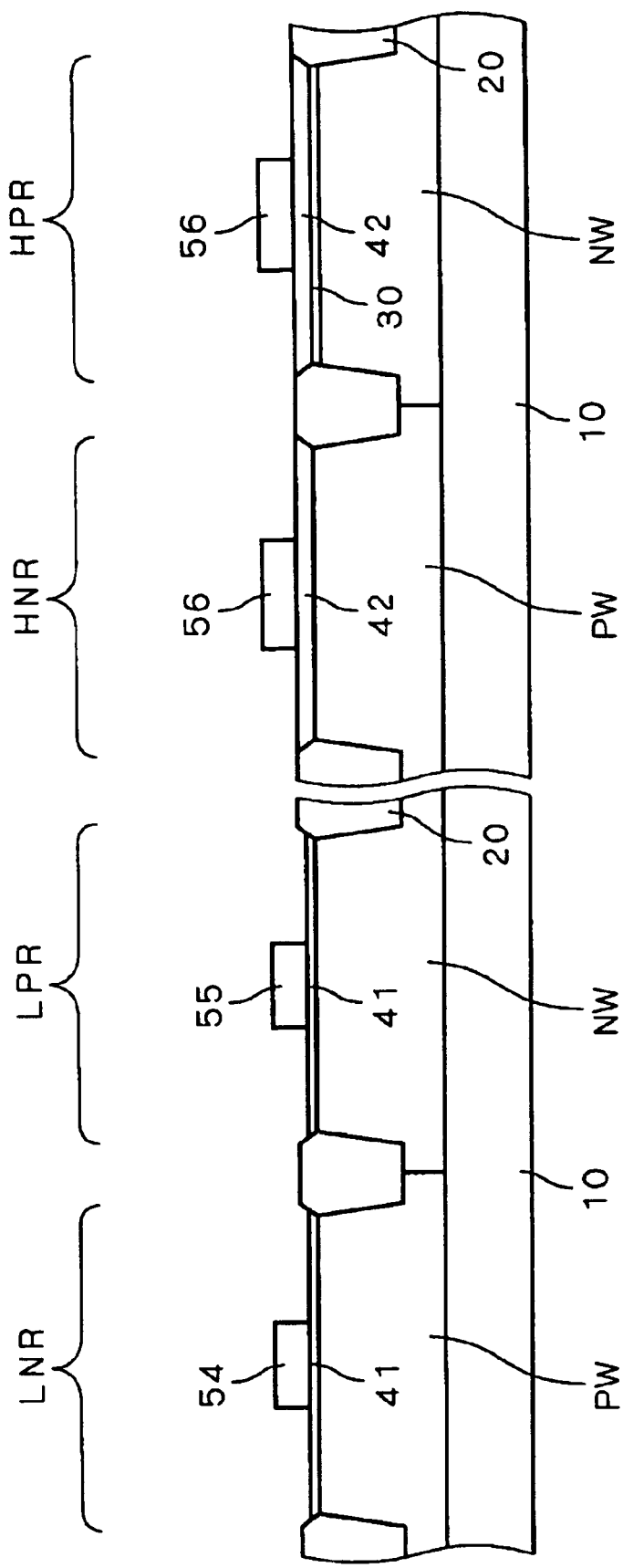

After removal of the resist mask R21, as shown in FIG. 23, the non-single-crystal silicon film 50A and the non-single-crystal silicon film 50C are patterned by photolithography, thus forming a gate electrode 54 in the low-voltage NMOS region LNR, a gate electrode 55 in the low-voltage PMOS region LPR, and gate electrodes 56 in the high-voltage NMOS region HNR and the high-voltage PMOS region HPR.

Figure 24:
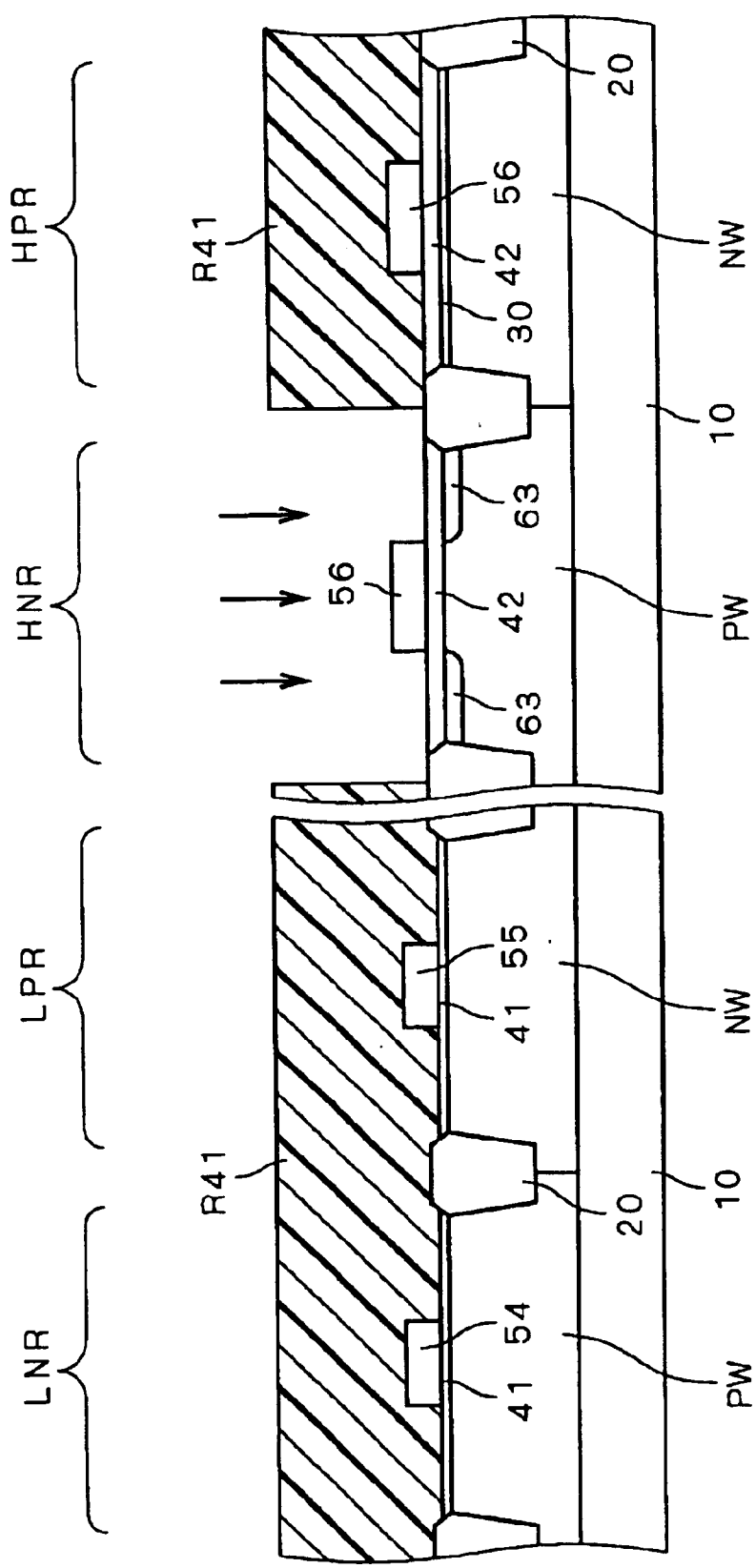

Next, in the process shown in FIG. 24, a resist mask R41 is patterned by photolithography to cover the part except the high-voltage NMOS region HNR, and an N-type impurity, e.g. As or P (both may be used together), is introduced to a relatively low concentration (N⁻) by ion implantation into the surface of the silicon substrate 10 in the high-voltage NMOS region HNR by using the gate electrode 56 as an implant mask, so as to form a pair of extension layers 63. In this ion implantation, As is implanted with an implant energy of 10 keV to 200 keV and a dose of $5 \times 10^{11}$ to $5 \times 10^{14}/cm^2$, or P is implanted with an implant energy of 10 keV to 50 keV and a dose of $5 \times 10^{11}$ to $5 \times 10^{14}/cm^2$.

Next, in the process shown in FIG. 25, a resist mask R42 is patterned by photolithography to cover the part except the low-voltage NMOS region LNR, and an N-type impurity, e.g. As, is introduced to a relatively low concentration (N⁻) by ion implantation into the surface of the silicon substrate 10 in the low-voltage NMOS region LNR by using the gate electrode 54 as an implant mask, so as to form a pair of extension layers 61. This ion implantation is performed with an implant energy of 0.2 keV to 10 keV and a dose of $1 \times 10^{14}$ to $2 \times 10^{15}/cm^2$.

Figure 26:
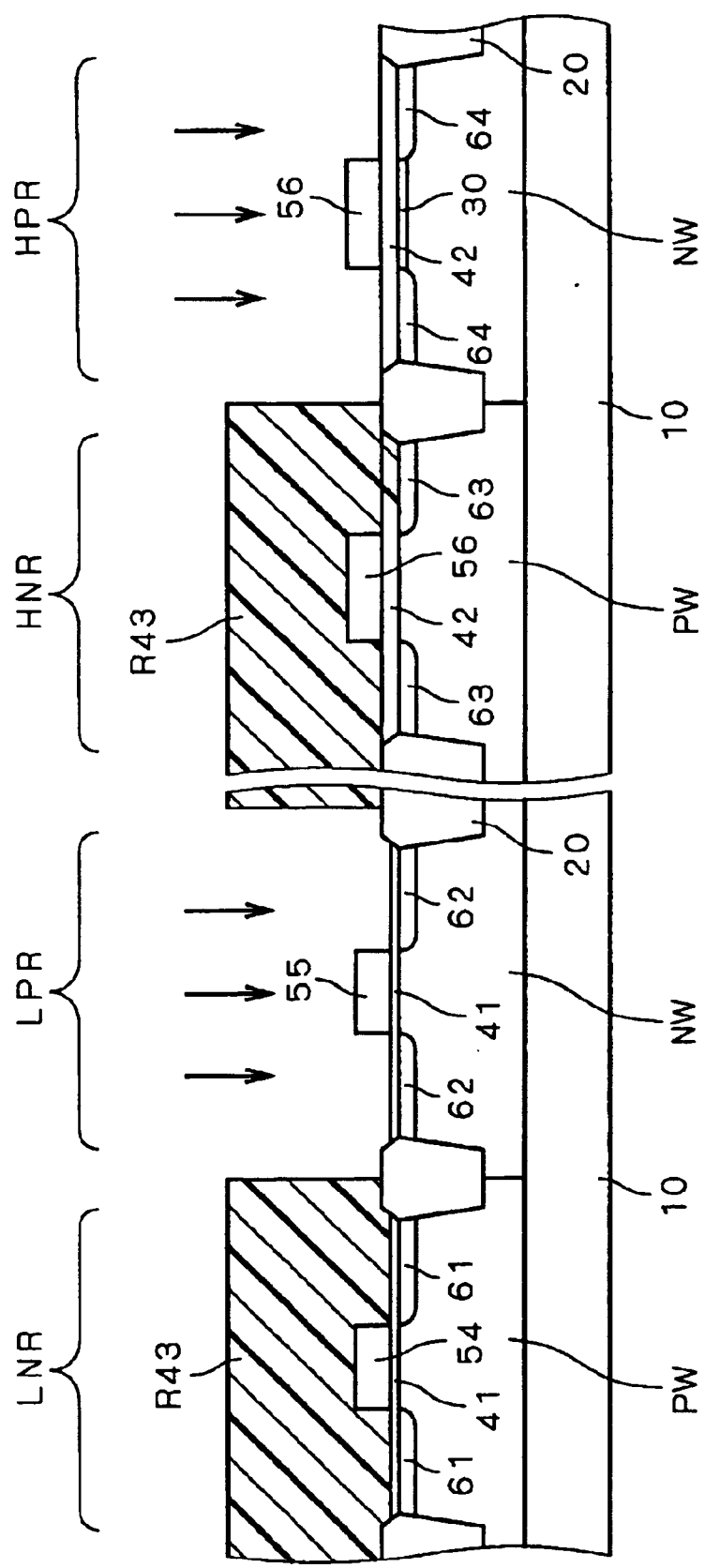

Next, in the process shown in FIG. 26, a resist mask R43 is patterned by photolithography to cover the part except the low-voltage PMOS region LPR and the high-voltage PMOS region HPR, and a P-type impurity, e.g. B or $BF_2$, is introduced to a relatively low concentration (P⁻) by ion implantation into the surface of the silicon substrate 10 in the low-voltage PMOS region LPR and the high-voltage PMOS region HPR by using the gate electrodes 55 and 56 as implant masks, so as to respectively form pairs of extension layers 62 and 64. In this ion implantation, B is implanted with an implant energy of 1 keV to 10 keV and a dose of $1 \times 10^{15}$ to $1 \times 10^{16}/cm^2$, or $BF_2$ is implanted with an implant energy of 5 keV to 50 keV and a dose of $1 \times 10^{15}$ to $1 \times 10^{16}/cm^2$.

Subsequently, through the process steps described referring to FIGS. 12 and 13, the CMOS transistor 200A for low voltage and the CMOS transistor 200B for high voltage are obtained as shown in FIG. 13.

D-2. Functions and Effects

According to the manufacturing method of this preferred embodiment, as shown in FIG. 26, the extension layers 62 and 64 are simultaneously formed in the surface of the silicon substrate 10 in the low-voltage PMOS region LPR and the high-voltage PMOS region HPR by using the gate electrodes 55 and 56 as implant masks. This reduces the process steps for forming the extension layers.

That is to say, since a buried-channel type PMOS transistor is formed in the high-voltage PMOS region HPR, the channel is formed not right under the gate insulating film but under the low-concentration impurity layer 30. The channel is thus separated apart from the gate insulating film and the effective electric field is therefore smaller than that in the surface-channel type structure.

As a result, the possibility that the carriers are injected into the gate insulating film is considerably lowered and the reliability is therefore not reduced even when the drain electric field is strong. Accordingly, the hot-carrier resistance and the NBTI resistance are not reduced even when the extension layers are formed under the same conditions as the PMOS transistor designed for low voltage, making it possible to adopt the process in which the extension layers 62 and 64 are formed at the same time.

In the conventional manufacturing method described referring to FIGS. 39 to 47, all MOS transistors are surface-channel type. It is therefore necessary to form extension layers for each of the MOS transistors. Formation of the four types of MOS transistors thus required four process steps to form the extension layers. However, the manufacturing method of this preferred embodiment requires only three process steps, which means the process has been reduced to ¾.

The manufacturing method of this preferred embodiment has shown an application to the method for manufacturing a semiconductor device having the CMOS transistor 200A and the CMOS transistor 200B. However, needless to say, this method can be applied also to a method for manufacturing a semiconductor device having the CMOS transistor 100A and the CMOS transistor 100B, and to a method for manufacturing a semiconductor device having the CMOS transistor 300A and the CMOS transistor 300B.

E. Fifth Preferred Embodiment

E-1. Manufacturing Method

Figure 27:
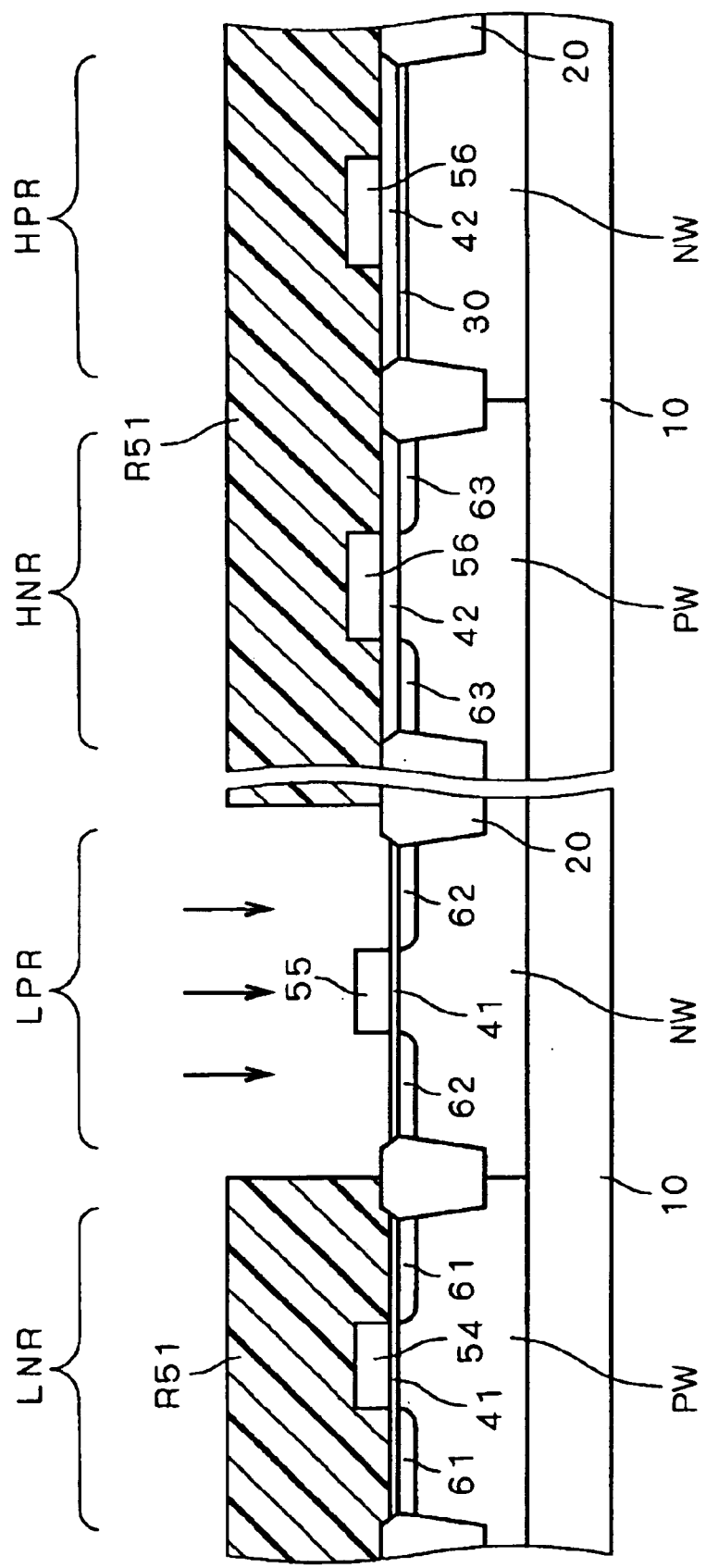
FIGS. 27 to 29 are sectional views showing a semiconductor device manufacturing method according to a fifth preferred embodiment of the present invention.
Figure 28:
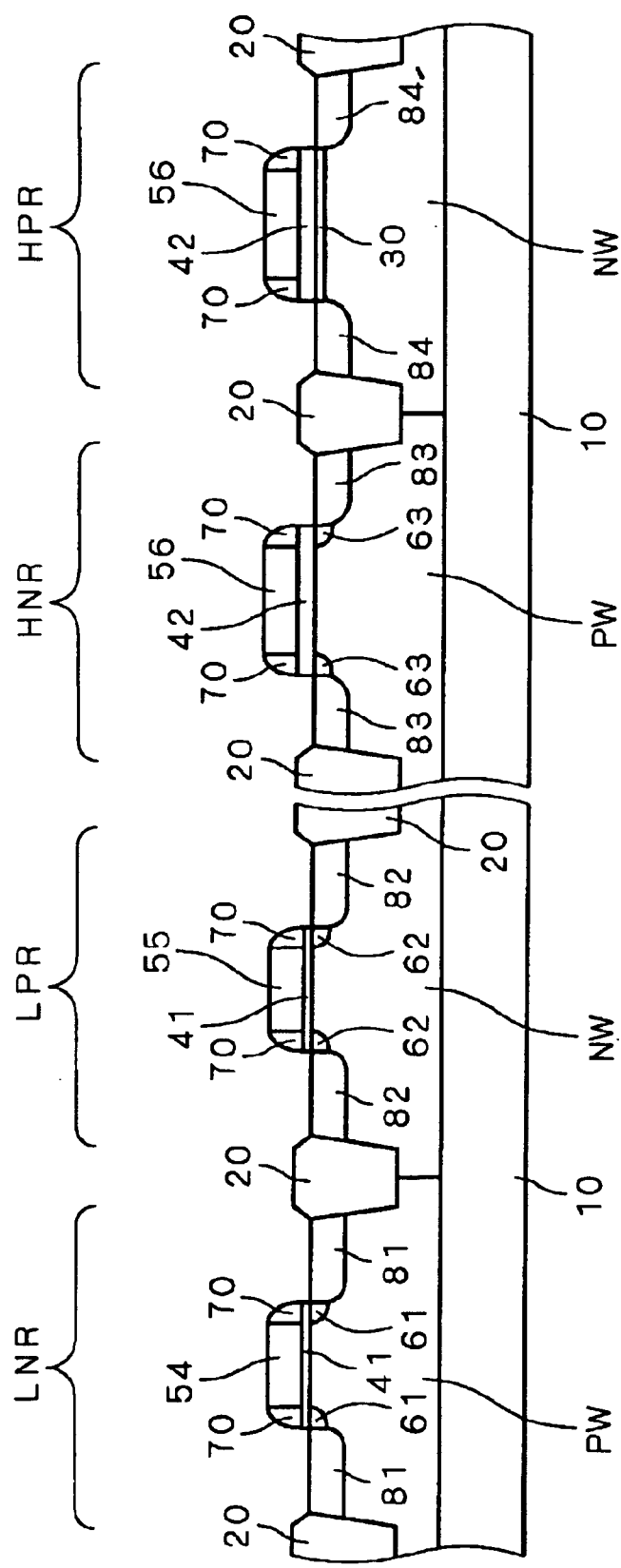
Figure 29:
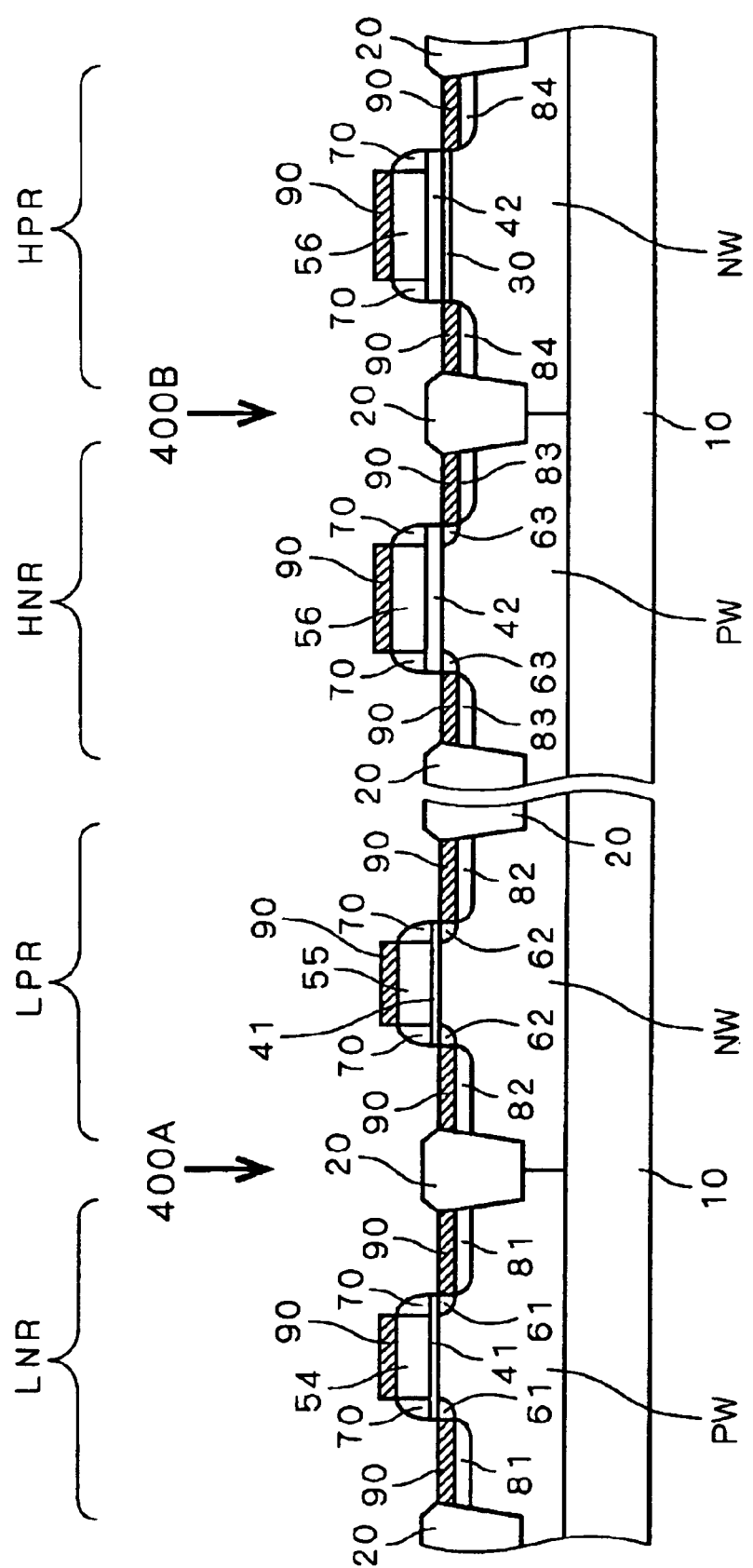
Figure 33:
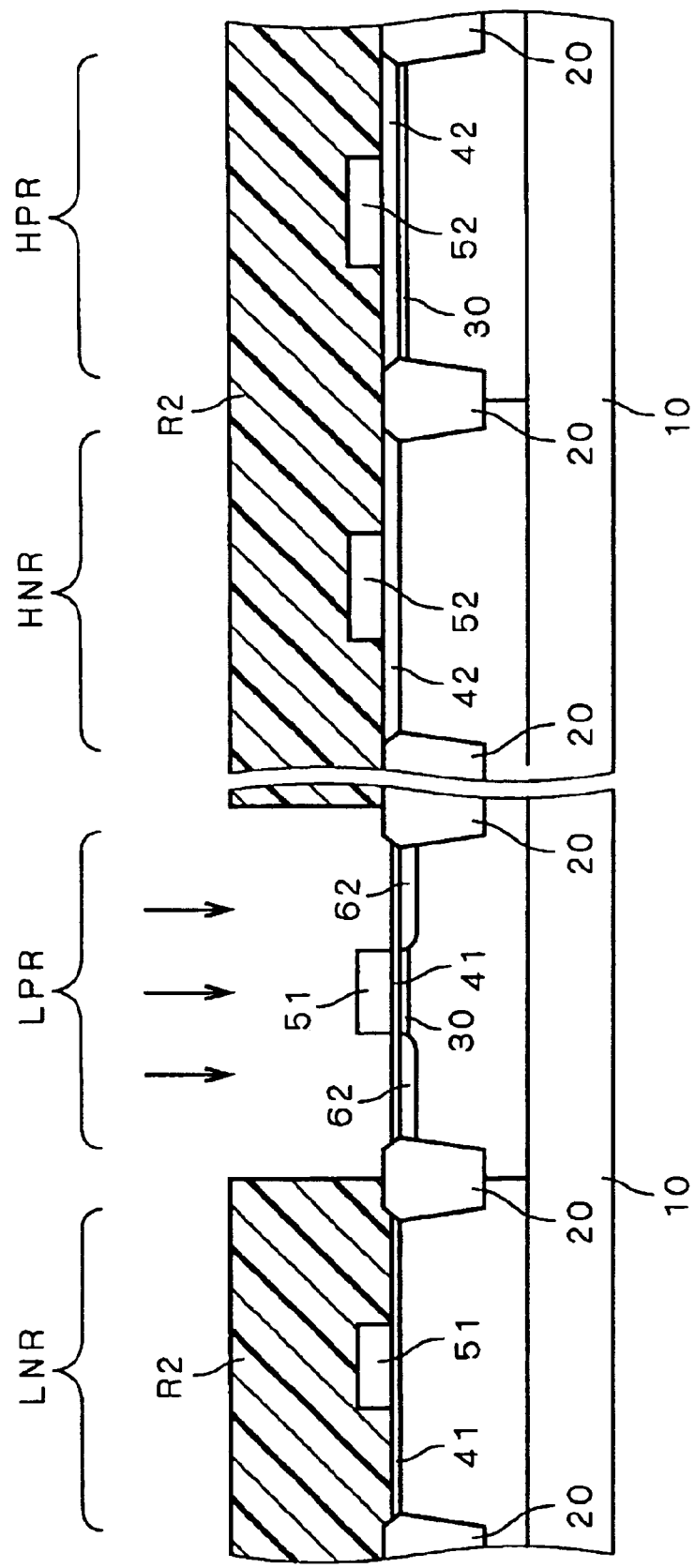
Figure 38:
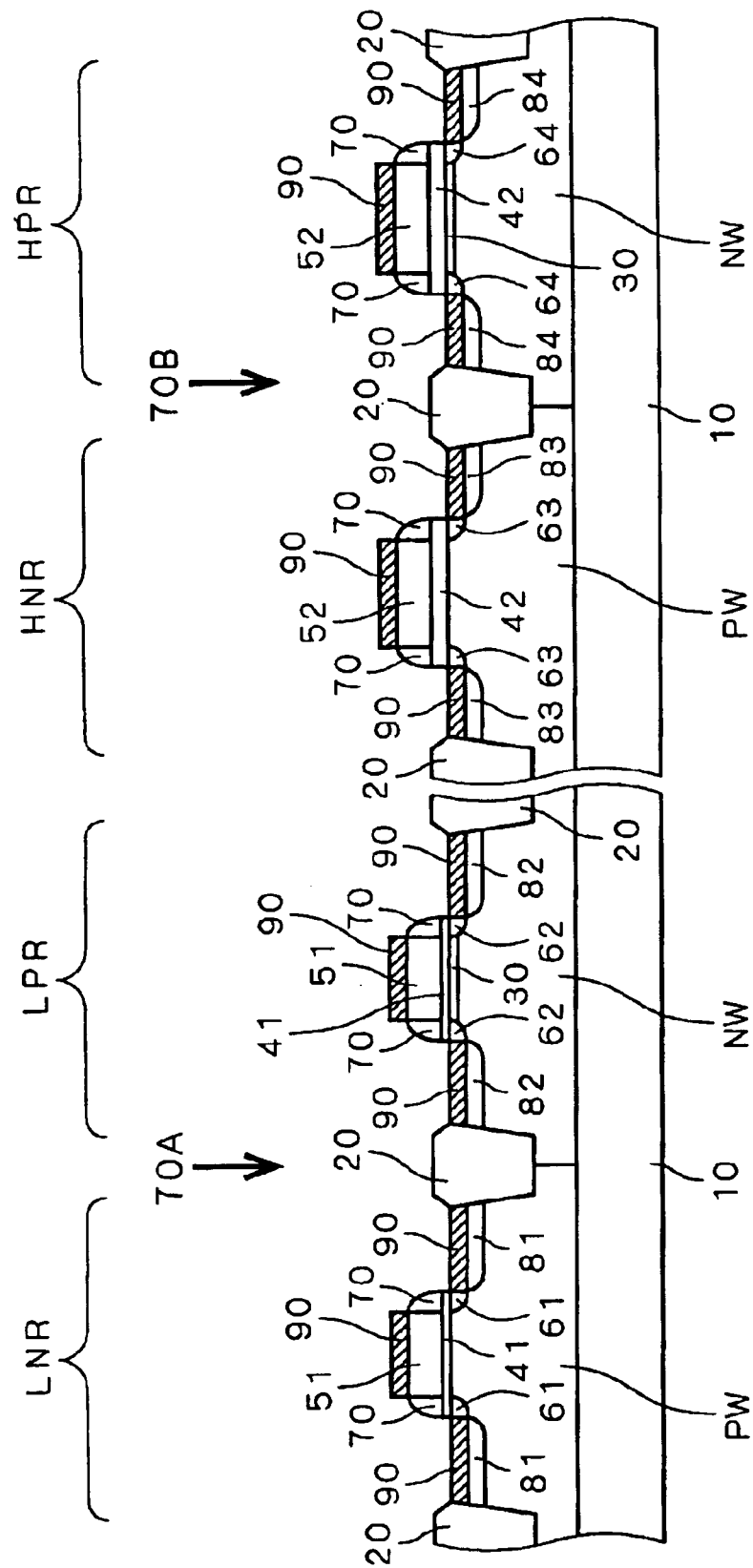
Figure 45:
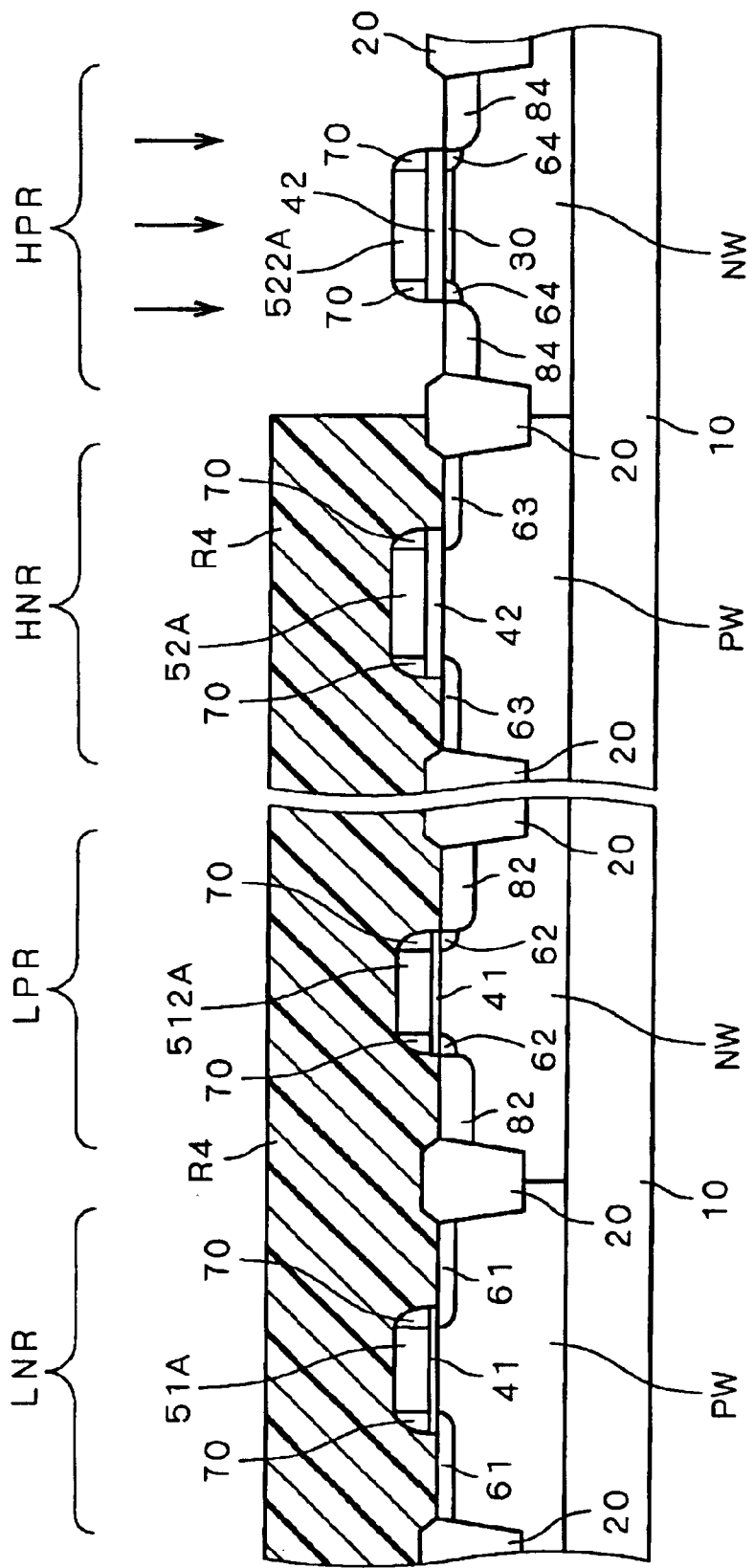
Figure 47:
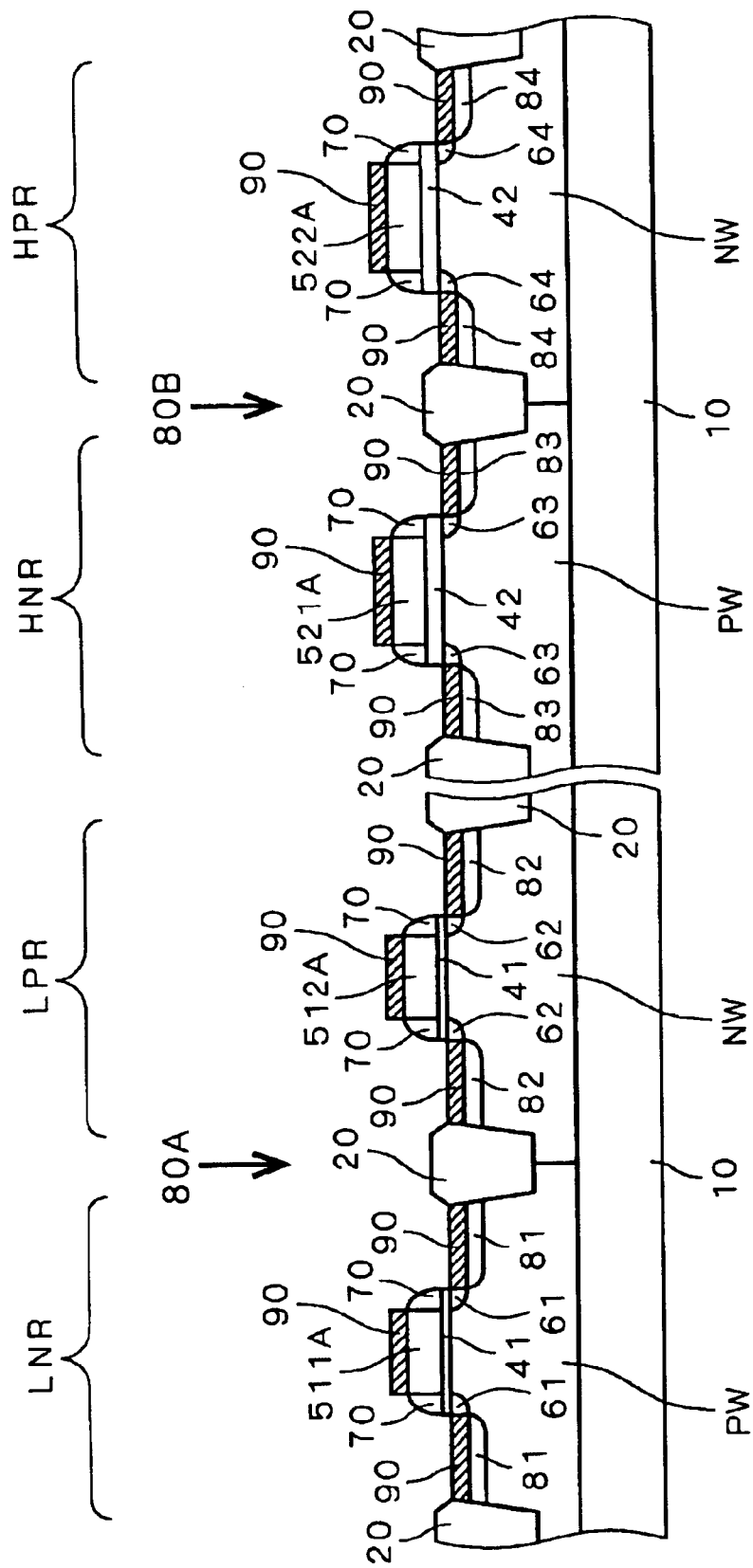

Referring to FIGS. 27 to 29, a method for manufacturing a semiconductor device having a CMOS transistor 400A and a CMOS transistor 400B is described as a semiconductor device manufacturing method according to a fifth preferred embodiment of the present invention. The structure of the CMOS transistor 400A designed for low voltage and that of the CMOS transistor 400B designed for high voltage are shown in FIG. 30 which illustrates the final process step.

In the manufacturing method of this preferred embodiment, the same components as those shown in the manufacturing method of the third preferred embodiment described referring to FIGS. 22 to 26 are shown at the same reference characters and not described here again.

That is to say, extension layers 61 and 63 are formed in the surface of the silicon substrate 10 respectively in the low-voltage NMOS region LNR and the high-voltage NMOS region HNR through the process steps described referring to FIGS. 22 to 25. Subsequently, in the process step shown in FIG. 27, a resist mask R51 is patterned by photolithography to cover the part except the low-voltage PMOS region LPR, and a P-type impurity, e.g. B or $BF_2$, is implanted by ion implantation to a relatively low concentration (P⁻) into the surface of the silicon substrate 10 in the low-voltage PMOS region LPR by using the gate electrode 55 as an implant mask, so as to form a pair of extension layers 62. For conditions of this implantation, B is implanted with an implant energy of 1 keV to 10 keV and a dose of $1 \times 10^{15}$ to $1 \times 10^{16}/cm^2$, or $BF_2$ is implanted with an implant energy of 5 keV to 50 keV and a dose of $1 \times 10^{15}$ to $1 \times 10^{16}/cm^2$.

Subsequently, as shown in FIG. 28, pairs of source/drain layers 81, 82, 83 and 84 are formed through the process shown in FIG. 12 in the surface of the silicon substrate 10 respectively in the low-voltage NMOS region LNR, the low-voltage PMOS region LPR, the high-voltage NMOS region HNR and the high-voltage PMOS region HPR.

As shown in FIG. 28, while pairs of extension layers 61, 62 and 63 are formed respectively in the low-voltage NMOS region LNR, the low-voltage PMOS region LPR and the high-voltage NMOS region HNR, no extension layers are formed in the high-voltage PMOS region HPR.

Subsequently, through the process described referring to FIG. 13, the CMOS transistor 400A for low voltage and the CMOS transistor 400B for high voltage are obtained as shown in FIG. 29.

E-2. Device Structure

As shown in FIG. 29, the PMOS transistor formed in the CMOS transistor 400B for high voltage is buried-channel type, without extension layers.

E-3. Functions and Effects

According to the manufacturing method of this preferred embodiment, extension layers are not formed in the PMOS transistor to the high-voltage CMOS transistor 400B, which reduces the process for extension layer formation.

The extension layers can be removed in this way because the PMOS transistor in the CMOS transistor 400B is of the buried-channel type.

That is to say, in the buried-channel type PMOS transistor, as shown in FIG. 29, the $P^-$ low-concentration impurity layer 30 connects the pair of $P^+$ source/drain layers 84, and when a voltage is applied to the drain, a depletion layer extends to the low-concentration impurity layer 30. Therefore the channel is so easy to form that the transistor can normally perform ON operation even in the absence of extension layers.

In the conventional manufacturing method described referring to FIGS. 39 to 47, all MOS transistors are surface-channel type and it is therefore necessary to form extension layers for each MOS transistor. This method thus required four extension layer formation process steps to form the four types of MOS transistors. However, the manufacturing method of this preferred embodiment requires only three process steps, meaning that the process can be reduced to ¾.

While the invention has been described in detail, the foregoing description is in all aspects illustrative and not restrictive. It is understood that numerous other modifications and variations can be devised without departing from the scope of the invention.

What is claimed is:

1. A semiconductor device, comprising:
    a first NMOS transistor and a first PMOS transistor provided respectively in a first NMOS region and a first PMOS region defined in a surface of a semiconductor substrate; and
    a second NMOS transistor and a second PMOS transistor provided respectively in a second NMOS region and a second PMOS region defined in the surface of said semiconductor substrate;
    said second NMOS transistor and said second PMOS transistor having higher operating voltages respectively than said first NMOS transistor and said first PMOS transistor,
    said second PMOS transistor being a buried-channel type MOS transistor in which a channel is formed in the inside of said semiconductor substrate, and
    said first NMOS transistor, said first PMOS transistor, and said second NMOS transistor being surface-channel type MOS transistors in which a channel is formed in the surface of said semiconductor substrate.

2. The semiconductor device according to claim 1, wherein said second PMOS transistor comprises,
    a gate insulating film selectively provided on the surface of said semiconductor substrate in said second PMOS region,
    a gate electrode provided on said gate insulating film,
    a P-type impurity layer of a relatively low concentration provided in the surface of said semiconductor substrate right under said gate insulating film, and
    a pair of P-type source/drain layers provided in the surface of said semiconductor substrate outside of sides of said gate electrode and in contact with said impurity layer.

3. The semiconductor device according to claim 2, wherein said pair of P-type source/drain layers comprise a pair of P-type extension layers extending from opposing ends and facing each other.

4. The semiconductor device according to claim 2, wherein said gate electrode comprises an N-type impurity at a relatively high concentration.

* * * * *